(12) United States Patent  (10) Patent No.: US 9,231,734 B2
Jeong et al.  (45) Date of Patent: Jan. 5, 2016

(54) APPARATUS AND METHOD FOR TRANSMITTING AND RECEIVING DATA IN COMMUNICATION/BROADCASTING SYSTEM

(71) Applicant: Samsung Electronics Co., Ltd., Gyeonggi-do (KR)

(72) Inventors: Hong-Sil Jeong, Seoul (KR); Sung-Ryul Yun, Gyeonggi-do (KR); Alain Mourad, Middlesex (GB); Ismael Gutierrez, Middlesex (GB)

(73) Assignee: Samsung Electronics Co., Ltd. (KR)

( * ) Notice: Subject to any disclaimer, the term of this patent is extended or adjusted under 35 U.S.C. 154(b) by 50 days.

(21) Appl. No.: 14/351,066

(22) PCT Filed: Sep. 20, 2012

(86) PCT No.: PCT/KR2012/007538
§ 371 (c)(1),
(2) Date: Apr. 10, 2014

(87) PCT Pub. No.: WO2013/055046
PCT Pub. Date: Apr. 18, 2013

(65) Prior Publication Data
US 2014/0258815 A1    Sep. 11, 2014

(30) Foreign Application Priority Data

Oct. 10, 2011 (KR) .......................... 10-2011-0103275
Jan. 18, 2012 (KR) .......................... 10-2012-0005913

(51) Int. Cl.
*H04L 1/00* (2006.01)
*H03M 13/15* (2006.01)
(Continued)

(52) U.S. Cl.
CPC ......... *H04L 1/0069* (2013.01); *H03M 13/1165* (2013.01); *H03M 13/152* (2013.01);
(Continued)

(58) Field of Classification Search
CPC ............... H03M 13/6552; H03M 13/2906; H03M 13/152; H03M 13/618; H03M 13/6362; H03M 13/1165; H04L 1/0063; H04L 1/0069
See application file for complete search history.

(56) References Cited

U.S. PATENT DOCUMENTS 7,900,127 B2 * 3/2011 Shen ................. H03M 13/1151
714/758
8,069,393 B2 * 11/2011 Eroz ................. H03M 13/1137
714/758

(Continued)

FOREIGN PATENT DOCUMENTS

KR    1020080084058    9/2008
KR    1020110055410    5/2011

(Continued)

OTHER PUBLICATIONS

PCT/ISA/237 Written Opinion issued on PCT/KR2012/007538 (pp. 4).

(Continued)

*Primary Examiner* — Albert Decady
*Assistant Examiner* — Kyle Vallecillo
(74) *Attorney, Agent, or Firm* — The Farrell Law Firm, P.C.

(57) ABSTRACT

An apparatus and a method for performing shortening and puncturing in case of performing encoding and decoding using a parity test matrix in a communication/broadcasting system are provided. The method includes determining a number of zero-padding bits, determining a number $N_{pad}$ of bit groups in which all bits are padded with zeros, padding the all bits within $0^{th}$ to $(N_{pad}-1)^{th}$ bit groups with zeros based on a shortening pattern, encoding information bits including the zero-padded bits to generate a codeword. Here, the shortening pattern is defined in a sequence of bit groups defined as 9, 8, 15, 10, 0, 12, 5, 27, 6, 7, 19, 22, 1, 16, 26, 20, 21, 18, 11, 3, 17, 24, 2, 23, 25, 14, 28, 4, 13, 29.

42 Claims, 22 Drawing Sheets

(51) Int. Cl.
*H03M 13/11* (2006.01)
*H03M 13/00* (2006.01)
*H03M 13/29* (2006.01)

(52) U.S. Cl.
CPC ........ *H03M13/2906* (2013.01); *H03M 13/618* (2013.01); *H03M 13/6362* (2013.01); *H03M 13/6552* (2013.01); *H04L 1/0063* (2013.01)

(56) References Cited

U.S. PATENT DOCUMENTS

| | | | | |
|---|---|---|---|---|
| 8,479,076 | B2 * | 7/2013 | Trachewsky | H03M 13/1102 714/752 |
| 8,631,312 | B2 * | 1/2014 | Shen | H03M 13/1151 714/779 |
| 8,644,406 | B2 * | 2/2014 | Ko | H04L 27/04 375/260 |
| 2007/0094580 | A1 | 4/2007 | Livshitz | |
| 2007/0101229 | A1 * | 5/2007 | Niu | H03M 13/1102 714/752 |
| 2007/0113147 | A1 | 5/2007 | Hong et al. | |
| 2009/0044082 | A1 | 2/2009 | Landau et al. | |
| 2010/0061400 | A1 * | 3/2010 | Hong | H04L 1/0057 370/466 |
| 2010/0061698 | A1 * | 3/2010 | Morello | H04N 5/4401 386/207 |
| 2010/0153815 | A1 * | 6/2010 | Hedberg | H03M 13/1102 714/752 |
| 2010/0306627 | A1 * | 12/2010 | Sakai | H03M 13/116 714/781 |
| 2011/0138262 | A1 | 6/2011 | Myung et al. | |
| 2011/0299628 | A1 * | 12/2011 | Ko | H04L 1/0044 375/298 |
| 2014/0016720 | A1 * | 1/2014 | Ko | H04L 1/0041 375/295 |

FOREIGN PATENT DOCUMENTS

| | | |
|---|---|---|
| KR | 1020110087430 | 8/2011 |
| KR | 1020130001098 | 1/2013 |
| WO | WO 2009/102146 | 8/2009 |

OTHER PUBLICATIONS

PCT/ISA/210 Search Report issued on PCT/KR2012/007538 (pp. 3).
Digital Video Broadcasting (DVB); Next Generation Broadcasting System to Handheld, Physical Layer Specification (DVB_NGH), Draft ETSI EN 303 105 V1.1.1 (Sep. 2012), 294 pages.
Hongsil Jeong, "PF72 4k Codes for L1 Signalling", Sep. 21, 2011, 54 pages.
Digital Video Broadcasting (DVB); Frame Structure Channel Coding and Modulation for a Second Generation Digital Terrestrial Television Broadcasting System (DVB-T2).
ETSI EN 302 755 V1.2.1, Feb. 2011, 177 pages.
Takashi Yokokawa, "Comments on L1 Scrambling", DVB-NGH, Apr. 10, 2013, 3 pages.
European Search Report dated Jun. 16, 2015 issued in counterpart application No. 12839417.8-1906, 7 pages.
European Search Report dated Oct. 26, 2015 issued in counterpart application No. 12839417.8-1906, 17 pages.

* cited by examiner $$\begin{bmatrix} 1 & 1 & 1 & 1 & 1 & 1 & 0 & 0 \\ 1 & 1 & 0 & 1 & 0 & 1 & 1 & 0 \\ 1 & 1 & 1 & 0 & 0 & 0 & 1 & 1 \\ 1 & 0 & 1 & 1 & 1 & 0 & 0 & 1 \end{bmatrix} \cdot \begin{bmatrix} C_0 \\ C_1 \\ C_2 \\ C_3 \\ C_4 \\ C_5 \\ C_6 \\ C_7 \end{bmatrix} = \begin{bmatrix} 0 \\ 0 \\ 0 \\ 0 \end{bmatrix}$$

INFORMATION  PARITY
$\underline{C} = (C_0, C_1, C_2, C_3, C_4, C_5, C_6, C_7)$

APPARATUS AND METHOD FOR TRANSMITTING AND RECEIVING DATA IN COMMUNICATION/BROADCASTING SYSTEM

PRIORITY

This application is a National Stage application under 35 U.S.C. §371 of International Application No. PCT/KR2012/007538 filed Sep. 20, 2012, which claims priority under 35 U.S.C. §365(b) to Korean Patent Application Nos. 10-2011-0103275 and 10-2012-0005913 filed Oct. 10, 2011 and Jan. 18, 2012, respectively, the content of each of which is incorporated herein by reference.

BACKGROUND OF THE INVENTION

1. Field of the Invention

The present invention relates to a communication/broadcasting system.

2. Description of the Related Art

In a communication/broadcasting system, a link performance may be considerably deteriorated by various noises of a channel and a fading phenomenon and an Inter-Symbol Interference (ISI). Therefore, to realize high speed digital communication/broadcasting systems requiring a high amount of data processing and high reliability such as next generation mobile communication, digital broadcasting, and a mobile Internet, development of a technology for overcoming a noise and fading and ISI is required. Recently, as a part of a study for overcoming a noise, etc., a study on an error-correcting code is in active progress as a method for raising reliability of communication and broadcasting by efficiently recovering distortion of information.

A Low Density Parity Check (LDPC) code first introduced in 1960s by Gallager has been forgotten due to complexity difficult to realize at the technology level of that time. However, as a turbo code suggested by Berrou and Glavieux, Thitimajshima in 1993 showed performance approaching a channel capacity of Shannon, various analyses for the performance and characteristic of the turbo code have been made and various studies on iterative decoding and channel coding based on a graph have been carried out. With this as a momentum, the LDPC code has been re-studied in the late 1990s and it has been revealed that when decoding is performed with application of iterative decoding based on a sum-product algorithm on a Tanner graph corresponding to the LDPC code, performance approaching a channel capacity of Shannon is obtained.

The LDPC code is defined as a parity-check matrix generally, and may be expressed using a bipartite graph commonly called as a Tanner graph. An LDPC encoder receives an LDPC information word consisting of $K_{ldpc}$ bits to generate an LDPC codeword consisting of $N_{ldpc}$ bits. Hereinafter, for convenience in description, it is assumed that an information word including $K_{ldpc}$ bits is received, so that a codeword consisting of $N_{ldpc}$ bits is generated. That is, when $I=[i_0, i_1, i_2, \ldots, i_{K_{ldpc}-1}]$ is LDPC-encoded, an LDPC codeword $c=[c_0, c_1, c_2, c_3, \ldots, c_{N_{ldpc}-1}]$ is generated. That is, the LDPC codeword is a bit string consisting of a plurality of bits, and an LDPC codeword bit means respective bits. Also, the LDPC information word is a bit string consisting of a plurality of bits, and an information bit means each bit forming an information word. At this point, in case of a systematic code, an LDPC codeword $c=[c_0, c_1, c_2, c_3, \ldots, c_{N_{ldpc}-1}]=[i_0, i_1, \ldots, i_{K_{ldpc}-1}, p_0, p_1, \ldots, p_{N_{parity}-1}]$ is configured. Here, $P=[p_0, p_1, \ldots, p_{N_{parity}-1}]$ is parity bits, and the number of parity bits is $N_{parity}=N_{ldpc}-K_{ldpc}$.

The LDPC encoding includes a process for determining a codeword meeting a condition of Equation (1).

$$H \cdot c^T = 0 \text{ where } c=[c_0, c_1, c_2, \ldots, c_{N_{ldpc}-1}] \quad (1)$$

In Equation (1), H is a parity test matrix, c is a codeword, $c_i$ is an i-th bit of a codeword, and $N_{ldpc}$ is a codeword length. The parity test matrix H consists of $N_{ldpc}$ columns, and an i-th column means it is related to an i-th codeword bit $c_i$.

Generally, according to an LDPC code, encoding is performed under a situation where an information word length and a codeword length have been determined as $K_{ldpc}$ and $N_{ldpc}$ in advance. Therefore, in the case where an information word of a length shorter than $K_{ldpc}$ is input or in case of generating a codeword of a length shorter than $N_{ldpc}$, an appropriate method is required. For example, in the case where an information word having a length of $K_I$ is input to an encoder, a transmission end shortens $K_{ldpc}-K_I$ bits. $K_I$ is shorter than the length $K_{ldpc}$ of an information word required by an encoder. Also, in the case where the length $N_{txparity}$ of a required parity is smaller than the parity length $N_{parity}$, a transmission end punctures $N_{parity}-N_{txparity}$ bits. $N_{parity}$ is the length of an actually transmitted parity, and is determined based on $K_I$ and an encoding rate required for transmission.

In the case where a portion of a bit is shortened or punctured with consideration of an information word and the length of a parity, the performance of a codeword may change remarkably based on which bit is shortened or punctured. Therefore, a method for selecting the shortened bit and punctured bits so that an optimized performance is maintained should be proposed.

SUMMARY OF THE INVENTION

An aspect of the present invention is to address at least the above-mentioned problems and/or disadvantages and to provide at least the advantages described below. Accordingly, an aspect of the present invention is to provide an apparatus and a method for selecting shortened and punctured bits while maintaining an optimized performance in a communication/broadcasting system.

In accordance with an aspect of the present invention, a method for operating a transmission end in a communication/broadcasting system is provided. The method includes determining a number of zero-padding bits, determining a number $N_{pad}$ of bit groups in which all bits are padded with zeros, padding the all bits within $0^{th}$ to $(N_{pad}-1)^{th}$ bit groups with zeros based on a shortening pattern, encoding information bits including the zero-padded bits to generate a codeword. Here, the shortening pattern is defined in a sequence of bit groups defined as 9, 8, 15, 10, 0, 12, 5, 27, 6, 7, 19, 22, 1, 16, 26, 20, 21, 18, 11, 3, 17, 24, 2, 23, 25, 14, 28, 4, 13 and 29.

In accordance with another aspect of the present invention, a method for operating a transmission end in a communication/broadcasting system is provided. The method includes encoding information bits to generate a codeword, determining a number of bits to be punctured in parity bits of the codeword, determining a number $N_{punc\_groups}$ of parity bit groups in which all bits are punctured, and puncturing all parity bits included in a set of parity bit groups. Here, the set of parity bit groups comprises all parity bit groups of a second parity part and a $0^{th}$ to an $(N_{punc\_groups}-Q_{ldpc2}-1)$ parity bit groups of a first parity part indicated by a first puncturing pattern, if the number $N_{punc\_groups}$ is equal to or greater than a predefined number $Q_{ldpc2}$. Here, the first puncturing pattern is defined in a sequence of parity bit groups defined as 21, 17, 0, 24, 7, 10, 14, 12, 23, 1, 16, 3, 5, 26, 28, 19, 4, 15, 8, 2, 27, 20, 6, 9, 25, 13, 11, 18, 22 and 29.

In accordance with still another aspect of the present invention, a method for operating a reception end in a communication/broadcasting system is provided. The method includes receiving a codeword, determining a number of zero-padded bits, determining a number $N_{pad}$ of bit groups in which all bits are padded with zeros, setting a first set of decoder input values corresponding to all bits within $0^{th}$ to $(N_{pad}-1)^{th}$ bit groups indicated by a shortening pattern by values which represent shortened information bits, and decoding values comprising the first set of the decoder input value and a second set of the decoder input value corresponding to information bits which are not padded with zeros, to generate information bits. Here, the shortening pattern is defined in a sequence of bit groups defined as 9, 8, 15, 10, 0, 12, 5, 27, 6, 7, 19, 22, 1, 16, 26, 20, 21, 18, 11, 3, 17, 24, 2, 23, 25, 14, 28, 4, 13 and 29.

In accordance with yet another aspect of the present invention, a method for operating a reception end in a communication/broadcasting system is provided. The method includes receiving a codeword, determining a number of bits punctured in LDPC parity bits of the codeword, determining a number $N_{punc\_groups}$ of parity bit groups in which all bits are punctured, setting a first set of decoder input values by a value representing punctured parity bits, and setting a second set of decoder input values corresponding to non-punctured parity bits based on the received codeword. Here, the first set of decoder input values comprise all parity bits included in a second parity part and all parity bits within $0^{th}$ to an $(N_{punc\_groups}-Q_{ldpc2}-1)^{th}$ parity bit group of a first parity part indicated by a first puncturing pattern, if the number $N_{punc\_groups}$ of parity bit groups is equal to or greater than a predefined number $Q_{ldpc2}$. Here, the first puncturing pattern is defined in a sequence of parity bit groups defined as 21, 17, 0, 24, 7, 10, 14, 12, 23, 1, 16, 3, 5, 26, 28, 19, 4, 15, 8, 2, 27, 20, 6, 9, 25, 13, 11, 18, 22 and 29.

In accordance with further another aspect of the present invention, an apparatus of a transmission end in a communication/broadcasting system is provided. The apparatus may include a padding unit configured to determine a number of zero-padding bits, to determine a number $N_{pad}$ of bit groups in which all bits are padded with zeros, and, to pad the all bits within $0^{th}$ to $(N_{pad}-1)^{th}$ bit groups with zeros based on a shortening pattern, and an encoding unit configured to encode information bits including the zero-padded bits to generate a codeword. Here, the shortening pattern is defined in a sequence of bit groups defined as 9, 8, 15, 10, 0, 12, 5, 27, 6, 7, 19, 22, 1, 16, 26, 20, 21, 18, 11, 3, 17, 24, 2, 23, 25, 14, 28, 4, 13 and 29.

In accordance with further another aspect of the present invention, an apparatus of a transmission end in a communication/broadcasting system is provided. The apparatus may include an encoding unit configured to encode information bits to generate a codeword, and a puncturing unit configured to determine a number of bits to be punctured in parity bits of the codeword, to determine a number $N_{punc\_groups}$ of parity bit groups in which all bits are punctured, and to puncture all parity bits included in a set of parity bit groups. Here, the set of parity bit groups comprises all parity bit groups of a second parity part and a $0^{th}$ to an $(N_{punc\_groups}-Q_{ldpc2}-1)$ parity bit groups of a first parity part indicated by a first puncturing pattern, if the number $N_{punc\_groups}$ is equal to or greater than a predefined number $Q_{ldpc2}$. Here, the first puncturing pattern is defined in a sequence of parity bit groups defined as 21, 17, 0, 24, 7, 10, 14, 12, 23, 1, 16, 3, 5, 26, 28, 19, 4, 15, 8, 2, 27, 20, 6, 9, 25, 13, 11, 18, 22 and 29.

In accordance with still further another aspect of the present invention, an apparatus of a reception end in a communication/broadcasting system is provided. The apparatus may include a receiver configured to receive a codeword, a restoring unit configured to determine a number of zero-padded bits, to determine a number $N_{pad}$ of bit groups in which all bits are padded with zeros, and, to set a first set of decoder input values corresponding to all bits within $0^{th}$ to $(N_{pad}-1)^{th}$ bit groups indicated by a shortening pattern by values which represent shortened information bits, and a decoding unit configured to decode values comprising the first set of the decoder input value and a second set of the decoder input value corresponding to information bits which are not padded with zeros, to generate information bits. Here, the shortening pattern is defined in a sequence of bit groups defined as 9, 8, 15, 10, 0, 12, 5, 27, 6, 7, 19, 22, 1, 16, 26, 20, 21, 18, 11, 3, 17, 24, 2, 23, 25, 14, 28, 4, 13 and 29.

In accordance with yet further another aspect of the present invention, an apparatus of a reception end in a communication/broadcasting system is provided. The apparatus may include a receiver configured to receive a codeword, and a restoring unit configured to determine a number of bits punctured in LDPC parity bits of the codeword, to determine a number $N_{punc\_groups}$ of parity bit groups in which all bits are punctured, to set a first set of decoder input values by a value representing punctured parity bits, and, to set a second set of decoder input values corresponding to non-punctured parity bits based on the received punctured codeword. Here the first set of decoder input values comprise all parity bits included in a second parity part and all parity bits within $0^{th}$ to an $(N_{punc\_groups}-Q_{ldpc2}-1)^{th}$ parity bit group of a first parity part indicated by a first puncturing pattern, if the number $N_{punc\_groups}$ of parity bit groups is equal to or greater than a predefined number $Q_{ldpc2}$. Here, the first puncturing pattern is defined in a sequence of parity bit groups defined as 21, 17, 0, 24, 7, 10, 14, 12, 23, 1, 16, 3, 5, 26, 28, 19, 4, 15, 8, 2, 27, 20, 6, 9, 25, 13, 11, 18, 22 and 29.

A communication/broadcasting system may encode and decode information bits of various lengths and simultaneously maintain optimized performance by grouping columns with consideration of a characteristic of a parity test matrix, and performing shortening and puncturing on a bit group basis corresponding to each column group.

Other aspects, advantages and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings in which:

FIGS. 3A to 3C are views illustrating a relation equation between a parity test matrix and a codeword in a communication/broadcasting system according to an embodiment of the present invention;

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Hereinafter, the present invention describes a technology for shortening or puncturing some bits of a codeword corresponding to an LDPC code without performance deterioration in a communication/broadcasting system.

Hereinafter, the present invention uses terminologies and titles defined by a Digital Video Broadcasting the 2nd Generation Terrestrial (DVB-T2) which is one of European digital broadcasting standards and a Digital Video Broadcasting Next Generation Handheld (DVB-NGH) system which is under standardization. However, the present invention is not limited to the terminologies and titles, and is applicable to other systems performing encoding and decoding.

Figure 1:
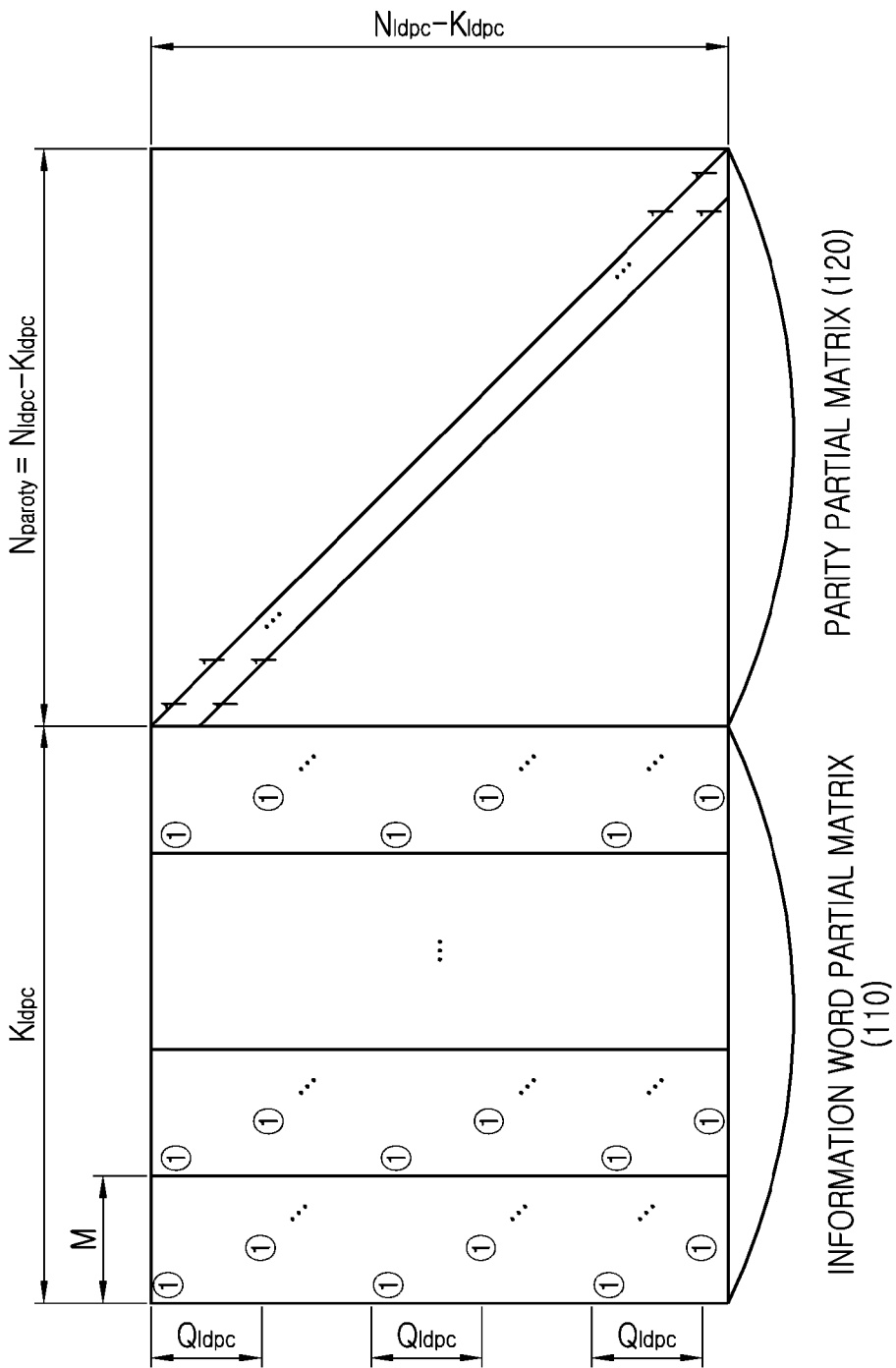
FIG. 1 is a view illustrating an example of a parity test matrix available at a communication/broadcasting system according to an embodiment of the present invention.

The present invention considers a parity test matrix of a structure illustrated in FIG. 1. The parity test matrix illustrated in FIG. 1 has a systematic structure where a codeword includes an information word as it is. Hereinafter, though the present invention is described based on the parity test matrix of FIG. 1, the scope to which the present invention is applicable is not limited to the parity test matrix of FIG. 1.

In FIG. 1, $N_{ldpc}$ is the length of an LDPC codeword and is also the length of columns of the parity test matrix of FIG. 1. $K_{ldpc}$ is the length of an information word and is also the length of columns of an information word partial matrix 110 of FIG. 1. The length of the LDPC codeword or the information word is the number of bits included in the LDPC codeword or the information word. Therefore, the "information word" may be denoted by "information bits". M is an interval with which a pattern of a column is iterated in the partial matrix 110 corresponding to an information word, and $Q_{ldpc}$ is a size by which each column is shifted in the partial matrix 110 corresponding to the information word. M and $Q_{ldpc}$ values are determined such that $$Q_{ldpc} = \frac{N_{ldpc} - K_{ldpc}}{M}$$

is established. At this point, $$\frac{K_{ldpc}}{M}$$

becomes an integer. The M and $Q_{ldpc}$ values may change based on a codeword length and an encoding rate.

Referring to FIG. 1, the parity test matrix is divided into the partial matrix 110 corresponding to the information word and a partial matrix 120 corresponding to a parity. The partial matrix 110 corresponding to the information word includes $K_{ldpc}$ columns, and the partial matrix 120 corresponding to the parity includes $N_{parity}=N_{ldpc}-K_{ldpc}$ columns. The number of rows of the parity test matrix is the same as the number $N_{ldpc}-K_{ldpc}$ of columns of the partial matrix 120 corresponding to the parity.

In the partial matrix 120 corresponding to the parity including a $K_{ldpc}$-th column to an ($N_{ldpc}-1$)-th column of the parity test matrix, the positions of elements having weight-1, that is, a value 1 have a dual diagonal structure. Therefore, all degrees of the rest of columns excluding the ($N_{ldpc}-1$)-th column are 2, and the degree of the last ($N_{ldpc}-1$)-th column is 1.

Referring to FIG. 1, in the parity test matrix, that is, the structure of the information word partial matrix 110 including a 0-th column to a ($K_{ldpc}-1$)-th column conforms to the following rule. First, $K_{ldpc}$ columns corresponding to an information word in the parity test matrix are divided into $$\frac{K_{ldpc}}{M}$$

column groups. Columns belonging to the same column group have a relation shifted from each other by $Q_{ldpc}$. Second, assuming that a degree of a 0-th column of an i-th $$\left(i=0, 1, \ldots, \frac{K_{ldpc}}{M}\right)$$

column group is $D_i$ and the positions of respective rows where 1 exists are $R_{i,0}^{(0)}, R_{i,0}^{(1)}, \ldots, R_{i,0}^{(D_i-1)}$, an index $R_{i,j}^{(k)}$ of a row where (weight-1) is positioned in a j-th column within an i-th column group is determined as in Equation (2).

$$R_{i,j}^{(k)} = \left(R_{i,(j-1)}^{(k)} + Q_{ldpc}\right) \bmod(N_{ldpc} - K_{ldpc}) \quad (2)$$

$$(k=0, 1, 2, \ldots, D_i-1)\left(i=0, 1, \ldots, \frac{K_{ldpc}}{M}\right)(j=1, 2, \ldots, M)$$

where $R_{i,j}^{(k)}$ is an index of a row where a k-th (weight-1) exists in a j-th column within a i-th column group, $R_{i,(j-1)}^{(k)}$ is an index of a row where a k-th (weight-1) exists in a (j−1)-th column within a i-th column group, $Q_{ldpc}$ is a size by which each column is shifted in a partial matrix corresponding to the information word, $N_{ldpc}$ is the length of an LDPC codeword, $K_{ldpc}$ is the length of an information word, $D_i$ is a degree of columns belonging to an i-th column group, and M is the number of columns belonging to one column group.

According to Equation (2), it is revealed that when only $R_{i,0}^{(k)}$ value is known, an index of a row where a k-th (weight-1) exists within an i-th column group is known. Therefore, when an index value of a row where a k-th (weight-1) exists in a 0-th column within each column group is stored, the positions of a column and a row where (weight-1) of a parity test matrix having the structure of FIG. 1 exists may be known.

According to the above rules, all degrees of columns belonging to an i-th column group are identically $D_i$. According to the above rules, an LDPC code storing information regarding the parity test matrix may be briefly expressed as below.

As a specific example, in the case where $N_{ldpc}$ is 30, $K_{ldpc}$ is 15, and $Q_{ldpc}$ is 3, the position information of a row where (weight-1) is positioned in each of 0-th columns of three column groups may be expressed as a sequence as in Equation (3). A sequence as in Equation (3) may be denoted by 'weight-1 position sequence'.

$$R_{1,0}^{(1)}=1, R_{1,0}^{(2)}=2, R_{1,0}^{(3)}=8, R_{1,0}^{(4)}=10,$$

$$R_{2,0}^{(1)}=0, R_{2,0}^{(2)}=9, R_{2,0}^{(3)}=13$$

$$R_{3,0}^{(1)}=0, R_{3,0}^{(2)}=14 \quad (3)$$

In Equation (3), $R_{i,0}^{(k)}$ is an index of a row where a k-th (weight-1) exists in a 0-th column within an i-th column group.

(weight-1) position sequences as in Equation (3) representing an index of a row where 1 exists in a 0-th column of each column group may be more briefly expressed as in Table 1 below.

TABLE 1

1 2 8 10
0 9 13
0 14

Table 1 represents a position of weight-1, in other words, an element having a value 1. An i-th weight-1 position sequence is expressed as indexes of a row where weight-1 exists in a 0-th column belonging to an i-th column group. When Table 1 is used, an information word partial matrix of a 15×15 size of a parity test matrix of a 30×15 size may be generated. Also, since the parity partial matrix of a 15×15 size is determined to have a dual diagonal structure in advance, the parity test matrix of a 30×15 size may be generated using Table 1.

In addition to a codeword length $N_{ldpc}$ and a code rate R having the parity test matrix of FIG. 1, $K_{ldpc}$ and M may be determined as in Table 2 below.

TABLE 2

| $N_{ldpc}$ | R | $K_{ldpc}$ | M | Q |
|---|---|---|---|---|
| 4320 | 1/2 | 2160 | 72 | 30 |

An example of a parity test matrix having parameters of Table 2 is given in Table 3. In expressing a parity test matrix, a column group index marked by 'i' in Table 3 below may be excluded generally.

TABLE 3

| i | Index of row in which '1' is posotioned in $0^{th}$ column of $i^{th}$ column group |
|---|---|
| 0 | 142 150 213 247 507 538 578 828 969 1042 1107 1315 1509 1584 1612 1781 1934 2106 2117 |
| 1 | 3 17 20 31 97 466 571 580 842 983 1152 1226 1261 1392 1413 1465 1480 2047 2125 |
| 2 | 49 169 258 548 582 839 873 881 931 995 1145 1209 1639 1654 1776 1826 1865 1906 1956 |
| 3 | 148 393 396 486 568 806 909 965 1203 1256 1306 1371 1402 1534 1664 1736 1844 1947 2055 |
| 4 | 185 191 263 290 384 769 981 1071 1202 1357 1554 1723 1769 1815 1842 1880 1910 1926 1991 |
| 5 | 424 444 923 1679 |
| 6 | 91 436 535 978 |
| 7 | 362 677 821 1695 |
| 8 | 1117 1392 1454 2030 |
| 9 | 35 840 1477 2152 |
| 10 | 1061 1202 1836 1879 |
| 11 | 242 286 1140 1538 |
| 12 | 111 240 481 760 |
| 13 | 59 1268 1899 2144 |
| 14 | 737 1299 1395 2072 |
| 15 | 34 288 810 1903 |
| 16 | 232 1013 1365 1729 |
| 17 | 410 783 1066 1187 |
| 18 | 113 885 1423 1560 |
| 19 | 760 909 1475 2048 |
| 20 | 68 254 420 1867 |
| 21 | 283 325 334 970 |
| 22 | 168 321 479 554 |
| 23 | 378 836 1913 1928 |
| 24 | 101 238 964 1393 |
| 25 | 304 460 1497 1588 |
| 26 | 151 192 1075 1614 |
| 27 | 297 313 677 1303 |
| 28 | 329 447 1348 1832 |
| 29 | 582 831 984 1900 |

Hereinafter, the present invention describes an encoding process of an LDPC code using a parity test matrix having the structure of FIG. 1. For convenience in description, the present invention describes the parity test matrix of Table 3 as an example. As described above, the encoding process of the LDPC code determines a codeword C meeting a relation equation where product of a parity test matrix and a codeword becomes 0. Various encoding methods exist with respect to a given parity test matrix, and an encoding process described below is a mere example.

A sequence of an i-th row of Table 3 sequentially represents information regarding an i-th column group. That is, as a specific example, the present invention explains an LDPC encoding process using a parity test matrix having the structure of FIG. 1 on the assumption that $N_{ldpc}$ is 4320, $K_{ldpc}$ is 2160, M is 72, and $Q_{ldpc}$ is 30. Also, for convenience in description, the present invention represents an information bit whose length is $K_{ldpc}$ as $[i_0, i_1, i_2, \ldots, i_{K_{ldpc}-1}]$, and represents a parity whose length is $N_{ldpc}-K_{ldpc}$ as $[p_0, p_1, p_2, \ldots, p_{N_{ldpc}-K_{ldpc}-1}]$ In step 1, an encoder initializes parity bits. That is, $p_0=p_1=p_2=\ldots=p_{N_{ldpc}-K_{ldpc}-1}=0$.

In step 2, the encoder accumulates a 0-th information bit $i_0$ in a parity bit address represented on a 0-th row of Table 3. In other words, the encoder performs an operation of Equation (4).

$$p_{142} = p_{142} \oplus i_1 \quad p_{1107} = p_{1107} \oplus i_1 \quad (4)$$
$$p_{150} = p_{150} \oplus i_1 \quad p_{1315} = p_{1315} \oplus i_1$$
$$p_{213} = p_{213} \oplus i_1 \quad p_{1509} = p_{1509} \oplus i_1$$
$$p_{247} = p_{247} \oplus i_1 \quad p_{1584} = p_{1584} \oplus i_1$$
$$p_{507} = p_{507} \oplus i_1 \quad p_{1612} = p_{1612} \oplus i_1$$
$$p_{538} = p_{538} \oplus i_1 \quad p_{1781} = p_{1781} \oplus i_1$$
$$p_{578} = p_{578} \oplus i_1 \quad p_{1934} = p_{1934} \oplus i_1$$
$$p_{828} = p_{828} \oplus i_1 \quad p_{2106} = p_{2106} \oplus i_1$$
$$p_{969} = p_{969} \oplus i_1 \quad p_{2117} = p_{2117} \oplus i_1$$
$$p_{1042} = p_{1042} \oplus i_1$$

In Equation (4), $i_0$ is a 0-th information bit, $p_i$ is an i-th parity bit, and $\oplus$ means a binary operation. According to the binary operation, $1 \oplus 1$ is 0, $1 \oplus 0$ is 1, $0 \oplus 1$ is 1, and $0 \oplus 0$ is 0.

In step 3, the encoder accumulates a 0-th information bit $i_m$ on a parity bit address with respect to the rest of M−1(=71) information bits $i_m$ (m=1, 2, ..., 71). At this point, the bit address may be determined as in Equation (5) below.

$$\{x+(m \bmod M) \times Q_{ldpc}\} \bmod(N_{ldpc}-K_{ldpc}) \quad (5)$$

where x is an address value of a parity bit accumulator related to a 0-th information bit $i_0$, M is an interval by which a pattern of a column is iterated in a partial matrix corresponding to an information word, $Q_{ldpc}$ is a size by which each column is shifted in a partial matrix corresponding to the information word, $N_{ldpc}$ is the length of an LDPC codeword, and $K_{ldpc}$ is the length of LDPC information bits. Here, M is 72 and $Q_{ldpc}$ is 30.

In Equation (5), an address value of the accumulator is the same as an index of a row where weight-1 of an m-th column of the parity test matrix exists. Also, $Q_{ldpc}$ and M are different constant values based on an encoding rate. In the case where an encoding rate of ½ and the parity test matrix of FIG. 1 are used and position information of 1 of a first column of each column group is given by Table 3, M is 72, $N_{ldpc}$ is 4320, and $Q_{ldpc}$ is 30. In this case, an operation of Equation (6) is performed.

$$p_{172} = p_{172} \oplus i_1 \quad p_{1137} = p_{1137} \oplus i_1 \quad (6)$$
$$p_{180} = p_{180} \oplus i_1 \quad p_{1345} = p_{1345} \oplus i_1$$
$$p_{243} = p_{243} \oplus i_1 \quad p_{1539} = p_{1539} \oplus i_1$$
$$p_{277} = p_{277} \oplus i_1 \quad p_{1614} = p_{1614} \oplus i_1$$

-continued $$p_{537} = p_{537} \oplus i_1 \quad p_{1642} = p_{1642} \oplus i_1$$
$$p_{568} = p_{568} \oplus i_1 \quad p_{1811} = p_{1811} \oplus i_1$$
$$p_{608} = p_{608} \oplus i_1 \quad p_{1964} = p_{1964} \oplus i_1$$
$$p_{858} = p_{858} \oplus i_1 \quad p_{2136} = p_{2136} \oplus i_1$$
$$p_{999} = p_{999} \oplus i_1 \quad p_{2147} = p_{2147} \oplus i_1$$
$$p_{1072} = p_{1072} \oplus i_1$$

In Equation (6), $i_1$ is a first information bit, $p_i$ is an i-th parity bit, and $\oplus$ means a binary operation. According to the binary operation, $1 \oplus 1$ is 0, $1 \oplus 0$ is 1, $0 \oplus 1$ is 1, and $0 \oplus 0$ is 0.

In step 4, the encoder accumulates a 72-nd information bit $i_{72}$ on a given parity bit address in a first row of Table 3 with respect to the 72-nd information bit $i_{72}$. Similarly, a parity bit address for 71 information bits $i_m$ (m=72, 74, ..., 143) may be determined as in Equation (7) below.

$$\{x+(m \bmod M) \times Q_{ldpc}\} \bmod(N_{ldpc}-K_{ldpc}) \quad (7)$$

where x is an address value of a parity bit accumulator related to a 72-nd information bit $i_{72}$, M is an interval by which a pattern of a column is iterated in a partial matrix corresponding to an information word, $Q_{ldpc}$ is a size by which each column is shifted in a partial matrix corresponding to the information word, $N_{ldpc}$ is the length of an LDPC codeword, and $K_{ldpc}$ is the length of LDPC information bits. Here, M is 72 and $Q_{ldpc}$ is 30.

In step 5, a new row of Table 3 is used for determining an address of a parity bit with respect to each group of 72 new information bits. After the above-described process is performed on all information bits, last parity bits are determined as follows.

In step 6, an operation of Equation (8) is performed. At this point, i is initialized to 1.

$$p_i = p_i \oplus p_{i-1}, i=1, 2, \ldots, N_{ldpc}-K_{ldpc}-1 \quad (8)$$

where $p_i$ is an i-th parity bit, $N_{ldpc}$ is the length of an LDPC codeword, $K_{ldpc}$ is the length of LDPC information bits, and $\oplus$ is a binary operation. According to the binary operation, $1 \oplus 1$ is 0, $1 \oplus 0$ is 1, $0 \oplus 1$ is 1, and $0 \oplus 0$ is 0.

In step 7, the encoder determines final values of $p_i$ (i=0, 1, 2, ..., $N_{ldpc}-K_{ldpc}-1$) as parity bits.

As described above, a column of a parity test matrix related to $i_0$ is a first column of a first column group in the parity test matrix of the same structure as the structure of FIG. 1. Therefore, in step 2, a parity bit address value related to $i_0$ is the same as an index of a 0-th row of Table 3, and also is the same as a position value of a row where 1 is positioned in a 0-th column of a 0-th column group. Also, the position of a row where 1 of other columns belonging to a 0-th column group is positioned may be expressed by Equation (2), and this may be expressed by Equation (5), so that a parity bit address value may be expressed. That is, Table 3 representing the position of weight-1 of a parity test matrix may be used as the parity bit address value during an encoding process.

Figure 2:
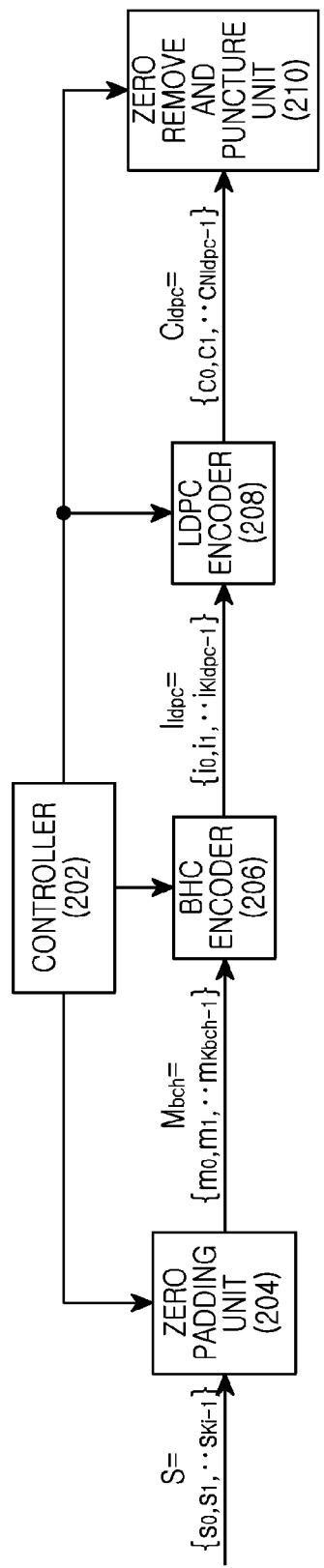
FIG. 2 is a block diagram illustrating a transmission end in a communication/broadcasting system according to an embodiment of the present invention.

FIG. 2 is a block diagram illustrating a transmission end in a communication/broadcasting system according to an embodiment of the present invention.

As illustrated in FIG. 2, the transmission end includes a controller 202, a zero (0) padding unit 204, a Bose Chaudhuri, Hocquenghem (BCH) encoder 206, an LDPC encoder 208, and a puncture unit 210. The encoder may include the BCH encoder 206 and the LDPC encoder 208. Alternatively, the encoder may include the zero padding unit 204, the BCH encoder 206, the LDPC encoder 208, and the puncture unit 210.

The zero padding unit 204 pads at least one bit having a value of 0 in information bits. That is, the zero padding unit 204 meets an input bit string length of the BCH encoder 206 by padding a bit having at least one zero value in input information bits. For example, the zero padding unit 204 may determine the position of at least one zero bit and then additionally pad in information bits. For another example, the zero padding unit 204 may replace zero bits of a non-zero bit position in a zero bit string of an input bit string length of the BCH encoder 206 consisting of all zero bits by the information bits. Specifically, information bits $S=[s_0, s_1, \ldots, s_{K_I-1}]$ having a length of $K_I$ is input to the zero padding unit 204. The zero padding unit 204 receives information regarding O-padding from the controller 202. The information regarding the O-padding includes at least one of the number of bits to be padded to 0 and the position of bits to be padded to 0. Also, the zero padding unit 204 generates BCH information bits $M=[m_0, m_1, \ldots, m_{K_{bch}-1}]$ having a length of $K_{bch}$ by padding bits to 0 using information regarding the 0-padding. A process for determining the positions and the number of bits to be padded to 0 is described below in detail.

The BCH encoder 206 generates $(K_{ldpc}-K_{bch})$ BCH parity bits and generates BCH codeword $I_{ldpc}=[i_0, i_1, \ldots, i_{K_{ldpc}-1}]$ by performing BCH encoding on BCH information bits $M=[m_0, m_1, \ldots, m_{K_{bch}-1}]$. The BCH codeword $i_{ldpc}=[i_0, i_1, \ldots, i_{K_{ldpc}-1}]$ is LDPC information bits for LDPC encoding and is input to the LDPC encoder 208. Since the BCH encoding is a well known technology and is disclosed in documents of "Bose, R. C.; Ray-Chaudhuri, D. K. (March 1960), "On A Class of Error Correcting Binary Group Codes", Information and Control 3 (1): 68-79, ISSN 0890-5401", etc., detailed description thereof is omitted.

The LDPC encoder 208 generates an LDPC codeword $C_{ldpc}=[c_0, c_1, \ldots, c_{N_{ldpc}-1}]$ by performing LDPC encoding on the LDPC information bits $I_{ldpc}=[i_0, i_1, \ldots, i_{K_{ldpc}-1}]$ That is, the LDPC encoder 208 generates an LDPC codeword using a parity test matrix.

The puncture unit 210 receives the LDPC codeword $C_{ldpc}=[c_0, c_1, \ldots, c_{N_{ldpc}-1}]$, and punctures partial bits in the LDPC codeword. The puncturing means partial bits are not transmitted. Based on cases, for example, in case of using additional parity described below, the puncturing may mean partial bits are not transmitted to the same frame as the information bits. The puncture unit 210 may remove bits padded by the zero padding unit 204 together with the puncturing. In this case, the puncture unit 210 may be denoted by a 'zero remove and puncture unit'. In the case where a function for removing the padded bits is excluded, the zero padding unit 204 may be also omitted. That is, instead of padding bits and generating BCH information bits at the zero padding unit 204, the controller 202 may remove a column corresponding to the padded bit from a parity test matrix used by the LDPC encoder 208. Also, the parity test matrix from which the corresponding column has been removed may be stored in the memory. Since at least one column corresponding to the padded bit is removed, the same effect may be obtained even when the process for padding 0 bits and removing the padded bits is omitted.

The controller 202 provides information for determining at least one of the position and the number of bits to be padded to 0 to the zero padding unit 204, provides information regarding at least one of the number and the position of BCH parity bits to the BCH encoder 206, provides an encoding rate, a codeword length, a parity test matrix, etc. to the LDPC encoder 208, and provides information for determining at least one of the number and the position of punctured bits to the puncture unit 210. In the case where the puncture unit 210 has a zero remove function, the controller 202 provides information for determining at least one of the position and the number of bits to be padded to 0 to the puncture unit 210 like indication to a zero insert unit 204. Also, in the case where operations of the zero padding unit 204, the BCH encoder 206, and the puncture unit 210 are not required, the controller 202 may control the zero padding unit 204, the BCH encoder 206, and the puncture unit 210 not to operate.

In the above construction, since a bit is padded to 0 by the zero padding unit 204 and then the bit padded to 0 is removed by the puncture unit 210, the bits padded to 0 are not transmitted. Padding bits before encoding and removing the padded bits after encoding as described above is called shortening. That is, the shortening includes padding bits to 0 before encoding and removing the bits padded to 0.

In case of the embodiment illustrated in FIG. 2, an output of the zero padding unit 204 is input to the BCH encoding unit 206. However, according to another embodiment of the present invention, the BCH encoder 206 may be omitted. That is, a system may not use a BCH code. In this case, an output of the zero padding unit 204 may be directly input to the LDPC encoder 208. According to still another embodiment of the present invention, the positions of the BCH encoder 206 and the zero padding unit 204 may be mutually changed. That is, first information bits before padding may be input to the BCH encoder 206, an output of the BCH encoder 206 may be provided to the zero padding unit 204, and an output of the zero padding unit 204 may be provided to the LDPC encoder 208.

A transmission end according to an embodiment of the present invention may store position information of bits to be shortened or punctured in advance based on an index sequence defined in advance, or determine the position information via an operation according to a rule defined in advance, and then select the position of object bits of shortening or puncturing in information bits or an LDPC codeword based on the number of bits to be shortened or punctured. Hereinafter, for convenience in description, the present invention denotes a sequence of shortened bits by a 'shortened pattern', and denotes a sequence of punctured bits by a 'punctured pattern'. The shortened pattern and the punctured pattern mean a sequence of punctured parity bit groups or a sequence of shortened bit groups.

The present invention determines a shortened pattern and a punctured pattern in order to apply the shortening and the puncturing to an input bit string of a variable length, and selects shortened/punctured bits based on the number of shortened/punctured bits and a shortened/punctured pattern.

A specific example of shortening and puncturing is described below. In the case where the length $K_I$ of information bits input to the zero padding unit 204 is 5, the length $K_{bch}$ of BCH information bits which is input bit string of the BCH encoder 206 is 8, the length $K_{ldpc}$ of LDPC information bits which is an input bit string of the LDPC encoder 208 is 10, and the length $N_{ldpc}$ of an LDPC codeword which is an output bit string of the LDPC encoder 208 is 20, the number of shortened bits is 3 (=8−5). At this point, the shortening pattern is defined as {7,1,4,6,2,8,3,5,0,9}, and the puncturing pattern is defined as {1,4,8,6,3,0,2,5,7,9}. Assuming the number of punctured bits is 4, the shortening and the puncturing are performed as below.

For example, when $S=[s_0, s_1, s_2, s_3, s_4]$ is input to the zero padding unit 204, BCH information bits $M=[m_0,m_1,m_2,m_3,m_4,m_5,m_6,m_7]$ is output. Since the number of shortening bits is 3, the preceding three values within the shortening pattern are used. Since the preceding three values within the shortened pattern are 7, 1, 4, shortening is performed at positions $m_7, m_1, m_4$. In other words, bits at the positions $m_7, m_1, m_4$ are padded to 0, and the input bits $S=[s_0, s_1, s_2, s_3, s_4]$ are sequentially mapped to positions where bits are not padded. That is, BCH information bits $M=[m_0, m_1, m_2, m_3, m_4, m_5, m_6, m_7]$ output from the zero padding unit 204 are $S=[s_0, 0, s_1, s_2, 0, s_3, s_4, 0]$. M is input to the BCH encoder 206, and an input bit string of the LDPC encoder 208, that is, BCH codeword $I_{ldpc}=[i_0, i_1, i_2, i_3, i_4, i_5, i_6, i_7, i_8, i_9]$ which is LDPC information bits is output. The BCH code is a systematic code, and BCH information bits exist in a codeword as they are. Therefore, LDPC information bits, that is, an output bit string of the BCH code is given by Equation (9) below.

$$\begin{aligned} I_{ldpc} &= [i_0, i_1, i_2, i_3, i_4, i_5, i_6, i_7, i_8, i_9] \\ &= \{m_0, m_1, m_2, m_3, m_4, m_5, m_6, m_7, p_{bch,0}, p_{bch,1}\} \\ &= \{s_0, 0, s_1, s_2, 0, s_3, s_4, 0, p_{bch,0}, p_{bch,1}\} \end{aligned} \quad (9)$$

where $I_{ldpc}$ is a BCH codeword, $i_j$ is a j-th bit of a BCH codeword which is LDPC information bits, $m_j$ is a j-th bit of a bit string including bits padded to 0, and is a j-th BCH information bit of LDPC information bits, $p_{bch,j}$ is a j-th parity bit of LDPC information bits, and $s_j$ is a j-th bit of information bits.

An output bit string $C_{ldpc}$ of the LDPC encoder 208 is given by Equation (10) below.

$$\begin{aligned} C_{ldpc} &= [c_0, c_1, \ldots, c_{19}] = [i_0, i_1, i_2, i_3, i_4, i_5, i_6, i_7, i_8, i_9, p_0, p_1, \\ & p_2, p_3, p_4, p_5, p_6, p_7, p_8, p_9] = [s_0, 0, s_1, s_2, 0, s_3, s_4, \\ & 0, p_{bch,0}, p_{bch,1}, p_0, p_1, p_2, p_3, p_4, p_5, p_6, p_7, p_8, p_9] \end{aligned} \quad (10)$$

where $C_{ldpc}$ is an LDPC codeword, $c_j$ is a j-th bit of an LDPC codeword, $i_j$ is a j-th bit of a BCH codeword which is LDPC information bits, $s_j$ is a j-th BCH information bit of LDPC information bits, $p_{bch,j}$ is a j-th parity bit of LDPD information bits, and $p_j$ is a j-th parity bit of an LDPC codeword.

The output bit string $C_{ldpc}$ which is an LDPC codeword is input to the puncture unit 210, bits padded to 0 by the zero padding unit 204 are removed, and four parity bits are punctured based on a puncture pattern. Since preceding four values within the puncture pattern are 1, 4, 8, 6, $p_1, p_4, p_8, p_6$ are punctured. In this case, shortened and punctured output bit strings are given by Equation (11) below.

$$[s_0, s_1, s_2, s_3, s_4, p_{bch,0}, p_{bch,1}, p_0, p_2, p_3, p_5, p_6, p_7, p_9] \quad (11)$$

where $s_j$ is a j-th bit of information bits, $p_{bch,j}$ is a j-th parity bit of a BCH codeword which is LDPC information bits, and $p_j$ is a j-th parity bit of an LDPC codeword.

As described above, in the case where the shortening and the puncturing are performed on information bits S of a variable length, a transmission end determines a shortening pattern and a puncture pattern, and determines the positions of shortened and punctured bits using values corresponding to the number of shortened and punctured bits in the shortening pattern and the punctured pattern.

Particularly, in case of performing LDPC encoding based on the parity test matrix having the structure of FIG. 1, a sequence of shortened and punctured bits may be determined on a group basis of information bits and parity bits. That is, the present invention divides information bits and parity bits by a plurality of bit groups including a predetermined number of bits, determines a sequence of shortened and punctured groups with respect to the bit groups, and then shortens and punctures bits by a required number of bits based on a shortening pattern and a puncture pattern determined on the bit group basis.

In the above-described shortening and puncturing process, padding is performed on input bits of the BCH encoder 206, and a sequence of input bits of the BCH encoder 206 is the same as a sequence of input bits of the LDPC encoder 208. Also, since a connected performance of an LDPC code and a BCH code shows performance of an LDPC codeword is more dominant, a sequence of shortening may be determined based on a characteristic of an LDPC codeword. Particularly, in the case where an LDPC code is based on a parity test matrix having the structure of FIG. 1 in determining the sequence of shortening, the shortening sequence may be determined on a basis of an information bit group corresponding to a column group of the parity test matrix.

Hereinafter, the present invention describes a relation between a parity test matrix and shortening/puncturing, and describes in detail a process for determining a shortening pattern and a puncture pattern for a system performing LDPC encoding using the parity test matrix of the structure of FIG. 1.

FIGS. 3A to 3C illustrate a relation equation between a parity test matrix and a codeword in a communication/broadcasting system according to an embodiment of the present invention.

FIG. 3A illustrates a relation between a parity test matrix and a codeword. As described above, a condition $H \cdot c^T = 0$ is met, $c_0, c_1, c_2, c_3$ in a codeword $c = [c_0, c_1, c_2, c_3, c_4, c_5, c_6, c_7]$ are information bits, and $c_4, c_5, c_6, c_7$ are parity bits. When the condition $H \cdot c^T = 0$ is expressed differently, it is as shown in FIG. 3B. Referring to FIG. 3B, product of a parity test matrix H and a codeword c may be expressed as sum of products of each codeword bit and each column of the parity test matrix. That is, $H \cdot c^T = 0$ consists of a linear combination of codeword bits and respective rows of the parity test matrix. That is, in the case where a codeword bit $c_i (0 \le i \le 7)$ is '0', an i-th column $h_i$ of the parity test matrix is multiplied by '0', so that $h_i$ is the same as if it were not linearly combined. That is, in the case where a bit $c_i$ is shortened, $c_i = 0$, so that the same effect is caused as if an i-th column $h_i$ were deleted in the parity test matrix. Therefore, determining bits to shorten is an equivalent problem of determining a column to delete among columns of the parity test matrix. Also, though the present invention has described the shortening process based on padding a bit to 0, and then encoding the same, and removing the padded bits among encoded bits, this is the same as performing encoding based on the parity test matrix from which columns corresponding to a bit padded to 0 have been removed.

In the shortening process described below, the present invention defines a sequence of a position where a bit is padded to 0 as a shortening pattern, pads a bit to 0 and then encodes the same, and removes padded bits from a codeword based on the shortening pattern. However, according to another embodiment of the present invention, the shortening pattern may be used for determining a sequence of a position where information bits input to a codeword are input, not a sequence of a position where a bit is padded to 0. The shortening pattern represents a sequence of positions where a bit is padded to 0. Therefore, a sequence of positions to which information bits in a codeword are mapped may be obtained using the shortening pattern. That is, when the shortening pattern is read in a reverse order, a sequence of positions where information bits are mapped is obtained. Therefore, the shortening process may be performed by determining positions where information bits input to the codeword are mapped in the reverse order of the shortening pattern, mapping '0' to bits to which information bits are not mapped and encoding the same, and then removing bits to which 0 has been mapped from the codeword.

Also, in a puncturing process described below, the present invention defines a sequence of selecting punctured bits as a puncture pattern, and punctures bits according to the puncture pattern. However, according to another embodiment of the present invention, the puncture pattern may be used for determining a sequence of bits not to be punctured, not a sequence of positions of bits to be punctured. Since the puncture pattern represents a sequence of punctured bits, when the puncture pattern is read in the reverse order, a sequence of not-punctured bits is obtained. Therefore, the puncturing process may be performed by determining bits not punctured in the reverse order of the puncture pattern, and puncturing the rest of the bits. Particularly, in case of performing puncturing on a fixed length, not a variable length, not-punctured bits may be determined based on the puncture pattern.

Also, referring to FIG. 3C, product of a parity test matrix H and a codeword c may be expressed for each row. That is, four rows may be expressed using four equations 531 to 534. In case of shortened bits, when only the position of a shortened bit is known, a transmission end and a reception end may know '0' has been input. However, in case of punctured bits, even when a punctured position is known, a reception end cannot know a relevant bit is '0' or '1', so that the reception end processes the relevant bit as an unknown value. Therefore, equation of a row including '1' on a position of a column related to a punctured bit may be influenced. Therefore, in case of determining punctured bits, a characteristic of rows including '1' on a position of a column related to a punctured bit in a parity test matrix should be considered.

A fact that the position of a column of the parity test matrix is changed is simply the same as a fact that the position of codeword bits is changed. Therefore, in the case where the position of a column of the parity test matrix is changed, when the position of shortened information bits and the position of punctured parity bits are changed in the same pattern, the same performance may be guaranteed. In this case, a codeword set does not change.

For example, as in FIG. 3B, suppose that when columns of a parity test matrix are $h_0,h_1,h_2,h_3,h_4,h_5,h_6,h_7$, a position of a shortened bit is $c_0,c_3$. When a position of a column is changed to $[h'_0,h'_1,h'_2,h'_3,h'_4,h'_5,h'_6,h'_7]=[h_2,h_1,h_4,h_5,h_7,h_6,h_3,h_0]$, a 0-th column of a parity test matrix is changed to a seventh column, and a third column is changed to a sixth column, so that when $c'_7,c'_6$ are shortened, the same performance may be guaranteed.

As described above, in the case where input information bits length $K_I$ and output codeword length $K_I+N_{parity}$ are smaller than information bit length $K_{ldpc}$ of the LDPC codeword and codeword length $N_{ldpc}$, shortening and puncturing are applied. Generally, punctured bits may be selected among all bits within codewords $c_0$ to $c_{N_{ldpc}-1}$ or among parity bits of the codeword. Hereinafter, description is made on the assumption of a case of selecting puncture bits among only parity bits. At this point, in the case where input information bit length $K_I$ is variable, that is, in the case where $K_I$ is equal to or greater than 1 and equal to or less than $K_{ldpc}$, a sequence of shortening and puncturing for a variable length is required. That is, shortening patterns for a case of shortening one bit to a case of shortening $K_{ldpc}-1$ bits, and puncture patterns for a case of puncturing one bit to a case of puncturing $N_{parity}-1$ bits should be defined.

Hereinafter, the present invention describes a process for determining shortening and puncturing sequences on a bit group basis with a premise of a parity test matrix having the structure of FIG. 1, and describes shortening and puncturing sequences in detail.

First, a shortening sequence for an information bit is determined as below.

With respect to all BCH information bits $M=[m_0, m_1, \ldots, m_{K_{bch}-1}]$, each bit group may be expressed by Equation (12) below.

$$X_j = \left\{ m_k \mid j = \left\lfloor \frac{k}{M} \right\rfloor, 0 \le k \le K_{bch} \right\} \quad (12)$$

for $$0 \le j \le N_{group}$$

where $X_j$ is a j-th bit group, $m_k$ is a k-th BCH information bit of BCH information bits, M is the number of columns included in one column group of a parity test matrix of the form illustrated in FIG. 1 and is the number of bits included in one bit group, $\lfloor x \rfloor$ is a maximum integer not exceeding x, for example, $\lfloor 2.3 \rfloor = 2$, $K_{bch}$ is the length of BCH information bits, $N_{group}$ is the number of bit groups and is $$\left\lceil \frac{K_{bch}}{M} \right\rceil.$$

$\lceil x \rceil$ is a minimum integer exceeding x, for example, $\lceil 2.3 \rceil$ is 3.

Figure 4A:
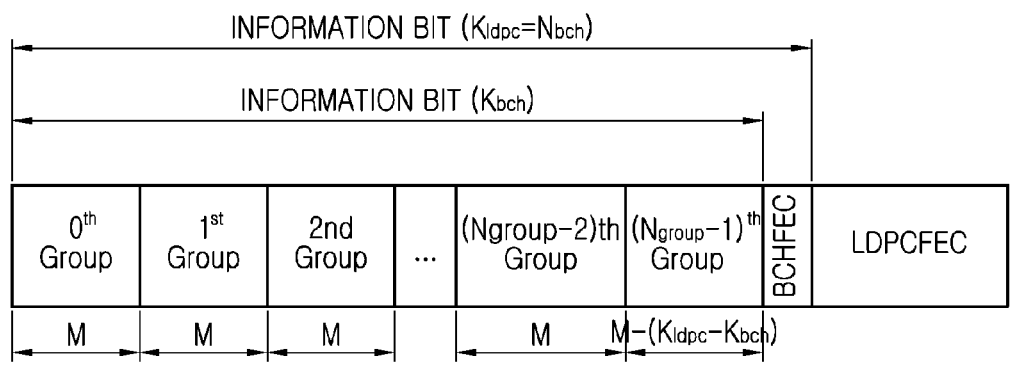
FIGS. 4A and 4B are views illustrating grouping of information bits in a communication/broadcasting system according to an embodiment of the present invention.
Figure 4B:
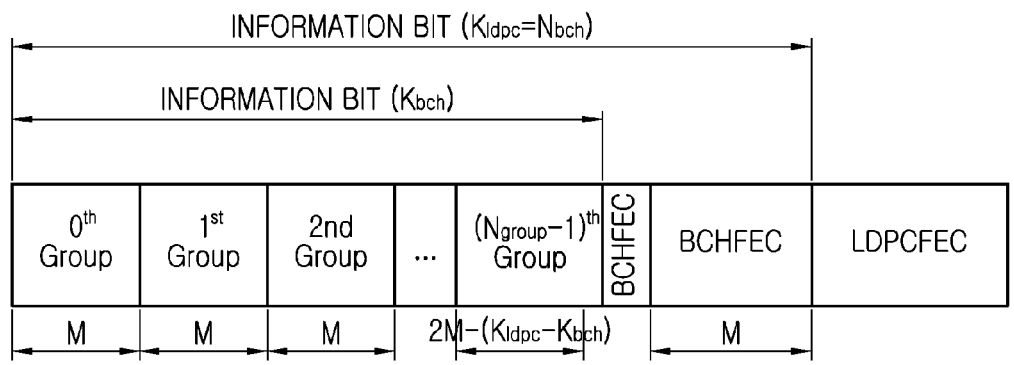

In case of configuring bit groups as in Equation (12), a bit group is given as illustrated in FIGS. 4A and 4B. Referring to FIGS. 4A and 4B, each bit group includes M bits, and a last bit group includes $a \times M - (K_{ldpc} - K_{bch})$ bits. Here, a is $$\left\lfloor \frac{(K_{ldpc} - K_{bch})}{M} \right\rfloor$$

and is a value meaning the number of groups where parity bits of a BCH code are included. FIG. 4A illustrates a case where a is 1, and FIG. 4B illustrates a case where a is 2. In case of a system not using the BCH code, it is obvious that $K_{bch}$ and $K_{ldpc}$ are the same.

The present invention defines a shortening pattern on a bit group basis. At this point, as described above, since BCH information bits are the same as the rest of bits excluding a parity bit of a BCH code among the LDPC information bits, the present invention determines a sequence of shortening with consideration of LDPC information bits. At this point, the present invention determines a sequence of shortening based on a given parity test matrix. A process for determining the sequence of shortening based on the given parity test matrix is described below.

In the parity test matrix of the structure illustrated in FIG. 1, an information word partial matrix 110 may be divided into column groups consisting of M successive columns. Therefore, LDPC information bits corresponding to each column within a column group consisting of M bits may be formed of an information bit group as in Equation (12).

That is, a 0-th bit group of FIG. 4A corresponds to a 0-th column group of FIG. 1. Also, a 0-th bit group includes at least one bit, and each bit within a 0-th bit group of FIG. 4A corresponds to each column within the 0-th column group of FIG. 1. Also, an i-th bit group of FIG. 4A includes bits corresponding to columns within an i-th column group of FIG. 1. Accordingly, the shortening pattern may be determined by determining a sequence of a column group to delete on a column groups basis in a parity test matrix. In other words, switching a deleting sequence of a column group to a sequence of an information bit group corresponding to each column group may be a shortening pattern.

The shortening pattern means a sequence of shortened bits or a sequence of shortened bit groups. In the case where the shortening pattern is defined as a sequence of bit groups, a sequence of shortened bits within each shortened bit group may be defined variously. Since bits belonging to the same group have the same degree and the same cycle performance, the same performance as a method of determining a shortening sequence on a bit basis may be obtained.

Next, a puncturing sequence regarding a parity bit is determined as below.

Figure 5A:
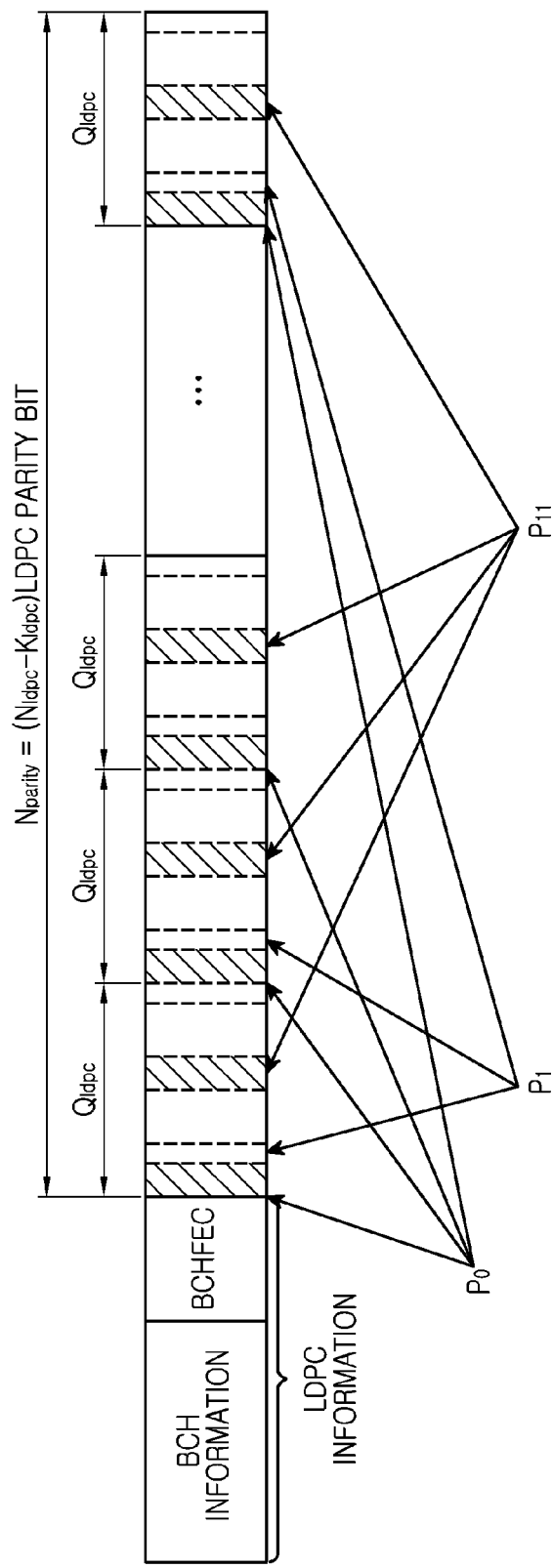
FIGS. 5A and 5B are views illustrating grouping of parity bits in a communication/broadcasting system according to an embodiment of the present invention.
Figure 5B:
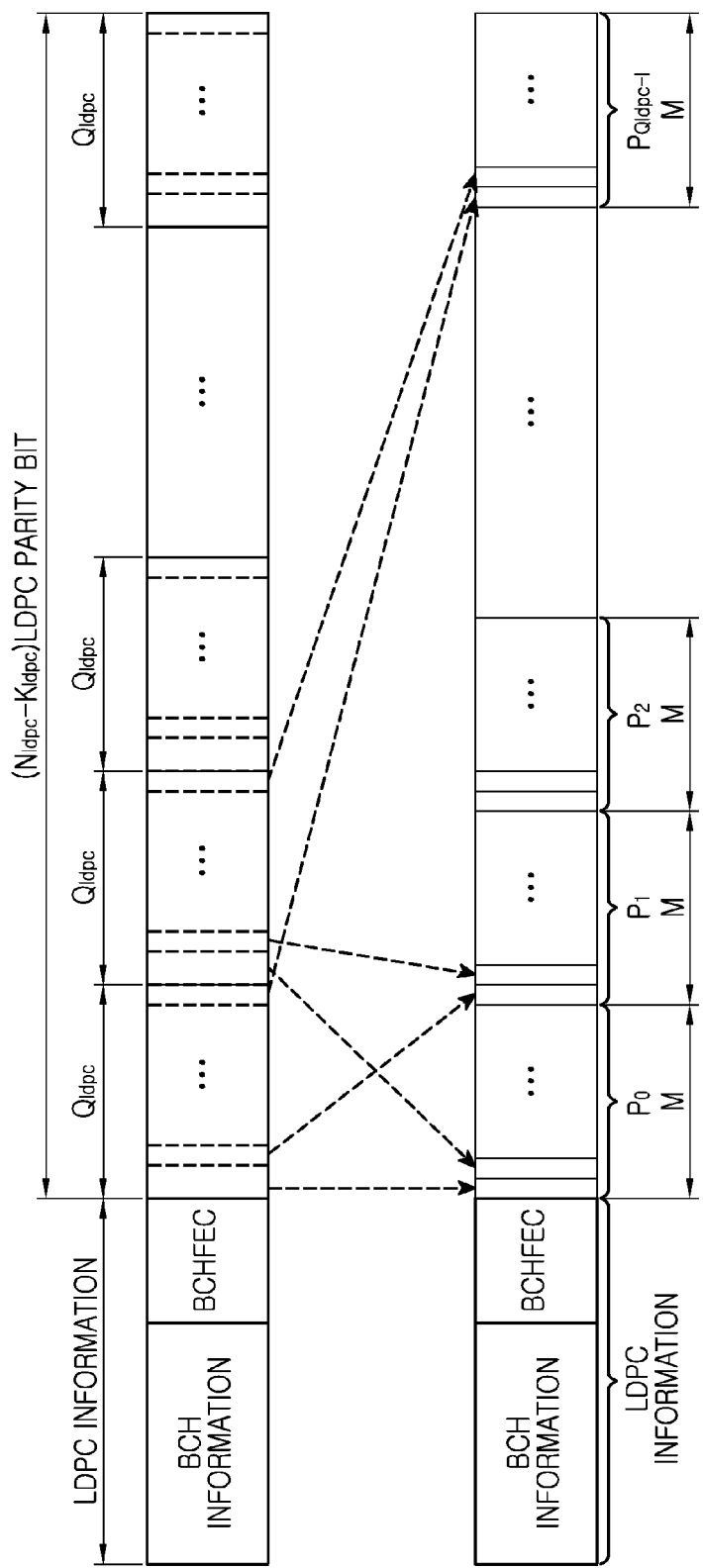

FIGS. 5A and 5B illustrate grouping of parity bits in a communication/broadcasting system according to an embodiment of the present invention. FIGS. 5A and 5B premise a case of using a parity test matrix of the structure illustrated in FIG. 1.

As illustrated in FIG. 5A, all LDPC parity bits [$p_0, p_1, \ldots, p_{N_{ldpc}-K_{ldpc}-1}$] are divided into $Q_{ldpc}$ groups consisting of M bits. Here, $Q_{ldpc}$ is the same as a value obtained by dividing the number of parity bits $N_{parity}=N_{ldpc}-K_{ldpc}$ by M. Each parity bit group may be defined by Equation (13) below.

$$P_j = \{p_k | (k \bmod Q_{ldpc}) = j, 0 \le k < N_{ldpc}-K_{ldpc}\} \text{ for } 0 \le j < Q_{ldpc} \quad (13)$$

where $P_j$ is a j-th parity bit group, $p_k$ is a k-th parity bit, $Q_{ldpc}$ is the number of parity bit groups, $N_{ldpc}$ is the length of an LDPC codeword, and $K_{ldpc}$ is the length of LDPC information bits. That is, the size of a parity bit group meaning the number of bits of each parity bit group is M, and the number of parity bit groups is $Q_{ldpc}$.

As illustrated in FIG. 5B, when parity bits are converted according to Equation (14) below, parity bit groups defined by Equation (15) may be configured. Equation (14) causes an interleaving effect of parity bits.

$$d_{M \cdot t+s} = p_{Q_{ldpc} \cdot s+t} \text{ for } 0 \le s < M, 0 \le t < Q_{ldpc} \quad (14)$$

where $d_j$ is a j-th parity bit after conversion, $p_j$ is a j-th parity bit before conversion, and $Q_{ldpc}$ is the number of parity bit groups.

$$P_j = \left\{d_k \,\bigg|\, j = \left\lfloor \frac{k}{M} \right\rfloor, 0 \le k < N_{ldpc}-K_{ldpc}\right\} \text{ for } 0 \le j < Q_{ldpc} \quad (15)$$

where $p_j$ is a j-th parity bit group before conversion, $d_k$ is a k-th parity bit after conversion, M is the number of columns included in one column group of a parity test matrix of the form illustrated in FIG. 1, $N_{ldpc}$ is the length of an LDPC codeword, $K_{ldpc}$ is the length of LDPC information bits, and $Q_{ldpc}$ is the number of parity bit groups. That is, the size of each parity bit group is M, and the number of parity bit groups is $Q_{ldpc}$.

Parity bits forming the j-th parity bit group $p_j$, represented in Equation (14) and Equation (15) are the same. In other words, parity bits forming each parity bit group do not change. However, when the position of parity bits are converted according to Equation (14), successive bits based on bits $d_j$ after conversion are configured as one group, so that convenience in an aspect of processing increases. Puncturing parity bits on a parity bit group basis may be performed even without Equation (14), Equation (15), and the conversion procedure of FIGS. 5A and 5B.

Since bits within the same parity bit group have the same degree and the same cycle characteristic, when a puncture pattern is determined on a group basis, the same performance as finding an optimized puncture pattern on a bit basis is guaranteed. Therefore, the present invention determines a puncture pattern on a parity bit group basis.

Figure 6A:
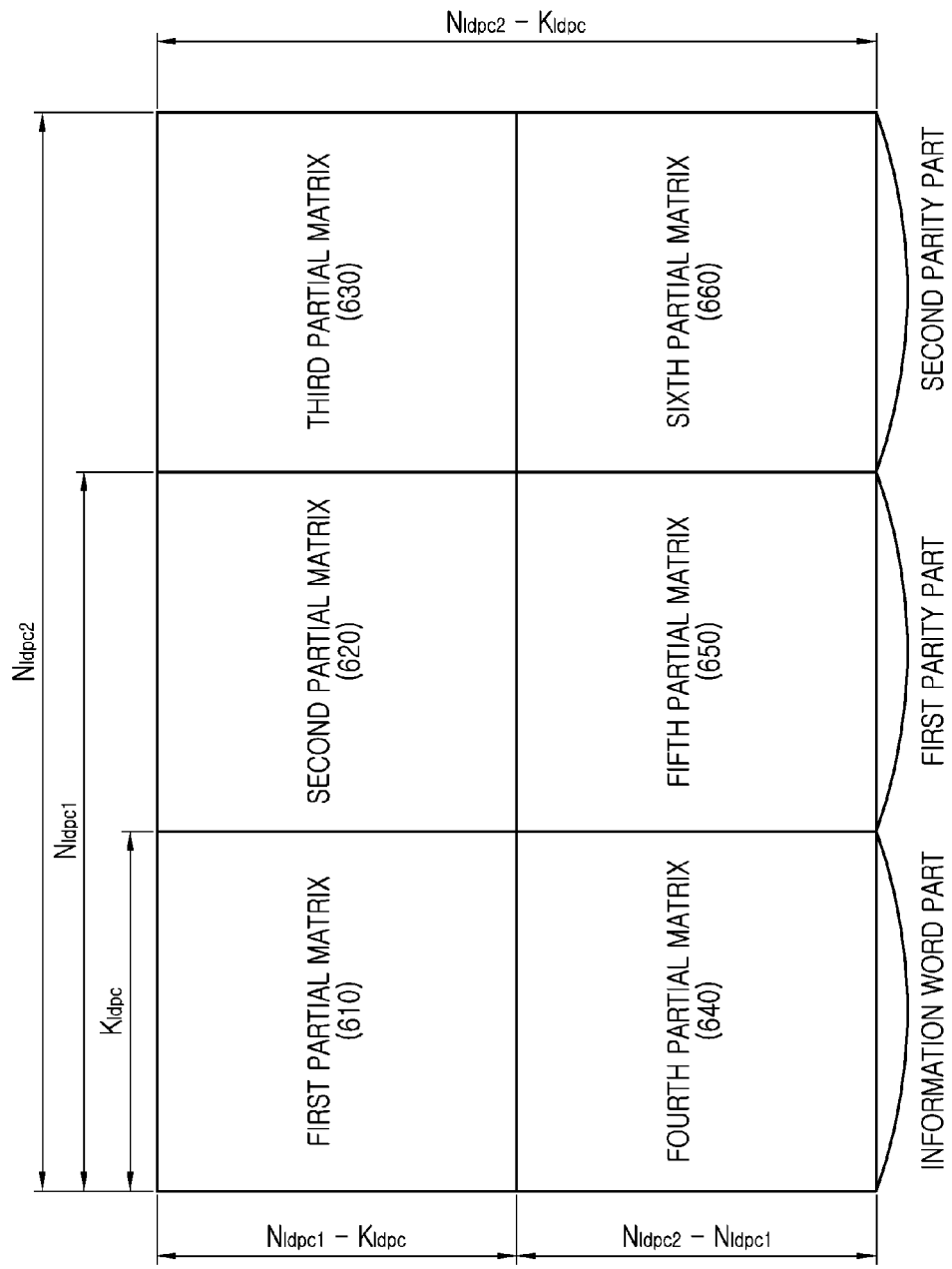
FIGS. 6A and 6B are views illustrating an example of a parity test matrix available at a communication/broadcasting system according to another embodiment of the present invention.
Figure 6B:
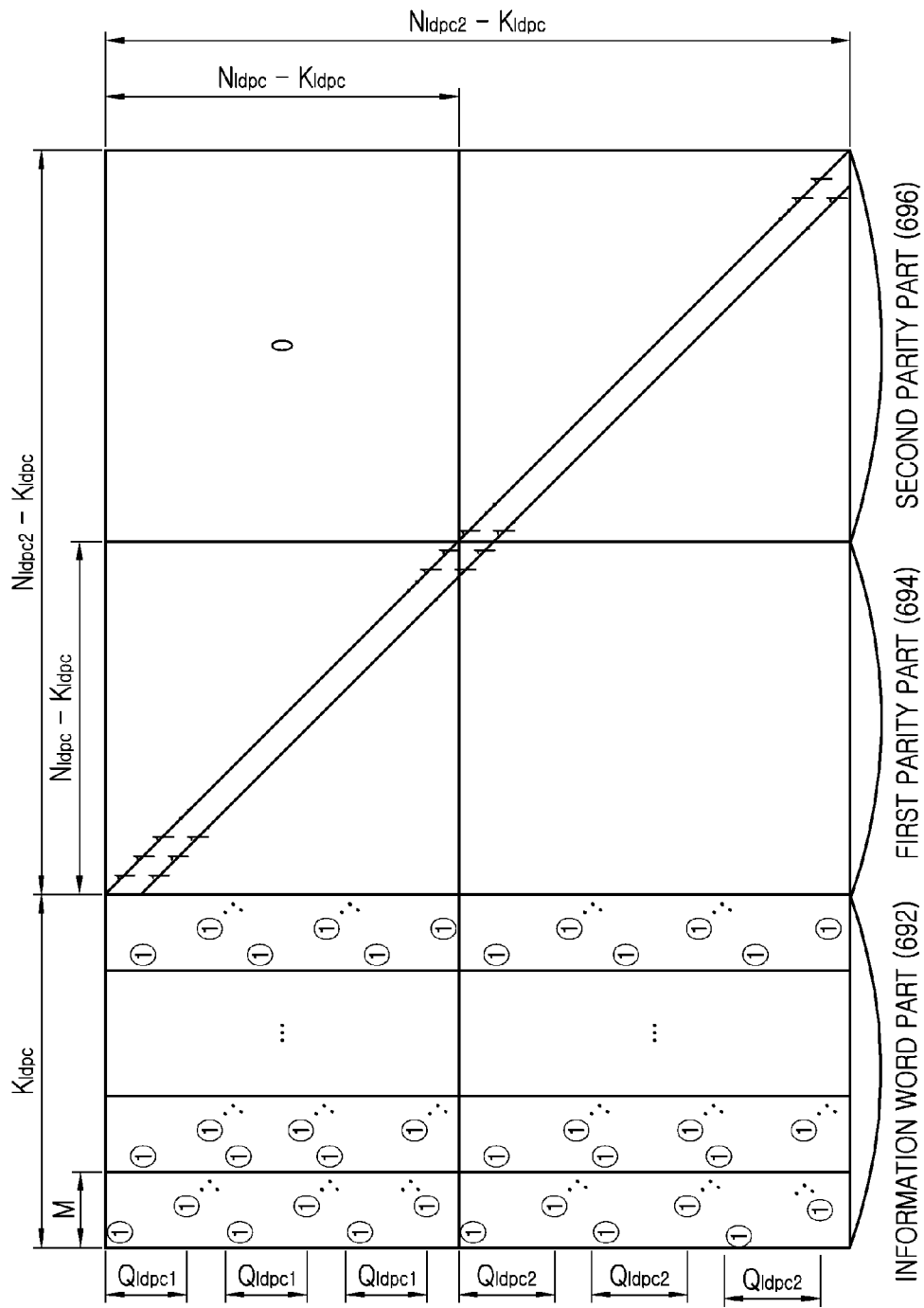

FIGS. 6A and 6B illustrate an example of a parity test matrix available at a communication/broadcasting system according to another embodiment of the present invention.

The parity test matrix of FIGS. 6A and 6B is an extended form of the parity test matrix of FIG. 1, and may be used when the present invention intends to support a codeword having a lower encoding rate while including a codeword encoded based on the parity test matrix of FIG. 1. For example, a transmission end may perform encoding using a first parity test matrix when a high encoding rate is required, and may use an extended second parity test matrix when a low encoding rate is required. For another example, the transmission end may perform encoding using the first parity test matrix when information bits of a short length are input, and may perform encoding using the extended second parity test matrix when information bits of a long length are input.

Referring to FIG. 6A, the parity test matrix includes a first partial matrix 610, a second partial matrix 620, a third partial matrix 630, a fourth partial matrix 640, a fifth partial matrix 650, and a sixth partial matrix 660. The first partial matrix 610 among the six partial matrixes is the same as the information word partial matrix 110 of FIG. 1, and the second partial matrix 620 is the same as the parity partial matrix 120 of FIG. 1. Also, a matrix consisting of the second partial matrix 620, the third partial matrix 630, the fifth partial matrix 650, and the sixth partial matrix 660 forms a parity part and has a double diagonal structure.

For convenience in description, the present invention denotes a matrix formed of the first partial matrix 610 and the second partial matrix 620 by a 'first parity test matrix'. The structure of the 'first parity test matrix' is the same as the structure of the parity test matrix illustrated in FIG. 1. Also, the present invention denotes a matrix formed of the first partial matrix 610, the second partial matrix 620, the third partial matrix 630, the fourth partial matrix 640, the fifth partial matrix 650, and the sixth partial matrix 660 by a 'second parity test matrix'. That is, among the partial matrixes illustrated in FIG. 6A, the first partial matrix 610 and the second partial matrix 620 are included in both the first parity test matrix and the second parity test matrix, but the third partial matrix 630, the fourth partial matrix 640, the fifth partial matrix 650, and the sixth partial matrix 660 are exclusively included in only the second parity test matrix.

The parity test matrix illustrated in FIG. 6A is specifically described below. In FIG. 6A, $K_{ldpc}$ is the length of an information word, and a codeword encoded based on the first parity test matrix is denoted by a first LDPC codeword. $N_{ldpc}$ is the length of the first LDPC codeword, and $N_{ldpc2}$ denotes the length of an LDPC codeword encoded based on the second parity test matrix. Here, the length of the codeword or the information word denotes the number of bits included in the codeword or the information word.

The first partial matrix 610 and the fourth partial matrix 640 corresponding to the information word include $N_{ldpc}$ columns, and the second partial matrix 620 and the fifth partial matrix 650 corresponding to the first parity include $N_{parity} = N_{ldpc} - K_{ldpc}$ columns. Also, the third partial matrix 630 and the sixth partial matrix 660 corresponding to the second parity include $M_{IR} = N_{ldpc2} - N_{ldpc}$ columns. The number of rows of the first parity test matrix is the same as the number of columns $N_{ldpc} - K_{ldpc}$ of the second partial matrix 620 and the fifth partial matrix 650 corresponding to the first parity. The number of rows of the second parity test matrix is the same as $N_{parity} + M_{IR} = N_{ldpc2} - K_{ldpc}$.

FIG. 6B illustrates the structure of the parity test matrix in more detail. In a matrix formed of the second partial matrix 620, the third partial matrix 630, the fifth partial matrix 650, and the sixth partial matrix 660 corresponding to the 'second parity part' including a $K_{ldpc}$-th column to a $(N_{ldpc2}-1)$-th column of the parity test matrix, the position of elements having weight-1, that is, a value 1 has a dual diagonal structure. Therefore, all of degrees of the rest of the columns excluding the $(N_{ldpc2}-1)$-th column among columns included in the second partial matrix 620, the third partial matrix 630, the fifth partial matrix 650, and the sixth partial matrix 660 corresponding to the 'second parity part' are 2, and a degree of the $(N_{ldpc2}-1)$-th column is 1.

A structure of a partial matrix including the first partial matrix 610 corresponding to an information word in the parity test matrix, that is, a partial matrix including a 0-th column to a $(K_{ldpc}-1)$-th column and a 0-th row to a $(N_{ldpc}-K_{ldpc}-1)$-th row conforms to the following rule. First, $K_{ldpc}$ columns corresponding to an information word in the parity test matrix belong to the same group on M basis, and are divided into $$\frac{K_{ldpc}}{M}$$

column groups in total. Columns belonging to the same column group have a relation mutually shifted by $Q_{ldpc1}$. That is, $Q_{ldpc}$ the same meaning as $Q_{ldpc}$ of FIG. 1.

Also, a structure of a partial matrix including the fourth partial matrix 640 corresponding to an information word in the parity test matrix, that is, a partial matrix including a 0-th column to a $(K_{ldpc}-1)$-th column and a $(N_{ldpc}-K_{ldpc})$-th row to a $(N_{ldpc}-K_{ldpc2}-1)$-th row conforms to the following rule. First, $K_{ldpc}$ columns corresponding to an information word in the parity test matrix belong to the same group on M basis, and are divided into $$\frac{K_{ldpc}}{M}$$

column groups in total. Columns belonging to the same column group have a relation mutually shifted by $Q_{ldpc2}$.

That is, the fourth partial matrix 640 has a form similar to that of the first partial matrix 610, and an M value meaning the number of columns forming a column group of the first partial matrix 610 and the fourth partial matrix 640 is the same. M is an interval in which a pattern of a column is iterated in the first partial matrix 610 and the fourth partial matrix 640 corresponding to an information word, and $Q_{ldpc1}$ is the size by which each column is shifted in the first partial matrix 610. An integer M and a value of $Q_{ldpc1}$ meet a relation of $$Q_{ldpc1} = \frac{N_{ldpc} - K_{ldpc}}{M}.$$

Also, $Q_{ldpc2}$ is the size by which each column is shifted in the fourth partial matrix 640. An integer M and a value of $Q_{ldpc2}$ meet a relation of $$Q_{ldpc2} = \frac{N_{ldpc2} - K_{ldpc}}{M}.$$

At this point, $$\frac{K_{ldpc}}{M}$$

is also an integer. Specific values of M, $Q_{ldpc1}$, $Q_{ldpc2}$ may change based on a codeword length and an encoding rate.

Though the parity test matrix has been described with reference to FIGS. 6A and 6B, the parity test matrix of FIGS. 6A and 6B is an example of a parity test matrix to which the present invention is applicable, and the scope of the present invention is not limited thereto.

As described above, a structure of the first partial matrix 610 corresponding to an information word in the parity test matrix, that is, a partial matrix including a 0-th column to a $(K_{ldpc}-1)$-th column, and a 0-th row to a $(N_{ldpc}-K_{ldpc}-1)$-th row conforms to the following rule. First, $K_{ldpc}$ columns corresponding to an information word in the parity test matrix belong to the same group on an M basis, and are divided into $$\frac{K_{ldpc}}{M}$$

column groups in total. Columns belonging to the same column group have a relation mutually shifted by $Q_{ldpc}$. Second, assuming a degree of a 0-th column of an i-th $$\left(i = 0, 1, \ldots, \frac{K_{ldpc}}{M}\right)$$

column group is $D_i^{(1)}$, and positions of respective rows where 1 exists are $R_{i,0}^{(1,0)}, R_{i,0}^{(1,1)}, \ldots, R_{i,0}^{(1,D_i-1)}$, an index $R_{i,j}^{(k)}$ of a row where weight-1 is positioned in a j-th column within an i-th column group may be determined by Equation (16) below.

$$R_{i,j}^{(1,k)} = \{R_{i,0}^{(1,k)} + (j \bmod M) \times Q_{ldpc1}\} \bmod (N_{ldpc} - K_{ldpc}) \quad (16)$$

$$(k = 0, 1, 2, \ldots, D_i - 1)\left(i = 0, 1, \ldots, \frac{K_{ldpc}}{M}\right)$$

$$(j = 1, 2, \ldots, M)$$

where $R_{i,j}^{(1,k)}$ is an index of a row where a k-th (weight-1) exists in a j-th column within an i-th column group, $R_{i,0}^{(1,k)}$ is an index of a row where a k-th (weight-1) exists in a 0-th column within an i-th column group, $N_{ldpc}$ is the length of a first LDPC codeword, $K_{ldpc}$ is the length of an information word, $D_i^1$ is a degree of columns belonging to an i-th column group, and M is the number of columns belonging to one column group. According to the above rules, all of the degrees of columns belonging to an i-th column group are the same as $D_i^1$.

As described above, a structure of a partial matrix including the fourth partial matrix 640 corresponding to an information word in the parity test matrix, that is, a partial matrix including a 0-th column to a $(K_{ldpc}-1)$-th column and a $(N_{ldpc}-K_{ldpc})$-th row to a $(N_{ldpc2}-K_{ldpc}-1)$-th row conforms to the following rule. First, $K_{ldpc}$ columns corresponding to an information word in the parity test matrix belong to the same group on M basis, with the same M value of the first partial matrix 610, and are divided into $$\frac{K_{ldpc}}{M}$$

column groups in total. Columns belonging to the same column group have a relation mutually shifted by $Q_{ldpc2}$. Second, assuming a degree of a 0-th column of an i-th $$\left(i = 0, 1, \ldots, \frac{K_{ldpc}}{M}\right)$$

column group is $D_i^2$, and positions of respective rows where 1 exists are $R_{i,0}^{(0)}, R_{i,0}^{(1)}, \ldots, R_{i,0}^{(D_i^2-1)}$, an index $R_{i,j}^{(k)}$ of a row where weight-1 is positioned in a j-th column within an i-th column group may be determined by Equation (17) below.

$$R_{i,j}^{(2,k)} = (N_{ldpc} - K_{ldpc}) + \{R_{i,0}^{(2,k)} - (N_{ldpc} - K_{ldpc}) + (j \bmod M) \times Q_{ldpc2}\} \bmod M_{IR}$$

$$(k = 0, 1, 2, \ldots, D_i^2 - 1)\left(i = 0, 1, \ldots, \frac{K_{ldpc}}{M}\right)(j = 1, 2, \ldots, M)$$

(17)

where $R_{i,j}^{(2,k)}$ is an index of a row where a k-th (weight-1) exists in a j-th column within an i-th column group in the fourth partial matrix 640, $R_{i,0}^{(2,k)}$ is an index of a row where a k-th (weight-1) exists in a 0-th column within an i-th column group in the fourth partial matrix 640, $N_{ldpc}$ is the length of a first LDPC codeword, $N_{ldpc2}$ is the length of a second LDPC codeword, $K_{ldpc}$ is the length of an information word, $D_i^2$ is a degree of columns belonging to an i-th column group, M is the number of columns belonging to one column group, and $M_{IR}$ is the number of second parity bits and is $N_{ldpc2}-N_{ldpc}$. According to the above-described rules, all of degrees of columns belonging to an i-th column group are the same as $D_i^2$.

According to the rules, an LDPC code storing information regarding the parity test matrix may be briefly described as below. As a specific example, in the case where $N_{ldpc}$ is 30, $N_{ldpc2}$ is 60, $K_{ldpc}$ is 15, and M is 5, and $$Q_{ldpc1} = \frac{N_{ldpc2} - K_{ldpc}}{M} = \frac{30-15}{5} = 3 \text{ and}$$

$$Q_{ldpc2} = \frac{N_{ldpc2} - N_{ldpc}}{M} = \frac{60-30}{5} = 6,$$

position information of a row where weight-1 is positioned in a 0-th column of three column groups of the first partial matrix 610 may be expressed as sequences of Equation (18). The sequences of Equation (18) may be denoted by 'weight-1 position sequence'.

$$R_{1,0}^{(1,1)}=1, R_{1,0}^{(1,2)}=2, R_{1,0}^{(1,1)}=8, R_{1,0}^{(1,2)}=10$$

$$R_{2,0}^{(1,1)}=0, R_{2,0}^{(1,2)}=9, R_{2,0}^{(1,2)}=13$$

$$R_{3,0}^{(1,1)}=0, R_{3,0}^{(1,1)}=14 \quad (18)$$

where $R_{i,0}^{k}$ is an index of a row where a k-th (weight-1) exists in a j-th column within an i-th column group.

Position information of a row where weight-1 is positioned in a 0-th column of three column groups of the fourth partial matrix 640 may be expressed as sequences of Equation (19). The sequences of Equation (19) may be denoted by 'weight-1 position sequence'.

$$R_{1,0}^{(2,1)}=17, R_{1,0}^{(2,2)}= \quad 19$$

$$R_{2,0}^{(2,1)}=18, R_{2,0}^{(2,2)}= \quad 25$$

$$R_{3,0}^{(2,1)}=30 \quad (19)$$

where $R_{i,0}^{k}$ is an index of a row where a k-th (weight-1) exists in a j-th column within an i-th column group.

The weight-1 position sequences as in Equation (19) representing an index of a row where 1 is positioned in a 0-th column of each column group may be expressed more briefly as in Table 4 below.

TABLE 4

| i | Index of row in which '1' is posotioned in $0^{th}$ column of $i^{th}$ column group |
|---|---|
| 0 | 1 2 8 10 17 19 |
| 1 | 0 9 13 18 25 |
| 2 | 0 14 30 |

Table 4 shows a position of an element having a weight-1, that is, a value of 1 in a parity test matrix. An i-th weight-1 position sequence is expressed as indexes of a row where weight-1 exists in a 0-th column belonging to an i-th column group. Information related to the position of 1 belonging to the fourth partial matrix 740 is expressible as an independent table. That is, as illustrated in Table 5 and FIG. 5B, an information word regarding weight-1 additionally required in an information word second parity test matrix for weight-1 with respect to the first parity test matrix is expressible separately.

TABLE 5

| i | Index of row in which '1' is posotioned in $0^{th}$ column of $i^{th}$ column group |
|---|---|
| 0 | 1 2 8 10 |
| 1 | 0 9 13 |
| 2 | 0 14 |

TABLE 6

| i | Index of row in which '1' is posotioned in $0^{th}$ column of $i^{th}$ column group |
|---|---|
| 0 | 17 19 |
| 1 | 18 25 |
| 2 | 30 |

With respect to the length $N_{ldpc}$ of a first LDPC codeword having the parity test matrix illustrated in FIGS. 6A and 6B, the length $N_{ldpc}$ of a second LDPC codeword, $R_1$ of the first LDPC codeword, $R_2$ of the second LDPC codeword, and a coding rate R, the length $K_{ldpc}$ of LDPC information bits and the above-described variables M, $Q_{ldpc1}$, $Q_{ldpc2}$ may be determined as in Table 7 below.

TABLE 7

| $N_{ldpc}$ | $N_{ldpc2}$ | $R_1$ | $R_2$ | $K_{ldpc}$ | M | $Q_{ldpc1}$ | $Q_{ldpc2}$ |
|---|---|---|---|---|---|---|---|
| 4320 | 8640 | ½ | ¼ | 2160 | 72 | 30 | 60 |

An embodiment representing the position of weight-1 of a parity test matrix may be expressed as in Table 8 below by using the parity test matrix having the parameters of Table 7 and having the structure illustrated in FIGS. 6A and 6B, and expressing a row index of weight-1 in a 0-th column of each column group as described above. In expressing a parity test matrix, an index of a column group marked by 'i' in Table 8 may be excluded generally.

TABLE 8

Index of row in which '1' is posotioned in $0^{th}$ column
i of $i^{th}$ column group

| | |
|---|---|
| 0 | 142 150 213 247 507 538 578 828 969 1042 1107 1315 1509 1584 1612 1781 1934 2106 2117 2536 2748 3073 6181 6186 6192 |
| 1 | 3 17 20 31 97 466 571 580 842 983 1152 1226 1261 1392 1413 1465 1480 2047 2125 2374 2523 2813 4797 4898 5332 |
| 2 | 49 169 258 548 582 839 873 881 931 995 1145 1209 1639 1654 1776 1826 1865 1906 1956 2997 4265 4843 6118 6130 6381 |
| 3 | 148 393 396 486 568 806 909 965 1203 1256 1306 1371 1402 1534 1664 1736 1844 1947 2055 2247 3337 3419 3602 4638 5528 |
| 4 | 185 191 263 290 384 769 981 1071 1202 1357 1554 1723 1769 1815 1842 1880 1910 1926 1991 2518 2984 4098 4307 4373 4953 |
| 5 | 424 444 923 1679 2416 2673 3127 3151 3243 3538 3820 3896 4072 4183 4256 4425 4643 4834 4882 5421 5750 5900 5929 6029 6030 |
| 6 | 91 436 535 978 2573 2789 2847 3356 3868 3922 3943 4085 4228 4357 4712 4777 4852 5140 5313 5381 5744 5931 6101 6250 6384 |
| 7 | 362 677 821 1695 2375 2622 2631 2782 2815 2827 2897 3031 3034 3314 3351 3369 3560 3857 4784 5283 5295 5471 5552 5995 6280 |
| 8 | 1117 1392 1454 2030 2667 2826 2877 2898 3504 3611 3765 4079 4100 4159 4362 4385 4442 4651 4779 5395 5446 5450 5472 5730 6311 |
| 9 | 35 840 1477 2152 3977 6205 6455 |
| 10 | 1061 1202 1836 1879 2239 5659 5940 |
| 11 | 242 286 1140 1538 3869 4260 4336 |

TABLE 8-continued

Index of row in which '1' is posotioned in $0^{th}$ column
i of $i^{th}$ column group

| | |
|---|---|
| 12 | 111 240 481 760 2485 4509 5139 |
| 13 | 59 1268 1899 2144 5044 5228 5475 |
| 14 | 737 1299 1395 2072 2664 3406 6395 |
| 15 | 34 288 810 1903 3266 5954 6059 |
| 16 | 232 1013 1365 1729 2952 4298 4860 |
| 17 | 410 783 1066 1187 3014 4134 6105 |
| 18 | 113 885 1423 1560 2761 3587 5468 |
| 19 | 760 909 1475 2048 4046 4329 4854 |
| 20 | 68 254 420 1867 2210 2293 2922 |
| 21 | 283 325 334 970 5308 5953 6201 |
| 22 | 168 321 479 554 2676 4106 4658 |
| 23 | 378 836 1913 1928 2587 2626 4239 |

TABLE 8-continued

Index of row in which '1' is posotioned in $0^{th}$ column
i of $i^{th}$ column group

| | |
|---|---|
| 24 | 101 238 964 1393 2346 3516 3923 |
| 25 | 304 460 1497 1588 2295 5785 6332 |
| 26 | 151 192 1075 1614 2464 5394 5987 |
| 27 | 297 313 677 1303 3090 3288 3829 |
| 28 | 329 447 1348 1832 4236 4741 4848 |
| 29 | 582 831 984 1900 4129 4230 5783 |

Numbers represented in Table 8 include numbers expressing the position of weight-1 of the parity test matrix of the structure illustrated in FIG. 1, represented in Table 2. As described above, Table 8 may also express information of weight-1 regarding a first parity test matrix and information of weight-1 regarding a second parity test matrix, separately.

Hereinafter, the present invention describes an encoding process based on the parity test matrix of the form illustrated in FIGS. 6A and 6B. Hereinafter, for convenience in description, the present invention makes description on an assumption of a case of expressing information regarding the parity test matrix of the form illustrated in FIGS. 6A and 6B and an index of a row where weight-1 exists in a 0-th column of each column group as in Table 8. That is, the number $K_{ldpc}$ of information bits of an LDPC code is 2160, the number $N_{ldpc}$ of first LDPC codeword bits is 4320, the number $N_{ldpc2}$ of second LDPC codeword bits is 8640, M is 72, $Q_{ldpc1}$ is 30, $Q_{ldpc2}$ is 60, a first LDPC encoding rate $R_1$ is ½, a second LDPC encoding rate $R_2$ is ¼, the number of first parity bits is $N_{ldpc}-K_{ldpc}$ (=2160), the number $M_{IR}$ of second parity bits is $N_{ldpc2}-N_{ldpc}$=4320, and sum of the number of the first parity bits and the number of the second parity bits is 6480. However, an encoding process described below is also applicable to other encoding rates, other codeword lengths, and other parity test matrixes. The 'first parity bits' may be denoted by a 'first parity part'. The 'second parity bits' may be denoted by a 'second parity part'.

A codeword may be expressed by Equation (20).

$$\Lambda = [\lambda_0, \lambda_1, \lambda_2, \ldots, \lambda_{N_{ldpc2}-1}] \quad (20)$$
$$= [i_0, i_1, \ldots, i_{K_{ldpc}-1}, p_0, p_1, \ldots, p_{N_{ldpc2}-K_{ldpc}-1}]$$
$$= [i_0, i_1, \ldots, i_{K_{ldpc}-1}, p_0^1, p_1^1, \ldots, p_{N_{ldpc}-K_{ldpc}-1}^1, p_0^2, p_1^2, \ldots, p_{N_{ldpc2}-N_{ldpc}-1}^2]$$

In Equation (20), parity bits $[p_0, p_1, \ldots, p_{N_{ldpc}}-1]$ consist of 'first parity bits' $[p_0, p_1, \ldots, p_{N_{ldpc}-K_{ldpc}-1}]=[p_0^1, p_1^1, \ldots, p_{N_{ldpc}-K_{ldpc}-1}^1]$ and 'second parity bits'$[p_0^2, p_1^2, \ldots, p_0^2, p_1^2, \ldots, p_{N_{ldpc2}-N_{ldpc}-1}^2]$. The 'second parity bits' may be denoted by 'Incremental Redundancy (IR) parity bits'. $\lambda_i$ is an i-th codeword bit, $i_i$ is an i-th information bit, $p_i$ is an i-th parity bit, $p_i^1$ is an i-th first parity bit, and $p_i^2$ is an i-th second parity bit. The 'first parity bits' are obtained by performing encoding based on only the first parity test matrix. That is, in case of intending to obtain a codeword whose encoding rate is relatively high, an encoder may generate the first parity bits to generate a first LDPC codeword by using only the first parity test matrix. In contrast, in case of intending to obtain a codeword whose encoding rate is low, an encoder may generate the first parity bit to the second parity bit to generate a second LDPC codeword by using the second parity test matrix. A process for generating the first parity bits based on only the first parity test matrix has been described above.

Hereinafter, the present invention describes a process for receiving information bits $[i_0, i_1, \ldots, i_{K_{ldpc}-1}]$ to generate parity bits $[p_0, p_1, \ldots, p_{N_{ldpc2}-K_{ldpc}-1}]$ including 'first parity bits' and 'second parity bits'.

In step 1, an encoder initializes all parity bits to 0 as in Equation (21) below.

$$p_0 = p_1 = \ldots = p_{N_{ldpc2}-K_{ldpc}-1} = 0 \quad (21)$$

where $p_i$ is an i-th parity bit, $K_{ldpc}$ is the number of LDPC information bits, and $N_{ldpc2}$ is the number of second LDPC codeword bits.

In step 2, the encoder accumulates a 0-th information bit $i_0$ on a parity bit address represented on a 0-th row of Table 7. In other words, the encoder performs an operation of Equation (22) below.

$$
\begin{aligned}
p_{142} &= p_{142} \oplus i_0 & p_{1107} &= p_{1107} \oplus i_0 & p_{2536} &= p_{2536} \oplus i_0 \\
p_{150} &= p_{150} \oplus i_0 & p_{1315} &= p_{1315} \oplus i_0 & p_{2748} &= p_{2748} \oplus i_0 \\
p_{213} &= p_{213} \oplus i_0 & p_{1509} &= p_{1584} \oplus i_0 & p_{3073} &= p_{3073} \oplus i_0 \\
p_{247} &= p_{247} \oplus i_0 & p_{1584} &= p_{1584} \oplus i_0 & p_{6181} &= p_{6181} \oplus i_0 \\
p_{507} &= p_{507} \oplus i_0 & p_{1612} &= p_{1612} \oplus i_0 & p_{6186} &= p_{6186} \oplus i_0 \\
p_{538} &= p_{538} \oplus i_0 & p_{1781} &= p_{1781} \oplus i_0 & p_{6192} &= p_{6192} \oplus i_0 \\
p_{578} &= p_{578} \oplus i_0 & p_{1934} &= p_{1934} \oplus i_0 & & \\
p_{828} &= p_{828} \oplus i_0 & p_{2106} &= p_{2106} \oplus i_0 & & \\
p_{969} &= p_{969} \oplus i_0 & p_{2117} &= p_{2117} \oplus i_0 & & \\
p_{1042} &= p_{1042} \oplus i_0 & & & &
\end{aligned}
\quad (22)
$$

where $i_0$ is a 0-th information bit, $p_i$ is an i-th parity bit, and $\oplus$ means a binary operation. According to the binary operation, $1\oplus1$ is 0, $1\oplus0$ is 1, $0\oplus1$ is 1, and $0\oplus0$ is 0. As shown in Equation (22), a first parity address to a 19-th parity address are the same as those shown in Equation (4).

In step 3, with respect to the rest of $M-1(=7)$ information bits $i_m$ (m=1, 2, ..., 71), the encoder accumulates a 0-th information bit $i_m$ on a parity bit address. At this point, the parity bit address may be determined as in Equation (23) or Equation (24) below.

$$\{x+(m \bmod 72) \times Q_{ldpc}\} \bmod (N_{ldpc}-K_{ldpc}) \text{ if } x < N_{ldpc} - K_{ldpc} \quad (23)$$

where x is an address value of a parity bit accumulator related to an information bit, $Q_{ldpc1}$ is a size by which each column is shifted in a first partial matrix of a parity test matrix, $N_{ldpc}$ is the length of a first LDPC codeword, and $K_{ldpc}$ is the length of LDPC information bits.

$$N_{ldpc}-K_{ldpc}+\{x-(N_{ldpc}-K_{ldpc})+(m \bmod 72)\times Q_{ldpc2}\} \bmod M_{IR} \text{ if } x \geq N_{ldpc}-K_{ldpc} \quad (24)$$

where $N_{ldpc}$ is the length of a first LDPC codeword, and $K_{ldpc}$ is the length of LDPC information bits, x is an address value of a parity bit accumulator related to an information bit, and $Q_{ldpc2}$ is a size by which each column is shifted in an information word part dedicated for a second parity test matrix, and $M_{IR}$ is the number of second parity bits and is ($N_{ldpc2} - N_{ldpc}$). Here, $M_{IR}$ may be 4320, $N_{ldpc}$ may be 4320, $Q_{ldpc1}$ may be 30, and $Q_{ldpc2}$ may be 60.

In Equation (23) and Equation (24), x is an address value of a parity bit accumulator related to an information bit $i_m$, and is the same as a 0-th row of Table 8. That is, x is {142, 152, ..., 6181, 6186, 6192}. Also, Equation (20) is derivable from Equation (15) and Equation (16) representing the position of 1 of the parity test matrix. Also, $M, Q_{ldpc1}, Q_{ldpc2}$ are different constant values based on an encoding rate. An encoding rate R1 is ½, R2 is ¼, and the parity test matrix of the form illustrated in FIGS. 6A and 6B is used, and in the case where the position information of 1 of each column group is the same as in Table 8, M is 72, $Q_{ldpc1}$ is 30, and $Q_{ldpc2}$ is 60.

In step 4, with respect to each group of 72 information bits, a new row of address tables is used for determining an address of a parity bit.

In step 5, after the above process is performed on all information bits, last parity bits are determined as below. An operation of Equation (25) is performed. At this point, i is initialized to 1.

$$p_i = p_i \oplus p_{i-1}, i=1,2,\ldots,N_{ldpc2}-K_{ldpc}-1 \quad (25)$$

where $p_i$ is an i-th parity bit, $N_{ldpc2}$ is the length of a second LDPC codeword, $K_{ldpc}$ is the length of LDPC information bits, and $\oplus$ means a binary operation. According to the binary operation, $1\oplus1$ is 0, $1\oplus0$ is 1, $0\oplus1$ is 1, and $0\oplus0$ is 0.

The encoder determines final values of $p_i$ (i=0, 1, 2, ..., $N_{ldpc2}-K_{ldpc}-1$) as parity bits.

As described above, a column of a parity test matrix related to $i_0$ is a first column of a first column group in the parity test matrix of the structure illustrated in FIG. 6. Therefore, in step 2, a parity bit address value related to $i_0$ is the same as an index of a 0-th row of Table 8, and also is the same as a position value of a row where 1 is positioned in a 0-th column of a 0-th column group. Also, in step 3, the position of a row where 1 of other columns belonging to a 0-th column group is positioned may be expressed as in Equation (16) and Equation (17). Also, the position of the row may be expressed as in Equation (23) and Equation (24), so that a parity bit address value may be expressed. That is, Table 8 representing the position of weight-1 of a parity test matrix may be used as the parity bit address value during an encoding process.

As described above, encoding may be performed based on the parity test matrix of the form illustrated in FIGS. 6A and 6B. As described above, the parity test matrix illustrated in FIGS. 6A and 6B is divided into an information word part and a parity part (both a first parity part and a second parity part included), the information word part may consist of a plurality of column groups, and information where weight-1 of an information word part of a parity test matrix exists may be expressed based on an index value of a row where weight-1 of a 0-th column of each column group exists. Also, a parity bit address is expressed based on an index value of a row where weight-1 of a 0-th column of each column group exists and used during an encoding process. Also, in the case where only the first parity bits are required, encoding may be performed based on only a first parity test matrix portion in the parity test matrix having the structure of FIG. 1 or the parity test matrix of FIGS. 6A and 6B, and in the case where both a first parity bit and a second parity bit are required, encoding may be performed based on the second parity test matrix of FIGS. 6A and 6B. A process for performing encoding based on only the first parity test matrix portion and a process for performing encoding based on only the second parity test matrix portion are the same as not performing encoding on a parity bit address greater than $N_{ldpc}-K_{ldpc}$ during the encoding process, and not performing the process of Equation (24).

Shortening and puncturing when encoding is performed based on the parity test matrix of the form illustrated in FIGS. 6A and 6B are described below with reference to FIG. 2.

In the case where the length $K_l$ of information bits input to the zero padding unit 204 is 5, the length $K_{bch}$ of an input bit string of the BCH encoder 206 is 8, the length $K_{ldpc}$ of an input bit string of the LDPC encoder 208 is 10, the length $N_{ldpc}$ of an output bit string of the LDPC encoder 208 is 20, and $N_{ldpc}$, is 40, the number $(K_{bch}-K_l)$ of shortened bits is 3 (=8-5). At this point, assuming that a shortening pattern is defined as {7,1,4,6,2,8,3,5,0,9}, a puncture pattern of a first parity bit is defined as {1,4,8,6,3,0,2,5,7,9}, a puncture pattern of a second parity bit is defined as {0,2,4,6,8,10,12,14,16,18,1,3,5,7, 9,11,13,15,17,19}, and the number of puncture bits is 24, the shortening and the puncturing are performed as below.

An output bit string of the BCH encoder 206 of FIG. 2 is the same as described above. An output bit string $C_{ldpc}$ of the LDPC encoder 208 with respect to an input bit string $[i_0,i_1, i_2,i_3,i_4,i_5,i_6,i_7,i_8,i_9]$ of the LDPC encoder 208 is given by Equation (26) below.

$$C_{ldpc2} = [c_0, c_0, \ldots, c_{39}] \qquad (26)$$
$$= [i_0, i_1, i_2, i_3, i_4, i_5, i_6, i_7, i_8, i_9, p_0, p_1, \ldots, p_9, p_{10}, p_{11}, \ldots, p_{29}]$$
$$= [i_0, i_1, i_2, i_3, i_4, i_5, i_6, i_7, i_8, i_9, p_0^1, p_1^1, \ldots, p_9^1, p_0^2, p_1^2, \ldots p_{19}^2]$$
$$= [s_0, 0, s_1, s_2, 0, s_3, s_4, 0, p_{bch,0}, p_{bch,1}, p_0^1, p_1^1, \ldots, p_9^1, p_0^2, p_1^2, \ldots p_{19}^2]$$

where $C_{ldpc2}$ is a second LDPC codeword, $c_j$ is a j-th bit of a second LDPC codeword, $i_j$ is a j-th bit of a BCH codeword, $s_j$ is a j-th bit of information bits, $p_{bch,j}$ is a j-th parity bit of a BCH codeword, $p_j^1$ is a j-th first parity bit of an LDPC codeword, and $p_j^2$ is a j-th second parity bit of an LDPC codeword.

The output bit column $C_{ldpc2}$ is input to the puncture unit 210, padded bits are removed by the zero padding unit 204, and 24 parity bits are punctured according to a puncture pattern. At this point, a first puncture pattern is applied to a first parity, and a second puncture pattern is applied to a second parity. Also, second parity bits are punctured with priority and then first parity bits are punctured. That is, since the number of puncture bits have been assumed to be 24, all of 20 second parity bits are punctured. Since four preceding values within the first puncture pattern are 1,4,8,6, an output bit string is given by Equation (27) below.

$$[s_0,s_1,s_2,s_3,s_4,p_{bch,0},p_{bch,1},p_0^1,p_2^1,p_3^1,p_5^1,p_7^1,p_9^1] \qquad (27)$$

where $s_j$ is a j-th bit of information bits, $p_{bch,j}$ is a j-th parity bit of a BCH codeword, and $p_j^1$ is a j-th first parity bit of an LDPC codeword.

Particularly, in case of performing LDPC encoding based on a parity test matrix of the structure illustrated in FIGS. 6A and 6B, a sequence of shortened and punctured bits may be determined on an information bit group basis. That is, the present invention divides information bits and parity bits forming a codeword into a plurality of information bit groups including a predetermined number of bits, and determines a sequence of shortened and punctured groups with respect to the information bit groups to the parity bit groups, and then shortens and punctures bits by the required number based on a shortening pattern and a puncture pattern determined on the group basis. Also, the present invention discriminates the first parity bits and the second parity bits to determine a puncture pattern, and punctures the second parity bits with priority when performing puncturing.

Next, a puncturing sequence for a parity bit is determined as below.

Figure 7A:
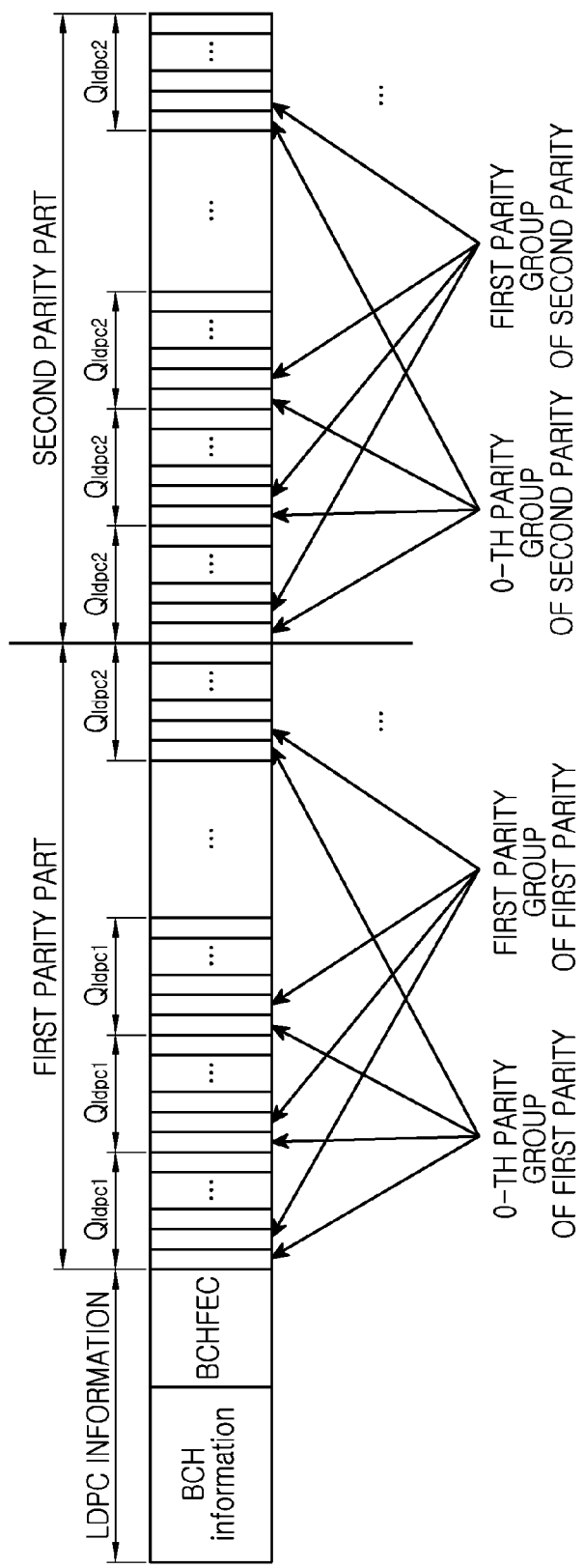
FIGS. 7A and 7B are views illustrating grouping of parity bits in a communication/broadcasting system according to another embodiment of the present invention.
Figure 7B:
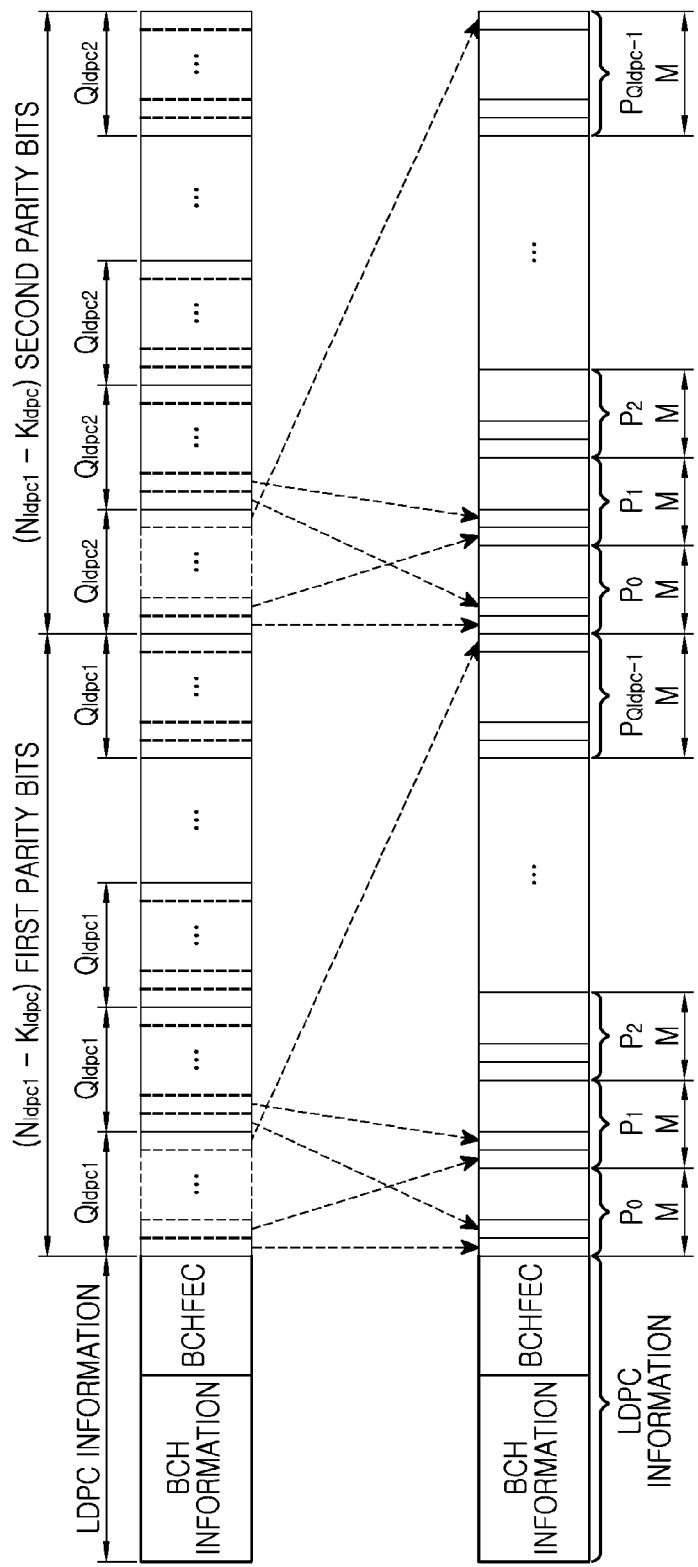

FIGS. 7A and 7B illustrate grouping of parity bits in a communication/broadcasting system according to another embodiment of the present invention. Particularly, FIGS. 7A and 7B illustrate a case of using a parity test matrix having the structure of the parity test matrix of FIG. 6.

As illustrated in FIG. 7A, parity bits $[p_0, p_1, \ldots, p_{N_{ldpc2}-K_{ldpc}-1}]$ of an LDPC code include 'first parity bits' $[p_0^1, p_1^1, \ldots, p_{N_{ldpc}-K_{ldpc}-1}^1]$ and 'second parity bits' $[p_0^2, p_1^2, \ldots, p_{N_{ldpc2}-K_{ldpc}-1}^2]$. The 'first parity bits' or the 'first parity part' $[p_0^1, p_1^1, \ldots, p_{N_{ldpc}-K_{ldpc}-1}^1]$ is divided into $Q_{ldpc1}$ parity bit groups consisting of M bits. Here, $Q_{ldpc1}$ is the same as a value obtained by dividing the number $(N_{parity}=N_{ldpc}-K_{ldpc})$ of first parity bits by M. Respective first parity groups or parity bit groups of a 'first parity part' may be defined by Equation (28).

$$P_j^1 = \{p_k^1 | (k \bmod Q_{ldpc1})=j, 0 \le k < N_{ldpc}-K_{ldpc}\} \text{ for } 0 \le j < Q_{ldpc1} \qquad (28)$$

where $P_j^1$ is a j-th first parity bit group or a j-th parity bit group in a first parity part, $p_k^1$ is a k-th first parity bit, $Q_{ldpc1}$ is the number of first parity bit groups, $N_{ldpc}$ is the length of a first LDPC codeword, and $K_{ldpc}$ is the length of LDPC information bits. That is, the size of a first parity bit group meaning the number of bits of each first parity bit group is M, and the number of first parity bit groups is $Q_{ldpc1}$.

The 'second parity bits' $[p_0^2, p_1^2, \ldots, p_{N_{ldpc2}-N_{ldpc}-1}^2]$ are divided to $Q_{ldpc2}$ second parity bit groups consisting of M bits or parity bit groups of a 'second parity part'. Here, $Q_{ldpc2}$ is the same as a value obtained by dividing the number $(N_{IR}=N_{ldpc2}-K_{ldpc})$ of parity bits by M. Respective second parity bit groups may be defined by Equation (29).

$$P_j^2 = \{p_k^2 | (k \bmod Q_{ldpc2})=j, 0 \le k < N_{ldpc2}-K_{ldpc}\} \text{ for } 0 \le j < Q_{ldpc2} \qquad (29)$$

where $P_j^2$ is a j-th second parity bit group or a j-th parity bit group in a second parity part, $p_k^2$ is a k-th second parity bit, $Q_{ldpc2}$ is the number of second parity bit groups, $N_{ldpc2}$ is the length of a second LDPC codeword, and $K_{ldpc}$ is the length of LDPC information bits. That is, the size of a second parity bit group meaning the number of bits of each second parity bit group is M, and the number of second parity bit groups is $Q_{ldpc2}$.

As illustrated in FIG. 7B, when 'first parity bits' are converted according to Equation (30) below, first parity bit groups defined by Equation (31) may be configured. Equation (30) causes an interleaving effect of parity bits.

$$d_{m \cdot t+s}^1 = p_{Q_{ldpc1} \cdot s+t}^1 \text{ for } 0 \le s < M, 0 \le t < Q_{ldpc1} \qquad (30)$$

where $d_j^1$ is a j-th first parity bit after conversion, $p_j^1$ is a j-th first parity bit before conversion, and $Q_{ldpc1}$ is the number of first parity bit groups.

$$P_j^1 = \left\{ d_k^1 \mid l = \left\lfloor \frac{k}{M} \right\rfloor, 0 \le k < N_{ldpc} - K_{ldpc} \right\} \qquad (31)$$
$$\text{for } 0 \le j < Q_{ldpc1}$$

where $p_j^1$ is a j-th first parity bit group, $d_k^1$ is a k-th first parity bit after conversion, M is the number of columns included in one column group of the parity test matrix of the form illustrated in FIG. 6B, $N_{ldpc}$ is the length of a first LDPC codeword, and $K_{ldpc}$ is the length of LDPC information bits. That is, the size of each first parity bit group is M, and the number of first parity bit groups is $Q_{ldpc1}$.

As illustrated in FIG. 7B, when 'second parity bits' are converted according to Equation (32) below, second parity bit groups defined by Equation (33) may be configured. Equation (32) causes an interleaving effect of parity bits.

$$d_{m \cdot t+s}{}^2 = p_{Q_{ldpc2} \cdot s+t}{}^2 \text{ for } 0 \le s < M, \ 0 \le t < Q_{ldpc2} \quad (32)$$

where $d_j^2$ is a j-th second parity bit after conversion, $p_1^2$ is a j-th second parity bit before conversion, and $Q_{ldpc2}$ is the number of second parity bit groups.

$$P_j^2 = \left\{ d_k^2 \mid l = \left\lfloor \frac{k}{M} \right\rfloor, \ 0 \le k < N_{ldpc2} - K_{ldpc} \right\} \quad (33)$$

for $0 \le j < Q_{ldpc2}$ where $p_j^2$ is a j-th second parity bit group, $d_k^2$ is a k-th second parity bit after conversion, M is the number of columns included in one column group of the parity test matrix of the form illustrated in FIG. 6B, $N_{ldpc2}$ is the length of a second LDPC codeword, and $N_{ldpc}$ is the length of a first LDPC codeword. That is, the size of each second parity bit group is M and the number of second parity bit groups is $Q_{ldpc2}$.

In the above, parity bits $[p_0, p_1, \ldots, p_{N_{ldpc2}-K_{ldpc}-1}]$ have been divided into 'first parity bits' $[p_0^1, p_1^1, \ldots, p_{N_{ldpc}-K_{ldpc}-1}^1]$ and 'second parity bits' $[p_0^2, p_1^2, \ldots, p_{N_{ldpc2}-K_{ldpc}-1}^2]$. However, in the case where the parity bits are not divided into the first parity bits and the second parity bits, the parity bits may be expressed as parity bit groups as in Equation (34) below.

$$P_j^1 = \{p_k^1 \mid (k \bmod Q_{ldpc1}) = j, \ 0 \le k < N_{ldpc} - K_{ldpc}\} \text{ for } 0 \le j < Q_{ldpc1}$$

$$P_{Q_{ldpc1}+j} = \{p_k \mid (k \bmod Q_{ldpc2}) = j, \ N_{ldpc} - K_{ldpc} \le k < N_{ldpc2} - K_{ldpc}\} \text{ for } 0 \le j < Q_{ldpc2} \quad (34)$$

where $P_j^1$ is a j-th first parity bit group, $p_k^1$ is a k-th parity bit, sum of $Q_{ldpc2}$ is the number of parity bit groups and is $(N_{ldpc2}-K_{ldpc})/M$, $Q_{ldpc1}$ is the number of first parity bit groups, $Q_{ldpc2}$ is the number of second parity bit groups, $N_{ldpc2}$ is the length of a second LDPC codeword, $N_{ldpc}$ is the length of a first LDPC codeword, and $K_{ldpc}$ is the length of LDPC information bits. That is, the size of a parity bit group meaning the number of bits of each parity bit group is M, and the number of parity bit groups is $Q_{ldpc1}+Q_{ldpc2}$.

As illustrated in FIG. 7B, when 'parity bits' are converted according to Equation (35), parity bit groups defined by Equation (36) may be configured. Equation (35) causes an interleaving effect of parity bits.

$$d_{M \cdot t+s} = p_{Q_{ldpc1} \cdot s+t} \text{ for } 0 \le s < M, \ 0 \le t < Q_{ldpc1}$$

$$d_{(N_{ldpc}-K_{ldpc})+M \cdot t+s} = p_{(N_{ldpc}-K_{ldpc})+Q_{ldpc2} \cdot s+t} \text{ for } 0 \le s < M, \ 0 \le t < Q_{ldpc2} \quad (35)$$

where $d_j$ is a j-th parity bit after conversion, $p_j$ is a j-th parity bit before conversion, M is the number of bits of a parity bit group, $Q_{ldpc1}$ is the number of first parity bit groups, and $Q_{ldpc2}$ is the number of second parity bit groups.

$$P_j = \left\{ d_k \mid j = \left\lfloor \frac{k}{M} \right\rfloor, \ 0 \le k < N_{ldpc2} - K_{ldpc} \right\} \quad (36)$$

for $0 \le j < Q_{ldpc1} + Q_{ldpc2}$ where $P_j$, is a j-th parity bit group, $d_k$ is a k-th parity bit after conversion, M is the size of a parity bit group, $N_{ldpc2}$ is the length of a second LDPC codeword, $K_{ldpc}$ is the length of LDPC information bits, and $Q_{ldpc1}+Q_{ldpc2}$ is the number of parity bit groups.

In Equations (28) and (31), parity bits forming a j-th first parity bit group $P_j^1$ are the same. In other words, parity bits forming each first parity bit group do not change. However, when the position of the first parity bits are converted according to Equation (30), successive bits based on bits $d_l^1$ after conversion are configured as one parity bit group, so that convenience in an aspect of processing increases. Also, in Equation (29) and Equation (33), parity bits forming a j-th second parity bit group $P_j^2$ are the same. In other words, the second parity bits forming each second parity bit group do not change. However, when the position of the second parity bits are converted according to Equation (32), successive bits based on bits $d_l^2$ after conversion are configured as one parity bit group, so that convenience in an aspect of processing increases. Also, in Equation (34) and Equation (36), parity bits forming a j-th parity bit group $P_j$ are the same. In other words, parity bits forming each parity bit group do not change. However, when the position of parity bits are converted according to Equation (35), successive bits based on bits $d_l$ after conversion are configured as one parity bit group, so that convenience in an aspect of processing increases.

Since bits within the same first parity bit group to second parity bit group have the same degree and the same cycle characteristic, when a puncture pattern is determined on a group basis, same performance as finding an optimized puncture pattern on a bit basis is guaranteed. Therefore, the present invention determines a puncture pattern on parity bit group basis.

A shortening pattern and a puncture pattern according to an embodiment of the present invention may be determined according to rules below.

[Rule 1] With respect to a code of a given length ($N_{ldpc}$, $K_{ldpc}$) or ($N_{ldpc}$, $N_{ldpc2}$, $K_{ldpc}$), in the case where the number of information bits is fixed and variable, different shortening patterns and puncture patterns are defined. In the case where the number of information bits is fixed, it is sufficient to determine an optimized shortening puncture bit pattern with respect to only one length. However, in the case where the number of information bits is variable, an optimized shortening pattern and an optimized puncture pattern are required with respect to a plurality of lengths.

[Rule 2] A shortening pattern and a puncture pattern changing based on a modulation scheme are defined.

[Rule 3] A different shortening pattern and a different puncture pattern changing based on a shortening and puncture ratio are defined. For example, a relation between the number of shortened bits and the number of punctured bits may be applicable as in Equation (37). In this case, the shortening and puncturing ratio is determined based on a constant A and a constant B.

$$N_{punc} = \lfloor A \cdot N_{short} - B \rfloor \quad (37)$$

where $N_{punc}$ is the number of puncture bits, $N_{short}$ is the number of shortening bits, A and B are constants determining the shortening and puncture ratio. A is a constant greater than 0 and means a ratio of the puncturing and shortening. That is, a value of A is related to an encoding rate. B may be a positive integer, a negative integer, or 0, and is a correction factor. The value A and the value B may change based on the number of input bits. It is obvious that the number $N_{punc}$ of actually punctured bits may be corrected from a value $N_{punc}$ obtained based on Equation (37) with consideration of a modulation scheme and a transmission scheme. For example, to make the number of actually transmitted codeword bits a multiple of a bit forming a modulation scheme, $N_{punc}$ obtained based on Equation (37) may be corrected.

According to Equation (37), the number $N_{punc}$ of puncture bits corresponding to a given number $N_{short}$ of shortening bits is determined based on A and B. Therefore, different puncture pattern and shortening pattern are defined based on A and B.

[Rule 4] The form of a parity test matrix having the structure of FIG. 6B has a basic premise of puncturing second parity bits first. Therefore, it is preferable to determine a puncture pattern for first parity bits based on a first parity test matrix first in the structure of FIG. 6B, and then determine a puncture pattern for second parity bits based on a second parity test matrix.

Hereinafter, the present invention describes in detail a process for determining a shortening pattern and a puncture pattern.

[Step 1] The present invention divides LDPC codeword bits into information bit groups including M bits and parity bit groups including M bits.

[Step 2] The present invention determines a shortened information bit group among a plurality of information bit groups. A shortened information bit group corresponds to a deleted column group among a parity test matrix. When an appropriate column group is deleted, an optimized encoding performance may be maintained. Therefore, a column group where a best encoding performance is maintained when a relevant column group is deleted is selected. Also, a shortening pattern that shortens an information bit group corresponding to the selected column group is defined. At this point, the form of the parity test matrix is based on the parity test matrix of FIG. 1 or the 'first parity test matrix' in the parity test matrix of FIG. 6B.

[Step 3] The present invention determines a puncture pattern with respect to first parity bits based on shortened bits or shortened bit groups. The present invention determines the number of puncture bits according to Equation (37) and selects a parity bit group to puncture as many as the number of parity bit groups corresponding to the number of puncture bits. That is, in the case where Z bit groups are shortened, since Z×M bits are shortened, $$Y = \left\lfloor \frac{Z \cdot M - B}{M} \right\rfloor$$

parity bit groups should be punctured. Accordingly, the present invention selects parity bit groups corresponding to Y column groups of a parity part that may guarantee excellent performance even when they are punctured in a parity test matrix, and defines a puncture pattern to puncture a parity bit group corresponding to selected column groups of a parity in the parity test matrix. Column groups of a parity part within the parity test matrix mean columns of a parity part corresponding to bits within parity bit groups. At this point, Y sub column groups are selected such that a row degree of the parity test matrix is constant. At this point, the form of the parity test matrix is based on the parity test matrix of FIG. 1 or the 'first parity test matrix' in the parity test matrix of FIG. 6B.

[Step 4] The present invention repeats step 2 and step 3 until all bit groups are selected.

[Step 5] A puncture pattern for second parity bits is determined based on the above obtained shortening pattern and a puncture pattern for the first parity bits.

A column group of a parity partial matrix of the parity test matrix means a group consisting of columns of a parity test matrix corresponding to bits within a parity bit group of FIGS. 5A and 5B, and FIGS. 7A and 7B.

Hereinafter, the present invention explains examples of the shortening pattern and the puncture pattern defined as described above for a plurality of parity test matrixes having the structure of FIG. 1.

According to an embodiment of the present invention, in case of using a BPSK or QPSK modulation scheme based on a parity test matrix where $N_{ldpc}$ is 4320, $R_1$ is ½, $R_2$ is ¼, and M is 72 as in Table 7, a shortening pattern may be defined by Table 9, a puncture pattern of first parity bits may be defined by Table 10, and a puncture pattern of second parity bits may be defined by Table 11.

TABLE 9

| | Order of information bits group to be shortened | | | | | | | |
|---|---|---|---|---|---|---|---|---|
| | $\pi_s(0)$ | $\pi_s(1)$ | $\pi_s(2)$ | $\pi_s(3)$ | $\pi_s(4)$ | $\pi_s(5)$ | $\pi_s(6)$ | $\pi_s(7)$ |
| | $\pi_s(8)$ | $\pi_s(9)$ | $\pi_s(10)$ | $\pi_s(11)$ | $\pi_s(12)$ | $\pi_s(13)$ | $\pi_s(14)$ | $\pi_p(15)$ |
| | $\pi_s(16)$ | $\pi_s(17)$ | $\pi_s(18)$ | $\pi_s(19)$ | $\pi_s(20)$ | $\pi_s(21)$ | $\pi_s(22)$ | $\pi_s(23)$ |
| | $\pi_s(24)$ | $\pi_s(25)$ | $\pi_s(26)$ | $\pi_s(27)$ | $\pi_s(28)$ | $\pi_s(29)$ | | |
| $R_1 = ½$, | 5 | 6 | 7 | 8 | 0 | 9 | 10 | 11 |
| $R_2 = ¼$ | 1 | 12 | 13 | 14 | 15 | 16 | 17 | 18 |
| BPSK/QPSK | 22 | 26 | 24 | 3 | 20 | 25 | 23 | 19 |
| | 4 | 21 | 27 | 28 | 2 | 29 | | |

$\pi_s(i)$ is an index of an information bit group shortened in an i-th sequence. That is, an index $\pi_s(0)$ of an information bit group shortened in a 0-th sequence is 5. $X_5$ which is a fifth information bit group among $X_i$ (0≤i<30) defined by Equation (12) is shortened in a 0-th sequence, in other words, first. The information bit group may be determined from Equation (12). When a specific value is input, Equation (12) may be expressed by Equation (38) below.

$$X_j = \left\{ m_k \mid j = \left\lfloor \frac{k}{72} \right\rfloor, 0 \le k < K_{bch} \right\} \quad (38)$$

$$\text{for } 0 \le j < N_{group}$$

where $X_j$ is a j-th information bit group, $m_k$ is a k-th information bit of a BCH codeword, $\lfloor x \rfloor$ is a maximum integer not exceeding x, for example, $\lfloor 2.3 \rfloor$ is 2, $K_{bch}$ is the length of a BCH codeword, and $N_{group}$ is the number of information bit groups. Here, $N_{group}$ is $$\left\lceil \frac{K_{bch}}{72} \right\rceil$$

and may change based on $N_{bch\ parity}$.

TABLE 10

Order of first parity bits group to be punctured

| | $\pi_p^1(0)$ | $\pi_p^1(1)$ | $\pi_p^1(2)$ | $\pi_p^1(3)$ | $\pi_p^1(4)$ | $\pi_p^1(5)$ | $\pi_p^1(6)$ | $\pi_p^1(7)$ |
| --- | --- | --- | --- | --- | --- | --- | --- | --- |
| | $\pi_p^1(8)$ | $\pi_p^1(9)$ | $\pi_p^1(10)$ | $\pi_p^1(11)$ | $\pi_p^1(12)$ | $\pi_p^1(13)$ | $\pi_p^1(14)$ | $\pi_p^1(15)$ |
| | $\pi_p^1(16)$ | $\pi_p^1(17)$ | $\pi_p^1(18)$ | $\pi_p^1(19)$ | $\pi_p^1(20)$ | $\pi_p^1(21)$ | $\pi_p^1(22)$ | $\pi_p^1(23)$ |
| | $\pi_p^1(24)$ | $\pi_p^1(25)$ | $\pi_p^1(26)$ | $\pi_p^1(27)$ | $\pi_p^1(28)$ | $\pi_p^1(29)$ | | |
| $R_1 = \frac{1}{2}$, | 1 | 22 | 7 | 16 | 24 | 18 | 0 | 14 |
| $R_2 = \frac{1}{4}$ | 11 | 3 | 26 | 15 | 9 | 21 | 20 | 23 |
| BPSK/QPSK | 13 | 27 | 5 | 17 | 2 | 8 | 19 | 28 |
| | 6 | 10 | 25 | 4 | 12 | 29 | | |

$\pi_p^1(i)$ is an index of a first parity bit group punctured in an i-th sequence. That is, an index $\pi_p^1(0)$ of a first parity bit group punctured in a 0-th sequence is 1. $P_1^1$ which is a first sequence first parity bit group among a parity bit group $P_i^1$ ($0 \leq i < 30$) expressed by Equation (28) or Equation (31) is punctured in a 0-th sequence, in other words, first. Here, the parity bit group may be determined by Equation (28) to Equation (31).

parity bits are used, in case of using a BPSK or QPSK modulation scheme based on a parity test matrix where $N_{ldpc}$ is 4320 and R is ½ as in Table 3 according to another embodiment of the present invention, or in case of performing encoding based on the first parity test matrix of Table 7, a shortening pattern may be defined by Table 9, and a puncture pattern of parity bits may be defined by Table 10.

TABLE 11

Order of second parity bits group to be punctured

| | $\pi_p^2(0)$ | $\pi_p^2(1)$ | $\pi_p^2(2)$ | $\pi_p^2(3)$ | $\pi_p^2(4)$ | $\pi_p^2(5)$ | $\pi_p^2(6)$ | $\pi_p^2(7)$ |
| --- | --- | --- | --- | --- | --- | --- | --- | --- |
| | $\pi_p^2(8)$ | $\pi_p^2(9)$ | $\pi_p^2(10)$ | $\pi_p^2(11)$ | $\pi_p^2(12)$ | $\pi_p^2(13)$ | $\pi_p^2(14)$ | $\pi_p^2(15)$ |
| | $\pi_p^2(16)$ | $\pi_p^2(17)$ | $\pi_p^2(18)$ | $\pi_p^2(19)$ | $\pi_p^2(20)$ | $\pi_p^2(21)$ | $\pi_p^2(22)$ | $\pi_p^2(23)$ |
| | $\pi_p^2(24)$ | $\pi_p^2(25)$ | $\pi_p^2(26)$ | $\pi_p^2(27)$ | $\pi_p^2(28)$ | $\pi_p^2(29)$ | $\pi_p^2(30)$ | $\pi_p^2(31)$ |
| | $\pi_p^2(32)$ | $\pi_p^2(33)$ | $\pi_p^2(34)$ | $\pi_p^2(35)$ | $\pi_p^2(36)$ | $\pi_p^2(37)$ | $\pi_p^2(38)$ | $\pi_p^2(39)$ |
| | $\pi_p^2(40)$ | $\pi_p^2(41)$ | $\pi_p^2(42)$ | $\pi_p^2(43)$ | $\pi_p^2(44)$ | $\pi_p^2(45)$ | $\pi_p^2(46)$ | $\pi_p^2(47)$ |
| | $\pi_p^2(48)$ | $\pi_p^2(49)$ | $\pi_p^2(50)$ | $\pi_p^2(51)$ | $\pi_p^2(52)$ | $\pi_p^2(53)$ | $\pi_p^2(54)$ | $\pi_p^2(55)$ |
| | $\pi_p^2(56)$ | $\pi_p^2(57)$ | $\pi_p^2(58)$ | $\pi_p^2(59)$ | | | | |
| $R_1 = \frac{1}{2}$, | 16 | 40 | 11 | 34 | 19 | 51 | 55 | 3 |
| $R_2 = \frac{1}{4}$ | 24 | 31 | 14 | 28 | 45 | 0 | 33 | 50 |
| BPSK/QPSK | 10 | 38 | 41 | 15 | 22 | 43 | 56 | 2 |
| | 20 | 5 | 36 | 53 | 4 | 26 | 8 | 12 |
| | 49 | 29 | 32 | 57 | 23 | 39 | 7 | 17 |
| | 44 | 47 | 58 | 1 | 37 | 21 | 30 | 9 |
| | 52 | 6 | 25 | 42 | 18 | 48 | 27 | 54 |
| | 13 | 46 | 35 | 59 | | | | |

$\pi_p^2(i)$ is an index of a second parity bit group punctured in an i-th sequence. That is, an index $\pi_p^2(0)$ of a second parity bit group punctured in a 0-th sequence is 16. $P_{16}^2$ which is a sixteenth sequence second parity bit group among a parity bit group $P_i^2$ ($0 \leq i < 60$) expressed by Equation (29) or Equation (33) is punctured in a 0-th sequence, in other words, first.

As described above, in case of performing encoding based on the structure of the parity test matrix of FIG. 1 or only the 'first parity test matrix' part of FIG. 6B, since only the first Also, as described above, in case of using the structure of the parity test matrix of FIG. 6B but not discriminating first parity bits and second parity bits as described above, a single puncture pattern of Table 12 including both Table 10 and Table 11, and by which a parity bit group is expressed according to Equation (34) or Equation (36), may be defined. According to Table 12, a puncture pattern is defined to puncture the second parity bits with priority, and to puncture the first parity bits after all of the second parity bits are punctured.

TABLE 12

Order of parity bits group to be punctured

| | $\pi_p(0)$ | $\pi_p(1)$ | $\pi_p(2)$ | $\pi_p(3)$ | $\pi_p(4)$ | $\pi_p(5)$ | $\pi_p(6)$ | $\pi_p(7)$ |
| --- | --- | --- | --- | --- | --- | --- | --- | --- |
| | $\pi_p(8)$ | $\pi_p(9)$ | $\pi_p(10)$ | $\pi_p(11)$ | $\pi_p(12)$ | $\pi_p(13)$ | $\pi_p(14)$ | $\pi_p(15)$ |
| | $\pi_p(16)$ | $\pi_p(17)$ | $\pi_p(18)$ | $\pi_p(19)$ | $\pi_p(20)$ | $\pi_p(21)$ | $\pi_p(22)$ | $\pi_p(23)$ |
| | $\pi_p(24)$ | $\pi_p(25)$ | $\pi_p(26)$ | $\pi_p(27)$ | $\pi_p(28)$ | $\pi_p(29)$ | $\pi_p(30)$ | $\pi_p(31)$ |
| | $\pi_p(32)$ | $\pi_p(33)$ | $\pi_p(34)$ | $\pi_p(35)$ | $\pi_p(36)$ | $\pi_p(37)$ | $\pi_p(38)$ | $\pi_p(39)$ |
| | $\pi_p(40)$ | $\pi_p(41)$ | $\pi_p(42)$ | $\pi_p(43)$ | $\pi_p(44)$ | $\pi_p(45)$ | $\pi_p(46)$ | $\pi_p(47)$ |
| | $\pi_p(48)$ | $\pi_p(49)$ | $\pi_p(50)$ | $\pi_p(51)$ | $\pi_p(52)$ | $\pi_p(53)$ | $\pi_p(54)$ | $\pi_p(55)$ |
| | $\pi_p(56)$ | $\pi_p(57)$ | $\pi_p(58)$ | $\pi_p(59)$ | $\pi_p(60)$ | $\pi_p(61)$ | $\pi_p(62)$ | $\pi_p(63)$ |
| | $\pi_p(64)$ | $\pi_p(65)$ | $\pi_p(66)$ | $\pi_p(67)$ | $\pi_p(68)$ | $\pi_p(69)$ | $\pi_p(70)$ | $\pi_p(71)$ |
| | $\pi_p(72)$ | $\pi_p(73)$ | $\pi_p(74)$ | $\pi_p(75)$ | $\pi_p(76)$ | $\pi_p(77)$ | $\pi_p(78)$ | $\pi_p(79)$ |
| | $\pi_p(80)$ | $\pi_p(81)$ | $\pi_p(82)$ | $\pi_p(83)$ | $\pi_p(84)$ | $\pi_p(85)$ | $\pi_p(86)$ | $\pi_p(87)$ |
| | $\pi_p(88)$ | $\pi_p(89)$ | | | | | | |
| 4320, $R_1 = \frac{1}{2}$, | 46 | 70 | 41 | 64 | 49 | 81 | 85 | 33 |
| $R_2 = \frac{1}{4}$ | 54 | 61 | 44 | 58 | 75 | 30 | 63 | 80 |
| BPSK/QPSK | 40 | 68 | 71 | 45 | 52 | 73 | 86 | 32 |

TABLE 12-continued

| | | | Order of parity bits group to be punctured | | | | |
|---|---|---|---|---|---|---|---|
| $\pi_p(0)$ | $\pi_p(1)$ | $\pi_p(2)$ | $\pi_p(3)$ | $\pi_p(4)$ | $\pi_p(5)$ | $\pi_p(6)$ | $\pi_p(7)$ |
| $\pi_p(8)$ | $\pi_p(9)$ | $\pi_p(10)$ | $\pi_p(11)$ | $\pi_p(12)$ | $\pi_p(13)$ | $\pi_p(14)$ | $\pi_p(15)$ |
| $\pi_p(16)$ | $\pi_p(17)$ | $\pi_p(18)$ | $\pi_p(19)$ | $\pi_p(20)$ | $\pi_p(21)$ | $\pi_p(22)$ | $\pi_p(23)$ |
| $\pi_p(24)$ | $\pi_p(25)$ | $\pi_p(26)$ | $\pi_p(27)$ | $\pi_p(28)$ | $\pi_p(29)$ | $\pi_p(30)$ | $\pi_p(31)$ |
| $\pi_p(32)$ | $\pi_p(33)$ | $\pi_p(34)$ | $\pi_p(35)$ | $\pi_p(36)$ | $\pi_p(37)$ | $\pi_p(38)$ | $\pi_p(39)$ |
| $\pi_p(40)$ | $\pi_p(41)$ | $\pi_p(42)$ | $\pi_p(43)$ | $\pi_p(44)$ | $\pi_p(45)$ | $\pi_p(46)$ | $\pi_p(47)$ |
| $\pi_p(48)$ | $\pi_p(49)$ | $\pi_p(50)$ | $\pi_p(51)$ | $\pi_p(52)$ | $\pi_p(53)$ | $\pi_p(54)$ | $\pi_p(55)$ |
| $\pi_p(56)$ | $\pi_p(57)$ | $\pi_p(58)$ | $\pi_p(59)$ | $\pi_p(60)$ | $\pi_p(61)$ | $\pi_p(62)$ | $\pi_p(63)$ |
| $\pi_p(64)$ | $\pi_p(65)$ | $\pi_p(66)$ | $\pi_p(67)$ | $\pi_p(68)$ | $\pi_p(69)$ | $\pi_p(70)$ | $\pi_p(71)$ |
| $\pi_p(72)$ | $\pi_p(73)$ | $\pi_p(74)$ | $\pi_p(75)$ | $\pi_p(76)$ | $\pi_p(77)$ | $\pi_p(78)$ | $\pi_p(79)$ |
| $\pi_p(80)$ | $\pi_p(81)$ | $\pi_p(82)$ | $\pi_p(83)$ | $\pi_p(84)$ | $\pi_p(85)$ | $\pi_p(86)$ | $\pi_p(87)$ |
| $\pi_p(88)$ | $\pi_p(89)$ | | | | | | |
| 50 | 35 | 66 | 83 | 34 | 56 | 38 | 42 |
| 79 | 59 | 62 | 87 | 53 | 69 | 37 | 47 |
| 74 | 77 | 88 | 31 | 67 | 51 | 60 | 39 |
| 82 | 36 | 55 | 72 | 48 | 78 | 57 | 84 |
| 43 | 76 | 65 | 89 | 1 | 22 | 7 | 16 |
| 24 | 18 | 0 | 14 | 11 | 3 | 26 | 15 |
| 9 | 21 | 20 | 23 | 13 | 27 | 5 | 17 |
| 2 | 8 | 19 | 28 | 6 | 10 | 25 | 4 |
| 12 | 29 | | | | | | |

According to another embodiment of the present invention, in case of using a BPSK or QPSK modulation scheme based on a parity test matrix where $N_{ldpc}$ is 4320, $R_1$ is ½, $R_2$ is ¼, and M is 72 as in Table 7, a shortening pattern may be defined by Table 13, a puncture pattern of first parity bits may be defined by Table 14, and a puncture pattern of second parity bits may be defined by Table 15. At this point, encoding may be performed based on an index value of Table 8.

TABLE 13

| | | Order of information bits group to be shortened $\pi_s(j)$ ($0 \le j < N_{group}$) | | | | | | | | | |
|---|---|---|---|---|---|---|---|---|---|---|---|
| Modulation and Code rate | $N_{group}$ | $\pi_s(0)$ $\pi_s(10)$ $\pi_s(20)$ | $\pi_s(1)$ $\pi_s(11)$ $\pi_s(21)$ | $\pi_s(2)$ $\pi_s(12)$ $\pi_s(22)$ | $\pi_s(3)$ $\pi_s(13)$ $\pi_s(23)$ | $\pi_s(4)$ $\pi_s(14)$ $\pi_s(24)$ | $\pi_s(5)$ $\pi_s(15)$ $\pi_s(25)$ | $\pi_s(6)$ $\pi_s(16)$ $\pi_s(26)$ | $\pi_s(7)$ $\pi_s(17)$ $\pi_s(27)$ | $\pi_s(8)$ $\pi_s(18)$ $\pi_s(28)$ | $\pi_s(9)$ $\pi_s(19)$ $\pi_s(29)$ |
| BPSK/ ½ QPSK | 30 | 9 19 17 | 8 22 24 | 15 1 2 | 10 16 23 | 0 26 25 | 12 20 14 | 5 21 28 | 27 18 4 | 6 11 13 | 7 3 29 |

$\pi_s(i)$ is an index of an information bit group shortened in an i-th sequence. That is, an index $\pi_s(0)$ of an information bit group shortened in a 0-th sequence is 9. $X_9$ which is a ninth sequence information bit group among $X_i$ ($0 \le i < 30$) defined by Equation (12) is shortened in a 0-th sequence, in other words, first. In Table 13, the encoding rate ½ represents an encoding rate of a first LDPC codeword. In case of denoting a second LDPC encoding rate, the encoding rate may be expressed by ¼.

TABLE 14

| | | Order of parity group in first parity to be punctured, $\{\pi_p^1(j), 0 \le j < Q_{ldpc} = 30\}$ | | | | | | | | | | | |
|---|---|---|---|---|---|---|---|---|---|---|---|---|---|
| Modulation and Code rate | | $\pi_p^1(0)$ $\pi_p^1(13)$ $\pi_p^1(26)$ | $\pi_p^1(1)$ $\pi_p^1(14)$ $\pi_p^1(27)$ | $\pi_p^1(2)$ $\pi_p^1(15)$ $\pi_p^1(28)$ | $\pi_p^1(3)$ $\pi_p^1(16)$ $\pi_p^1(29)$ | $\pi_p^1(4)$ $\pi_p^1(17)$ | $\pi_p^1(5)$ $\pi_p^1(18)$ | $\pi_p^1(6)$ $\pi_p^1(19)$ | $\pi_p^1(7)$ $\pi_p^1(20)$ | $\pi_p^1(8)$ $\pi_p^1(21)$ | $\pi_p^1(9)$ $\pi_p^1(22)$ | $\pi_p(10)$ $\pi_p(23)$ | $\pi_p(11)$ $\pi_p(24)$ | $\pi_p(12)$ $\pi_p(25)$ |
| BPSK/QPSK | ½ | 21 26 11 | 17 28 18 | 0 19 22 | 24 4 29 | 7 15 | 10 8 | 14 2 | 12 27 | 23 20 | 1 6 | 16 9 | 3 26 | 5 13 |

$\pi_p^1(i)$ is an index of a first parity bit group punctured in an i-th sequence. That is, an index $\pi_p^1(0)$ of a first parity bit group punctured in a 0-th sequence is 1. $P_{21}^1$ which is a 21st sequence first parity bit group among a parity bit group $P_i^1$ ($0 \leq i < 30$) expressed by Equation (28) or Equation (31) is punctured in a 0-th sequence, in other words, first. In Table 14, the encoding rate ½ represents an encoding rate of a first LDPC codeword. In case of denoting a second LDPC encoding rate, the encoding rate may be expressed by ¼.

TABLE 15

Order of second parity bits group to be punctured

| $\pi_p^2(0)$ | $\pi_p^2(1)$ | $\pi_p^2(2)$ | $\pi_p^2(3)$ | $\pi_p^2(4)$ | $\pi_p^2(5)$ | $\pi_p^2(6)$ | $\pi_p^2(7)$ |
|---|---|---|---|---|---|---|---|
| $\pi_p^2(8)$ | $\pi_p^2(9)$ | $\pi_p^2(10)$ | $\pi_p^2(11)$ | $\pi_p^2(12)$ | $\pi_p^2(13)$ | $\pi_p^2(14)$ | $\pi_p^2(15)$ |
| $\pi_p^2(16)$ | $\pi_p^2(17)$ | $\pi_p^2(18)$ | $\pi_p^2(19)$ | $\pi_p^2(20)$ | $\pi_p^2(21)$ | $\pi_p^2(22)$ | $\pi_p^2(23)$ |
| $\pi_p^2(24)$ | $\pi_p^2(25)$ | $\pi_p^2(26)$ | $\pi_p^2(27)$ | $\pi_p^2(28)$ | $\pi_p^2(29)$ | $\pi_p^2(30)$ | $\pi_p^2(31)$ |
| $\pi_p^2(32)$ | $\pi_p^2(33)$ | $\pi_p^2(34)$ | $\pi_p^2(35)$ | $\pi_p^2(36)$ | $\pi_p^2(37)$ | $\pi_p^2(38)$ | $\pi_p^2(39)$ |
| $\pi_p^2(40)$ | $\pi_p^2(41)$ | $\pi_p^2(42)$ | $\pi_p^2(43)$ | $\pi_p^2(44)$ | $\pi_p^2(45)$ | $\pi_p^2(46)$ | $\pi_p^2(47)$ |
| $\pi_p^2(48)$ | $\pi_p^2(49)$ | $\pi_p^2(50)$ | $\pi_p^2(51)$ | $\pi_p^2(52)$ | $\pi_p^2(53)$ | $\pi_p^2(54)$ | $\pi_p^2(55)$ |
| $\pi_p^2(56)$ | $\pi_p^2(57)$ | $\pi_p^2(58)$ | $\pi_p^2(59)$ | | | | |
| $R_1 = ½$, $R_2 = ¼$ BPSK/QPSK | | | | | | | |
| 0 | 1 | 2 | 3 | 4 | 5 | 6 | 7 |
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | | | | |

$\pi_p^2(i)$ is an index of a second parity bit group punctured in an i-th sequence. That is, an index $\pi_p^2(0)$ of a second parity bit group punctured in a 0-th sequence is 0. $P_0^2$ which is a 0-th sequence second parity bit group among a parity bit group $P_i^2$ ($0 \leq i < 60$) expressed by Equation (29) or Equation (33) is punctured in a 0-th sequence, in other words, first. A puncture pattern of Table 15 defines a second parity group is punctured sequentially. This is because when the parity test matrix specified in the present invention is used, the form of a sixth partial matrix of the second parity test matrix of FIG. 6 has a double diagonal structure.

Figure 16:
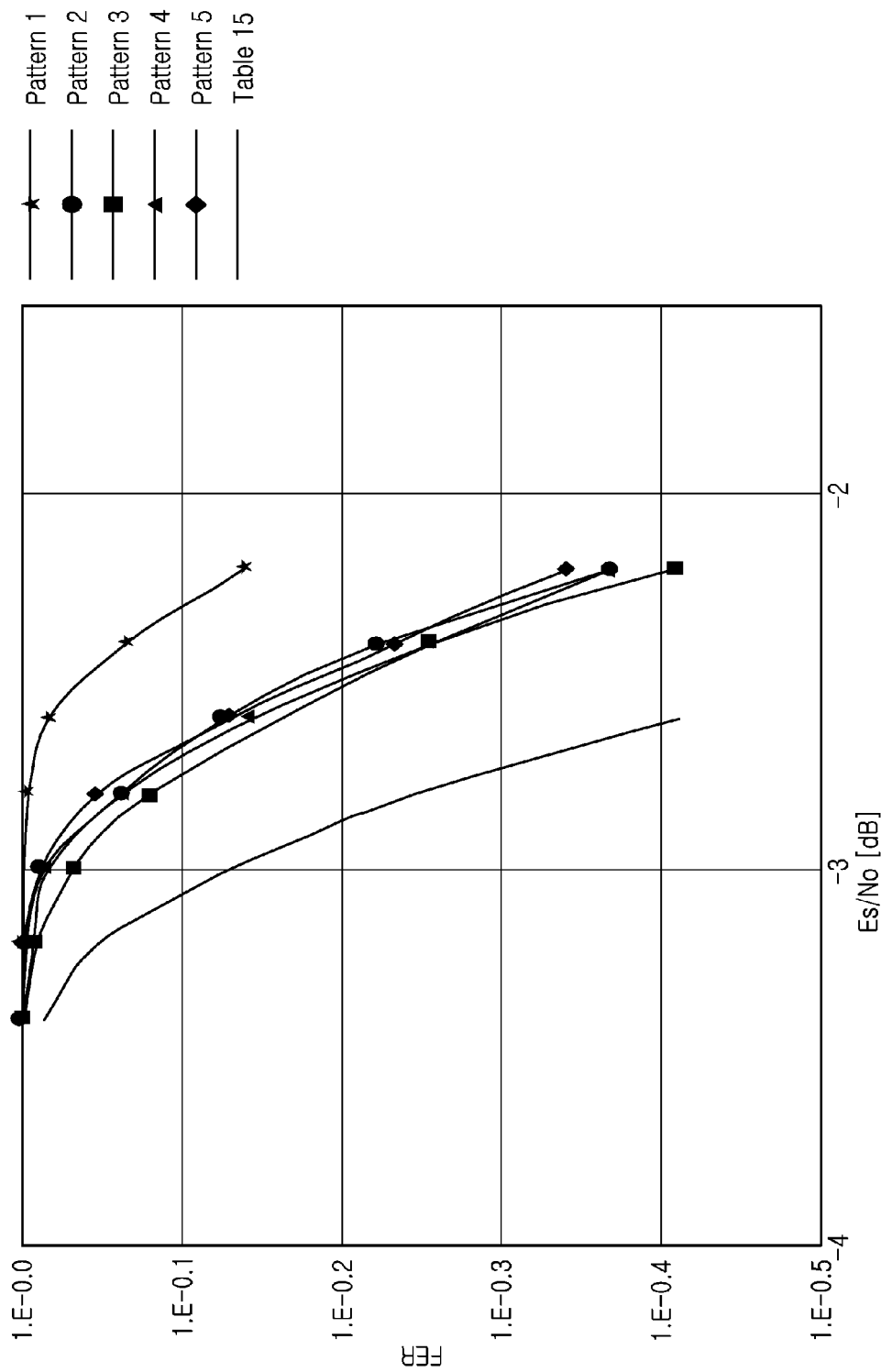
FIG. 16 is a view illustrating performance of a communication/broadcasting system according to an embodiment of the present invention.

FIG. 16 is a view illustrating performance of a communication/broadcasting system according to an embodiment of the present invention. FIG. 16 illustrates Frame Error Rate (FER) performance for various puncture patterns in case of shortening zero bit and puncturing 3320 bits. As illustrated in FIG. 16, compared to various forms of puncture patterns, it is revealed that a case of using the puncture pattern of Table guarantees excellent performance.

As described above, in case of performing encoding based on the structure of the parity test matrix of FIG. 1, or only a part of the 'first parity test matrix' of FIG. 6B, since only the first parity bits are used, in case of using a BPSK or QPSK modulation scheme based on a parity test matrix where $N_{ldpc}$ is 4320 and R is ½ as in Table 3 according to another embodiment of the present invention, or in case of performing encoding based on the first parity test matrix of Table 7, a shortening pattern may be defined by Table 13, and a puncture pattern of parity bits may be defined by Table 14.

Also, as described above, in case of using the structure of the parity test matrix of FIG. 6B but not discriminating first parity bits and second parity bits, a single puncture pattern of Table 16 below including both Table 14 and Table 15 and where a parity bit group is expressed according to Equation (34) or Equation (36), may be defined. According to Table 16, a puncture pattern is defined such that the second parity bits are punctured with priority and the first parity bits are punctured after all of the second parity bits are punctured.

TABLE 16

Order of parity bits group to be punctured

| $\pi_p(0)$ | $\pi_p(1)$ | $\pi_p(2)$ | $\pi_p(3)$ | $\pi_p(4)$ | $\pi_p(5)$ | $\pi_p(6)$ | $\pi_p(7)$ |
|---|---|---|---|---|---|---|---|
| $\pi_p(8)$ | $\pi_p(9)$ | $\pi_p(10)$ | $\pi_p(11)$ | $\pi_p(12)$ | $\pi_p(13)$ | $\pi_p(14)$ | $\pi_p(15)$ |
| $\pi_p(16)$ | $\pi_p(17)$ | $\pi_p(18)$ | $\pi_p(19)$ | $\pi_p(20)$ | $\pi_p(21)$ | $\pi_p(22)$ | $\pi_p(23)$ |
| $\pi_p(24)$ | $\pi_p(25)$ | $\pi_p(26)$ | $\pi_p(27)$ | $\pi_p(28)$ | $\pi_p(29)$ | $\pi_p(30)$ | $\pi_p(31)$ |
| $\pi_p(32)$ | $\pi_p(33)$ | $\pi_p(34)$ | $\pi_p(35)$ | $\pi_p(36)$ | $\pi_p(37)$ | $\pi_p(38)$ | $\pi_p(39)$ |
| $\pi_p(40)$ | $\pi_p(41)$ | $\pi_p(42)$ | $\pi_p(43)$ | $\pi_p(44)$ | $\pi_p(45)$ | $\pi_p(46)$ | $\pi_p(47)$ |
| $\pi_p(48)$ | $\pi_p(49)$ | $\pi_p(50)$ | $\pi_p(51)$ | $\pi_p(52)$ | $\pi_p(53)$ | $\pi_p(54)$ | $\pi_p(55)$ |
| $\pi_p(56)$ | $\pi_p(57)$ | $\pi_p(58)$ | $\pi_p(59)$ | $\pi_p(60)$ | $\pi_p(61)$ | $\pi_p(62)$ | $\pi_p(63)$ |
| $\pi_p(64)$ | $\pi_p(65)$ | $\pi_p(66)$ | $\pi_p(67)$ | $\pi_p(68)$ | $\pi_p(69)$ | $\pi_p(70)$ | $\pi_p(71)$ |
| $\pi_p(72)$ | $\pi_p(73)$ | $\pi_p(74)$ | $\pi_p(75)$ | $\pi_p(76)$ | $\pi_p(77)$ | $\pi_p(78)$ | $\pi_p(79)$ |
| $\pi_p(80)$ | $\pi_p(81)$ | $\pi_p(82)$ | $\pi_p(83)$ | $\pi_p(84)$ | $\pi_p(85)$ | $\pi_p(86)$ | $\pi_p(87)$ |
| $\pi_p(88)$ | $\pi_p(89)$ | | | | | | |
| 4320, $R_1 = ½$, $R_2 = ¼$ BPSK/QPSK | | | | | | | |
| 30 | 31 | 32 | 33 | 34 | 35 | 36 | 37 |
| 38 | 39 | 40 | 41 | 42 | 43 | 44 | 45 |
| 46 | 47 | 48 | 49 | 50 | 51 | 52 | 53 |
| 54 | 55 | 56 | 57 | 58 | 59 | 60 | 61 |
| 62 | 63 | 64 | 65 | 66 | 67 | 68 | 69 |
| 70 | 71 | 72 | 73 | 74 | 75 | 76 | 77 |
| 78 | 79 | 80 | 81 | 82 | 83 | 84 | 85 |
| 86 | 87 | 88 | 89 | 21 | 17 | 0 | 24 |

TABLE 16-continued

Order of parity bits group to be punctured

| $\pi_p(0)$ | $\pi_p(1)$ | $\pi_p(2)$ | $\pi_p(3)$ | $\pi_p(4)$ | $\pi_p(5)$ | $\pi_p(6)$ | $\pi_p(7)$ |
|---|---|---|---|---|---|---|---|
| $\pi_p(8)$ | $\pi_p(9)$ | $\pi_p(10)$ | $\pi_p(11)$ | $\pi_p(12)$ | $\pi_p(13)$ | $\pi_p(14)$ | $\pi_p(15)$ |
| $\pi_p(16)$ | $\pi_p(17)$ | $\pi_p(18)$ | $\pi_p(19)$ | $\pi_p(20)$ | $\pi_p(21)$ | $\pi_p(22)$ | $\pi_p(23)$ |
| $\pi_p(24)$ | $\pi_p(25)$ | $\pi_p(26)$ | $\pi_p(27)$ | $\pi_p(28)$ | $\pi_p(29)$ | $\pi_p(30)$ | $\pi_p(31)$ |
| $\pi_p(32)$ | $\pi_p(33)$ | $\pi_p(34)$ | $\pi_p(35)$ | $\pi_p(36)$ | $\pi_p(37)$ | $\pi_p(38)$ | $\pi_p(39)$ |
| $\pi_p(40)$ | $\pi_p(41)$ | $\pi_p(42)$ | $\pi_p(43)$ | $\pi_p(44)$ | $\pi_p(45)$ | $\pi_p(46)$ | $\pi_p(47)$ |
| $\pi_p(48)$ | $\pi_p(49)$ | $\pi_p(50)$ | $\pi_p(51)$ | $\pi_p(52)$ | $\pi_p(53)$ | $\pi_p(54)$ | $\pi_p(55)$ |
| $\pi_p(56)$ | $\pi_p(57)$ | $\pi_p(58)$ | $\pi_p(59)$ | $\pi_p(60)$ | $\pi_p(61)$ | $\pi_p(62)$ | $\pi_p(63)$ |
| $\pi_p(64)$ | $\pi_p(65)$ | $\pi_p(66)$ | $\pi_p(67)$ | $\pi_p(68)$ | $\pi_p(69)$ | $\pi_p(70)$ | $\pi_p(71)$ |
| $\pi_p(72)$ | $\pi_p(73)$ | $\pi_p(74)$ | $\pi_p(75)$ | $\pi_p(76)$ | $\pi_p(77)$ | $\pi_p(78)$ | $\pi_p(79)$ |
| $\pi_p(80)$ | $\pi_p(81)$ | $\pi_p(82)$ | $\pi_p(83)$ | $\pi_p(84)$ | $\pi_p(85)$ | $\pi_p(86)$ | $\pi_p(87)$ |
| $\pi_p(88)$ | $\pi_p(89)$ | | | | | | |
| 7 | 10 | 14 | 12 | 23 | 1 | 16 | 3 |
| 5 | 26 | 28 | 19 | 4 | 15 | 8 | 2 |
| 27 | 20 | 6 | 9 | 25 | 13 | 11 | 18 |
| 22 | 29 | | | | | | |

According to another embodiment of the present invention, even when other modulation schemes besides BPSK and QPSK modulation schemes are used, the shortening patterns and the puncture patterns of Table 13, Table 14, Table 15, and Table 16 are applicable.

Figure 17:
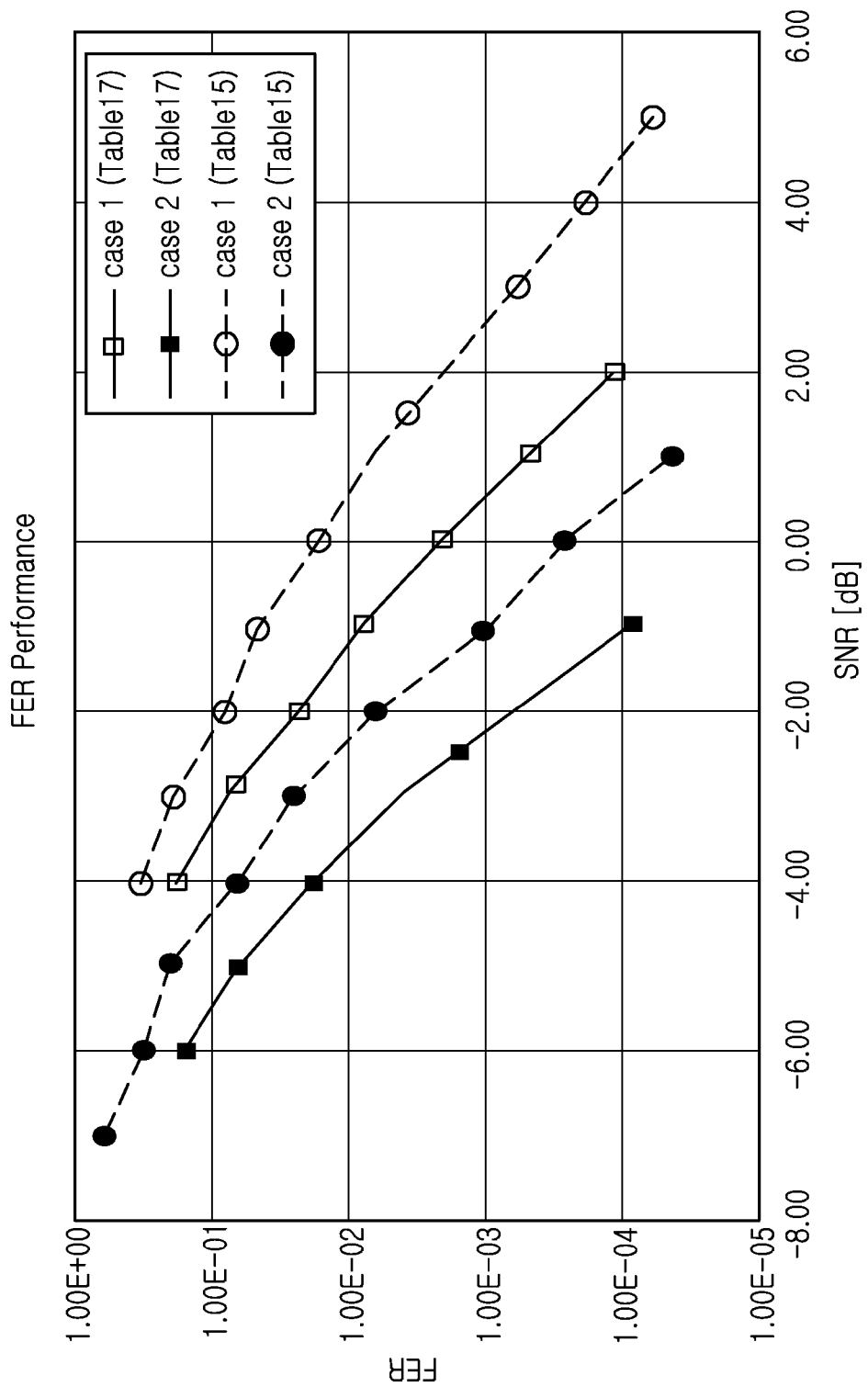
FIG. 17 is a view illustrating performance of a communication/broadcasting system according to an embodiment of the present invention.

According to another embodiment of the present invention, in case of using a parity test matrix where $N_{ldpc1}$ is 4320, $R_1$ is ½, $R_2$ is ¼, and M is 72 as in Table 7, a puncture pattern of second parity bits may be defined by Table 17. At this point, a shortening pattern may be defined by Table 13, and a puncture pattern of first parity bits may be defined by Table 14.

lengths. In FIG. 17, 'case 1' represents the length $K_{sig}$ of an input bit is 1344 and the number of transmitted parity bits is 2890, and 'case2' represents the length $K_{sig}$ of an input bit is 796 and the number of transmitted parity bits is 2927. As illustrated in FIG. 17, it is revealed that performance in case of defining a puncture pattern of second parity bits as in Table 17 is excellent.

As described above, in case of performing encoding based on the structure of the parity test matrix of FIG. 1, or only a part of the 'first parity test matrix' of FIG. 6B, since only the first parity bits are used, in case of using a BPSK or QPSK

TABLE 17

Order of parity group in second parity part to be punctured, $\{\pi_p^2(j), 0 \le j < Q_{ldpc} = 60\}$

| Modulation and Code rate | | $\pi_p^2(0)$ $\pi_p^2(13)$ $\pi_p^2(26)$ $\pi_p^2(39)$ $\pi_p^2(52)$ | $\pi_p^2(1)$ $\pi_p^2(14)$ $\pi_p^2(27)$ $\pi_p^2(40)$ $\pi_p^2(53)$ | $\pi_p^2(2)$ $\pi_p^2(15)$ $\pi_p^2(28)$ $\pi_p^2(41)$ $\pi_p^2(54)$ | $\pi_p^2(3)$ $\pi_p^2(16)$ $\pi_p^2(29)$ $\pi_p^2(42)$ $\pi_p^2(55)$ | $\pi_p^2(4)$ $\pi_p^2(17)$ $\pi_p^2(30)$ $\pi_p^2(43)$ $\pi_p^2(56)$ | $\pi_p^2(5)$ $\pi_p^2(18)$ $\pi_p^2(31)$ $\pi_p^2(44)$ $\pi_p^2(57)$ | $\pi_p^2(6)$ $\pi_p^2(19)$ $\pi_p^2(32)$ $\pi_p^2(45)$ $\pi_p^2(58)$ | $\pi_p^2(7)$ $\pi_p^2(20)$ $\pi_p^2(33)$ $\pi_p^2(46)$ $\pi_p^2(59)$ | $\pi_p^2(8)$ $\pi_p^2(21)$ $\pi_p^2(34)$ $\pi_p^2(47)$ | $\pi_p^2(9)$ $\pi_p^2(22)$ $\pi_p^2(35)$ $\pi_p^2(48)$ | $\pi_p^2(10)$ $\pi_p^2(23)$ $\pi_p^2(36)$ $\pi_p^2(49)$ | $\pi_p^2(11)$ $\pi_p^2(24)$ $\pi_p^2(37)$ $\pi_p^2(50)$ | $\pi_p^2(12)$ $\pi_p^2(25)$ $\pi_p^2(38)$ $\pi_p^2(51)$ |
|---|---|---|---|---|---|---|---|---|---|---|---|---|---|---|
| BPSK/ QPSK | ½ | 16 39 8 52 15 | 41 30 25 45 58 | 34 14 54 36 7 | 11 56 18 2 53 | 19 28 5 32 35 | 6 55 33 27 4 | 25 21 42 48 46 | 44 9 12 43 59 | 3 40 23 29 | 47 31 49 24 | 22 51 57 0 | 10 20 1 13 | 50 17 37 38 |

$\pi_p^2(i)$ is an index of a second parity bit group punctured in an i-th sequence. That is, an index $\pi_p^2(0)$ of a second parity bit group punctured in a 0-th sequence is 16. $P_{16}^2$ which is a 0-th sequence second parity bit group among a parity bit group $P_i^2 (0 \le i < 60)$ expressed by Equation (29) or Equation (33) is punctured in a 0-th sequence, in other words, first. In Table 17, the encoding rate 1/2 represents an encoding rate of a first LDPC codeword. In case of denoting a second LDPC encoding rate, the encoding rate may be expressed by ¼.

FIG. 17 illustrates performance for a case of using a puncture pattern of Table 14 for first parity bits and using a puncture pattern of Table 15 for second parity bits, and a case of using a puncture pattern of Table 14 for first parity bits and using a puncture pattern of Table 17 for second parity bits with respect to various shortening lengths and puncture modulation scheme based on a parity test matrix where $N_{ldpc}$ is 4320 and R is ½ as in Table 3 according to another embodiment of the present invention, or in case of performing encoding based on the first parity test matrix of Table 7, a shortening pattern may be defined by Table 13, and a puncture pattern of parity bits may be defined by Table 14.

Also, as described above, in case of using the structure of the parity test matrix of FIG. 6B but not discriminating first parity bits and second parity bits, that is, in case of defining a parity bit group as defined by Equation (34) to Equation (36), a single puncture pattern of Table 18 including both Table 14 and Table 17 may be defined. According to Table 18, it is defined that the second parity bits are punctured with priority and first parity bits are punctured after all of the second parity bits are punctured.

TABLE 18

Order of parity bits group to be punctured

| | | | | | | | |
|---|---|---|---|---|---|---|---|
| $\pi_p(0)$ | $\pi_p(1)$ | $\pi_p(2)$ | $\pi_p(3)$ | $\pi_p(4)$ | $\pi_p(5)$ | $\pi_p(6)$ | $\pi_p(7)$ |
| $\pi_p(8)$ | $\pi_p(9)$ | $\pi_p(10)$ | $\pi_p(11)$ | $\pi_p(12)$ | $\pi_p(13)$ | $\pi_p(14)$ | $\pi_p(15)$ |
| $\pi_p(16)$ | $\pi_p(17)$ | $\pi_p(18)$ | $\pi_p(19)$ | $\pi_p(20)$ | $\pi_p(21)$ | $\pi_p(22)$ | $\pi_p(23)$ |
| $\pi_p(24)$ | $\pi_p(25)$ | $\pi_p(26)$ | $\pi_p(27)$ | $\pi_p(28)$ | $\pi_p(29)$ | $\pi_p(30)$ | $\pi_p(31)$ |
| $\pi_p(32)$ | $\pi_p(33)$ | $\pi_p(34)$ | $\pi_p(35)$ | $\pi_p(36)$ | $\pi_p(37)$ | $\pi_p(38)$ | $\pi_p(39)$ |
| $\pi_p(40)$ | $\pi_p(41)$ | $\pi_p(42)$ | $\pi_p(43)$ | $\pi_p(44)$ | $\pi_p(45)$ | $\pi_p(46)$ | $\pi_p(47)$ |
| $\pi_p(48)$ | $\pi_p(49)$ | $\pi_p(50)$ | $\pi_p(51)$ | $\pi_p(52)$ | $\pi_p(53)$ | $\pi_p(54)$ | $\pi_p(55)$ |
| $\pi_p(56)$ | $\pi_p(57)$ | $\pi_p(58)$ | $\pi_p(59)$ | $\pi_p(60)$ | $\pi_p(61)$ | $\pi_p(62)$ | $\pi_p(63)$ |
| $\pi_p(64)$ | $\pi_p(65)$ | $\pi_p(66)$ | $\pi_p(67)$ | $\pi_p(68)$ | $\pi_p(69)$ | $\pi_p(70)$ | $\pi_p(71)$ |
| $\pi_p(72)$ | $\pi_p(73)$ | $\pi_p(74)$ | $\pi_p(75)$ | $\pi_p(76)$ | $\pi_p(77)$ | $\pi_p(78)$ | $\pi_p(79)$ |
| $\pi_p(80)$ | $\pi_p(81)$ | $\pi_p(82)$ | $\pi_p(83)$ | $\pi_p(84)$ | $\pi_p(85)$ | $\pi_p(86)$ | $\pi_p(87)$ |
| $\pi_p(88)$ | $\pi_p(89)$ | | | | | | |
| 4320, $R_1 = \frac{1}{2}$, $R_2 = \frac{1}{4}$ BPSK/QPSK | | | | | | | |
| 46 | 71 | 64 | 41 | 49 | 36 | 56 | 74 |
| 33 | 77 | 52 | 40 | 80 | 69 | 60 | 44 |
| 86 | 58 | 85 | 51 | 39 | 70 | 61 | 81 |
| 50 | 47 | 38 | 55 | 84 | 48 | 35 | 63 |
| 72 | 42 | 53 | 79 | 87 | 31 | 67 | 82 |
| 75 | 66 | 32 | 62 | 57 | 78 | 73 | 59 |
| 54 | 30 | 43 | 68 | 45 | 88 | 37 | 83 |
| 65 | 34 | 76 | 89 | 21 | 17 | 0 | 24 |
| 7 | 10 | 14 | 12 | 23 | 1 | 16 | 3 |
| 5 | 26 | 28 | 19 | 4 | 15 | 8 | 2 |
| 27 | 20 | 6 | 9 | 25 | 13 | 11 | 18 |
| 22 | 29 | | | | | | |

Hereinafter, a process for performing shortening and puncturing on a group basis using the shortening pattern and puncture pattern of Table 9 to Table 12, or the shortening pattern and puncture pattern of Table 13 to Table 18 is described.

The controller 202 provides a value of the length $K_{bch}$ of BCH information bits and a value of the length $K_I$ of information bits to the zero padding unit 204. Also, the controller 202 determines the number of bits to be punctured or the number of parity bit groups to be punctured, and notifies the number of bits to be punctured or the number of parity bit groups to be punctured to the puncture unit 210. Also, the controller 202 notifies whether to use only a first parity test matrix or use a second parity test matrix. For the notify method, various methods may exist. For example, in the case where a bit of an input information word is less than a predetermined $K_{th}$ value, only the first parity test matrix is used. In the case where the bit of the input information word is greater than the $K_{th}$ value, the second parity test matrix may be used.

The zero padding unit 204 pads at least bits on relevant positions to 0 based on the value of $K_{bch}$ and the value of $K_I$ and shortening patterns of Table 9 or Table 13, and maps respective bits of the information bits to the rest of positions. Specifically, the zero padding unit 204 determines the number of information bit groups where all bits are to be padded to 0.

$$N_{pad} = \left\lfloor \frac{K_{bch} - K_I}{M} \right\rfloor \quad (39)$$

where $N_{pad}$ is the number of information bit groups where all bits are to be padded to 0, $K_{bch}$ is the number of BCH information bits, $K_I$ is the number of information bits, and M is the number of bits included in an information bit group. For example, in the case where 72 bits are included in one group, M is 72.

That is, with respect to $N_{pad}$ information bit groups $X_{\pi_s(0)}$, $X_{\pi_s(1)}, \ldots, X_{\pi_s(N_{pad}-1)}$, all bits of groups are padded to 0. In other words, the zero padding unit 204 sets values of all bits included in $X_{\pi_s(0)}, X_{\pi_s(1)}, \ldots, X_{\pi_s(N_{pad}-1)}$ to 0. Also, the zero padding unit 204 additionally pads $K_{bch}-K_I-M \times N_{pad}$ bits in an information bit group $X_{\pi_s(N_{pad})}$. For example, bits padded to 0 in the information bit group $X_{\pi_s(N_{pad})}$ may be $K_{bch}-K_I-M \times N_{pad}$ bits at the front end or the rear end. Also, the zero padding unit 204 sequentially maps $K_I$ information bits on bit positions not padded among BCH information bits. Here, $\pi_s(x)$ representing a shortening pattern is a value determined based on an encoding rate, a modulation scheme, a shortening and puncturing ratio, and is the same as defined by Table 9 or Table 13. The above-described shortening pattern may be determined by a transmission end or stored in a memory in advance. Here, $X_j$ means a j-th bit group represented in Equation (12).

In the case where the number M of bits included in one information bit group is equal to or greater than the number of input information bits, it is preferable that a degree of a column group of a parity test matrix corresponding to a group of a last shortening sequence is large. Therefore, a group of a last shortening sequence may be $\pi_s(N_{group}-1)=0$. $N_{group}$ means the number of information bit groups, and $N_{group}$ is $$\left\lceil \frac{K_{bch}}{M} \right\rceil.$$

In this case, the zero padding unit 204 operates as below. The zero padding unit 204 determines the number of groups where all bits are to be padded to 0 as in Equation (40).

If $0 < K_I \leq M$, $N_{pad} = N_{group} - 1$

Otherwise, $$N_{pad} = \left\lfloor \frac{K_{bch} - K_I}{M} \right\rfloor \quad (40)$$

where $K_I$ is the number of information bits, M is the number of bits included in one information bit group, $N_{pad}$ is the number of information bit groups where all bits are to be padded to 0, $N_{group}$ is the number of bit groups, and $K_{bch}$ is the number of BCH information bits.

That is, with respect to $N_{pad}$ information bit groups $X_{\pi_s(0)}$, $X_{\pi_s(1)}, \ldots, X_{\pi_s(N_{pad}-1)}$, all bits of groups are padded to 0. In other words, the zero padding unit 204 sets values of all bits included in $N_{pad}$ information bit groups $X_{\pi_s(0)}, X_{\pi_s(1)}, \ldots, X_{\pi_s(N_{pad}-1)}$ to 0. In the case where $N_{pad}$ is the same as $N_{group}-1$, the zero padding unit 204 pads $(M-K_f)$ information bits included in the information bit group $X_{\pi_s(N_{group}-1)}$ to 0. For example, bits in the information bit group $X_{\pi_s(N_{group}-1)}$ padded to 0 may be $(M-K_f)$ bits in the front end or the rear end. In contrast, when $N_{pad}$ is not the same as $N_{group}-1$, the zero padding unit 204 pads $(K_{bch}-K_f-M\times N_{pad})$ bits included in an information bit group $X_{\pi_s(N_{pad})}$ to 0. For example, bits in the group $X_{\pi_s(N_{pad})}$ padded to 0 may be $(K_{bch}-K_f-M\times N_{pad})$ bits in the front end or the rear end. Here, $\pi_s(i)$ representing a shortening pattern is a value determined based on an encoding rate, a modulation scheme, and a shortening and puncturing ratio, and is the same as defined by Table 9 and Table 13. Here, $X_j$ means a j-th bit group represented in Equation (12).

The puncture unit 210 determines the number of parity bit groups where all parity bits within the group are to be punctured as in Equation (41) with respect to the number $N_{punc}$ of given puncture bits. The parity bit group includes a first parity bit group to a second parity bit group.

$$N_{punc\_groups} = \left\lfloor \frac{N_{punc}}{M} \right\rfloor \text{ for } 0 \leq N_{punc} < N_{ldpc2} - K_{ldpc} \quad (41)$$

where $N_{punc\ groups}$ is the number of parity bit groups where all parity bits are to be punctured, $N_{punc}$ is the number of puncture bits, M is the number of bits included in one parity bit group, $N_{ldpc2}$ is the length of a second LDPC codeword, and $K_{ldpc}$ is the number of LDPC information bits. For example, in the case where 72 bits are included in one parity bit group, M is 72.

In the case where $N_{punc\ group}$ is equal to or greater than $Q_{ldpc2}$, the puncture unit 210 punctures all bits of 'second parity bit groups', and punctures 'first parity bit groups' according to the puncture pattern of Table 10 and Table 14. In contrast, in the case where $N_{punc\ group}$ is less than $Q_{ldpc2}$ the puncture unit 210 punctures 'second parity bit groups' according to the puncture pattern of Table 11, Table 15, and Table 17. That is, in the case where $N_{punc\ group}$ is equal to or greater than $Q_{ldpc2}$ a 'second parity bit group' should be punctured first, all parity bits within the 'second parity bit group' are punctured, and all parity bits included in $(N_{punc\ groups}-Q_{ldpc2})$ parity bit groups $$P^1_{\pi^1_p(0)}, P^1_{\pi^1_p(1)}, \ldots, P^1_{\pi^1_p(N_{parity\ groups}-Q_{ldpc2}-1)}$$

within the 'first parity bit group' are punctured. Also, the puncture unit 210 punctures $N_{punc}-M\times N_{punc\ groups}$ bits in a first parity bit group $$P^1_{\pi^1_p(N_{parity\ groups}-Q_{ldpc2})}.$$

For example, bits punctured in the first parity bit group $$P^1_{\pi^1_p(N_{parity\ groups}-Q_{ldpc2})}$$

may be $N_{punc}-M\times N_{punc\ group}$ bits in the front end or the rear end.

In contrast, in the case where $N_{punc\ group}$ is less than $Q_{ldpc2}$ the puncture unit 210 punctures all parity bits within $N_{punc\ groups}$ second parity bit groups $$P^2_{\pi^2_p(0)}, P^2_{\pi^2_p(1)}, \ldots, P^2_{\pi^2_p(N_{parity\ groups}-1)}.$$

Also, the puncture unit 210 punctures $N_{punc}-M\times N_{punc\ groups}$ bits in a $$P^2_{\pi^2_p(N_{parity\ groups})}$$

parity group within a second parity group. For example, bits punctured in the $$P^2_{\pi^2_p(N_{parity\ groups})}$$

parity group within the second parity group may be $N_{punc}-M\times N_{punc\ groups}$ bits in the front end or the rear end of the parity group.

Here, $\pi_p^1(i)$ representing a puncture pattern is a value determined based on an encoding rate, a codeword length, a modulation scheme, and a puncturing and shortening ratio, and represents a puncture sequence of first parity bit groups, and is the same as defined by Table 10 and Table 14. Also, $\pi_p^2(i)$ representing the puncture pattern is a value determined based on an encoding rate, a codeword length, a modulation scheme, and a puncturing and shortening ratio, and represents a puncture sequence of second parity bit groups, and is the same as defined by Table 11, Table 15, and Table 17. The puncture pattern may be determined by a transmission end or stored in a memory in advance. Here, $P_j^1$ means a j-th sequence first parity bit group represented in Equation (28) or Equation (31) or a j-th parity bit group in a first parity part. Also, $P_j^2$ means a j-th sequence first parity bit group represented in Equation (29) or Equation (32) or a j-th parity bit group in the first parity part.

Also, the puncture unit 210 may remove zero bit padded by the zero padding unit 204. Though the present invention has made description with consideration of both shortening and puncturing, the shortening and the puncturing may be performed independently.

As described above, as shown in Equation (34) and Equation (35), a parity bit group may be defined without discrimination of a first parity bit group and a second parity bit group. In this case, the puncture unit 210 operates as below.

The puncture unit 210 determines the number of groups to be punctured as Equation (41) with respect to the number $N_{punc}$ of given puncture bits. The puncture unit 210 punctures all parity bits included in $N_{punc\ groups}$ parity bit groups $P_{\pi_p(0)}, P_{\pi_p(1)}, \ldots, P_{\pi_p(N_{parity\ groups}-1)}$. Also, the puncture unit 210 punctures $N_{punc}-M\times N_{punc\ groups}$ bits among bits included in $P_{\pi_p(N_{parity\ groups})}$. For example, bits punctured in the group $P_{\pi_p(N_{parity\ groups})}$ may be $N_{punc}-M \times N_{punc\ groups}$ bits. Here, $\pi_p(x)$ which is the puncture pattern is a value determined based on an encoding rate, a codeword length, a modulation scheme, and a puncturing and shortening ratio, represents a puncture sequence of parity bit groups, and is the same as defined by Table 12, Table 16, and Table 18.

As described above, a rule for determining a shortening pattern and a puncture pattern which are sequences of optimized shortened bits and optimized punctured bits when shortening $N_{short}$ bits and puncturing $N_{punc}$ bits with respect to codes of given length ($N_{ldpc}$, $K_{ldpc}$) is as below.

In case of using a BCH code and an LDPC code in a connected manner, it is preferable that parity bits of a BCH code included in an information bit group where parity bits of a BCH code exist are not shortened. Therefore, an information bit group including parity bits of a BCH code has a latest shortening sequence, and the number of shortened bits in the information bit group including parity bits of the BCH code is determined as $a \times M - (K_{ldpc} - K_{bch})$. Here, $$a = \left\lfloor \frac{(K_{ldpc} - K_{bch})}{M} \right\rfloor.$$

Parity bits of a BCH code mean in what number of information bit groups, all elements consist of parity bits of a BCH code in the case where the parity bits are divided by a group of the same size as the information bit group. When the number of parity bits of a BCH code is greater than the number M of bits of the information bit group, two or more information bit groups may have a latest shortening sequence. In case of FIG. 4, the parity bits of a BCH code are included in the last information bit group. The position of the parity bits of the BCH code may change based on an encoding rate and the size of a code.

Figure 8:
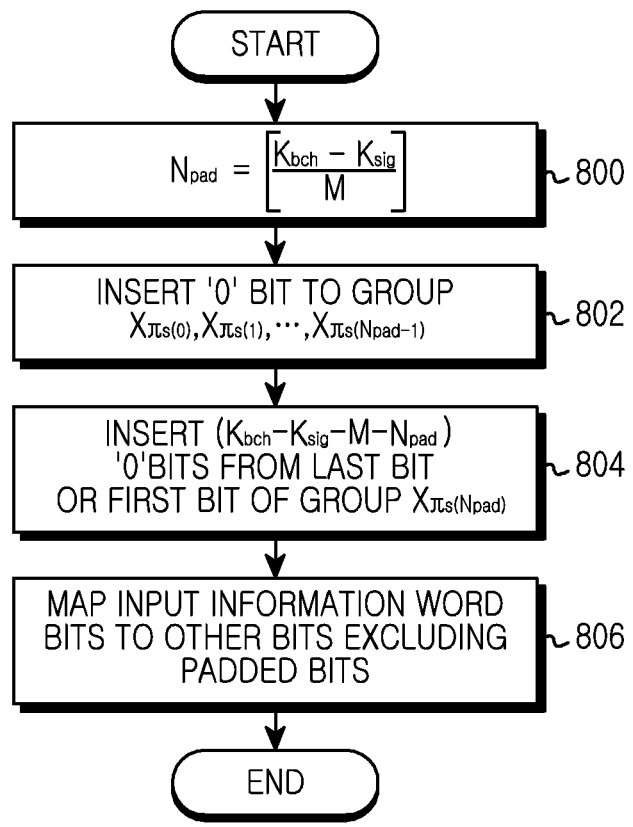
FIG. 8 is a view illustrating a padding procedure in a communication/broadcasting system according to an embodiment of the present invention.

Hereinafter, the present invention describes a shortening process with reference to FIG. 8. FIG. 8 is a view illustrating a padding procedure in a communication/broadcasting system according to an embodiment of the present invention.

Referring to FIG. 8, in step 800, $N_{pad}$ is determined by Equation (39). $N_{pad}$ is the number of bit groups where all bits are padded to 0. In the case where M is 72, an LDPD codeword length $N_{ldpc}$ is 4320. In step 802, all bits within $N_{pad}$ bit groups $X_{\pi_s(0)}, X_{\pi_s(1)}, \ldots, X_{\pi_s(N_{pad}-1)}$ are padded to 0. The $\pi_s(i)$ is an index value of an information bit group defined by Table 9 and Table 13, and is a value changing based on an encoding rate, a modulation scheme, and a puncturing and shortening ratio. In step 804, additionally, ($K_{bch}-K_I-M \times N_{pad}$) bits from a last bit of a bit group $X_{\pi_s(N_{pad})}$ are padded to 0. Alternatively, ($K_{bch}-K_I-M \times N_{pad}$) bits from a first bit of a bit group $X_{\pi_s(N_{pad})}$ may be padded to 0. Step 804 may be omitted based on the number of bits to be padded. For example, in the case where ($K_{bch}-K_I-M \times N_{pad}$) is 0, that is, the number of bits to be padded is a multiple of M, the additional padding step of step 804 may be omitted. In step 806, input information bits are mapped to not-padded bit positions.

For example, in the case where $N_{ldpc}$ is 4320, R is ½, and the BPSK modulation scheme is used, the number of LDPC bit groups is 30 and the number of bits within one information bit group is 72. In the case where the number $K_I$ of input bits is 1500, an input bit is $S = (i_0, i_1, \ldots, i_{1499})$, and the number $K_{bch}$ of BCH information bits is 2100, $N_{pad}$ is $$\left\lfloor \frac{2100 - 1500}{72} \right\rfloor = 8$$

by step 800. In the case where $\pi_s(x)$ defined by Table 13 is used by step 802, all bits of eight bit groups $X_{\pi_s(0)}, X_{\pi_s(1)}, \ldots, X_{\pi_s(7)}$, that is, $X_9, X_8, X_{15}, X_{10}, X_0, X_{12}, X_5, X_{27}$ are padded to 0. By step 804, $X_{\pi_s(8)}$, that is, $K_{bch}-K_I-M \times N_{pad} = 2100-1500-72 \times 8 = 24$ bits from last bits of $X_6$ are padded to 0. By step 806, $S = (i_0, i_1, \ldots, i_{1499})$ are sequentially mapped to bit positions not padded to 0.

Figure 9:
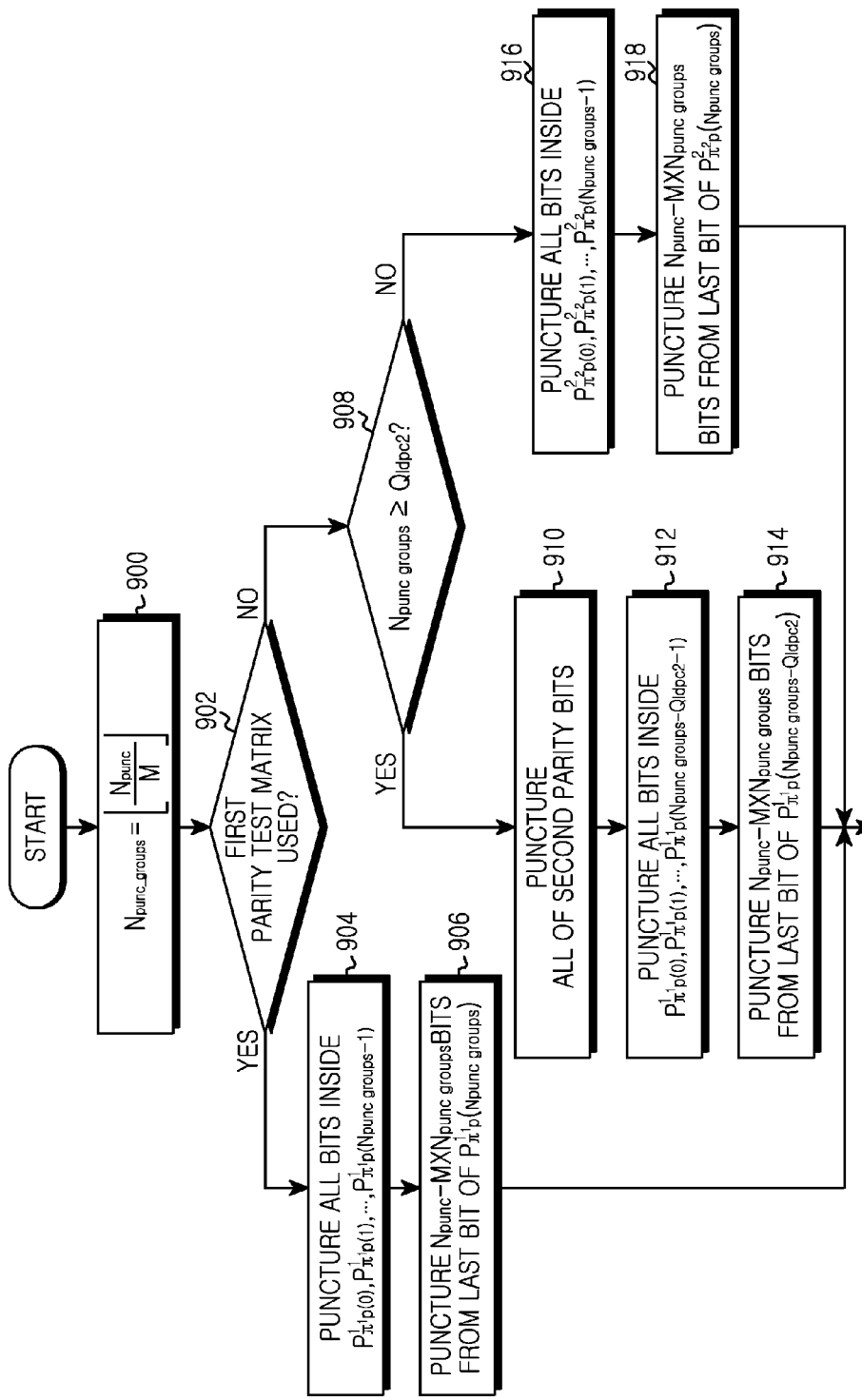
FIG. 9 is a view illustrating a puncturing procedure in a communication/broadcasting system according to an embodiment of the present invention.

Hereinafter, the present invention makes a description with reference to FIG. 9. FIG. 9 illustrates a puncturing procedure in a communication/broadcasting system according to an embodiment of the present invention.

Referring to FIG. 9, in step 900, $N_{punc\ groups}$ is determined by Equation (41). At this point, the number $N_{punc}$ of punctured bits may be determined by various methods. In step 902, whether a first parity test matrix having the structure of FIG. 1 is used or a second parity test matrix illustrated in FIG. 6B is used is determined. A case of using the first parity test matrix exists variously, and it is obvious that a specific operation of step 902 may change based on the various cases. For example, it may be defined that in the case where the number of bits of an input information word is less than an arbitrary threshold value $K_{th}$, the first parity test matrix is used, and in the case where the number of bits of the input information word is greater than $K_{th}$, the second parity test matrix is used. Therefore, the above condition phrase may be replaced by determining whether $K_I < K_{th}$. An example of a specific operation of step 902 is described with reference to FIG. 11.

In the case where the first parity test matrix is used, step 904 is performed, and all bits within information bit groups $$P^1_{\pi_p(0)}, P^1_{\pi_p(1)}, \ldots, P^1_{\pi_p(N_{punc\ groups}-1)}$$

are punctured. Subsequently, in step 906, $N_{punc}-M \times N_{punc\ groups}$ bits from a last bit of an information bit group $$P^1_{\pi_p(N_{punc\ groups})}$$

are punctured. In case of using only the first parity test matrix, the information bit groups $$P^1_{\pi_p(0)}$$

and $P_{\pi_p(0)}$ are the same. Here, $\pi_p^{-1}(i)$ representing a puncture pattern is a value determined based on an encoding rate, a codeword length, a modulation scheme, and a puncturing and shortening ratio, and is the same as defined by Table 10 and Table 14.

In step 902, in the case where the first parity test matrix is not used and the second parity test matrix is used, step 908 is performed and whether $N_{punc\ groups}$ determined in step 900 is greater than $Q_{ldpc2}$ which is the number of the second parity bit groups is determined. In step 908, when $N_{punc\ groups}$ is equal to or greater than $Q_{ldpc2}$, step 910 is performed. When $N_{punc\ groups}$ is less than $Q_{ldpc2}$, step 916 is performed.

When $N_{punc\ groups}$ is equal to or greater than $Q_{ldpc2}$, all of second parity bits are punctured in step 910. That is, since a second parity bit group should be punctured first, all of parity bits within the second parity group are punctured. Subsequently, in step 912, all bits within first parity bit groups $$P^1_{\pi^1_p(0)}, P^1_{\pi^1_p(1)}, \cdots, P^1_{\pi^1_p(N_{punc\ groups}-Q_{ldpc2}-1)}$$

are punctured. Subsequently, in step 914, $N_{punc}$–M× $N_{punc\ groups}$ bits in a first parity group $$P^1_{\pi^1_p(N_{punc\ groups}-Q_{ldpc2})}$$

are punctured. Punctured $N_{punc}$–M×$N_{punc\ groups}$ bits may be positioned in the front end or the rear end of the first parity bit group $$P^1_{\pi^1_p(N_{punc\ groups}-Q_{ldpc2})}.$$

Here, $\pi_p^1(i)$ representing a puncture pattern is a value determined based on an encoding rate, a codeword length, a modulation scheme, and a puncturing and shortening ratio, represents a puncture sequence of first parity bit groups, and is the same as defined by Table 10 and Table 14.

When $N_{punc\ groups}$ is less than $Q_{ldpc2}$ in step 916, all bits within second parity bit groups $$P^2_{\pi^2_p(0)}, P^2_{\pi^2_p(1)}, \cdots, P^2_{\pi^2_p(N_{punc\ groups}-1)}$$

are punctured. Subsequently, in step 918, $N_{punc}$–M× $N_{punc\ groups}$ bits in a second parity bit group $$P^2_{\pi^2_p(N_{punc\ groups})}$$

are punctured. Punctured $N_{punc}$–M×$N_{punc\ groups}$ bits may be positioned in the front end or the rear end of the second parity bit group $$P^1_{\pi^2_p(N_{punc\ groups}-Q_{ldpc2})}.$$

Here, $\pi_p^2(i)$ representing a puncture pattern is a value determined based on an encoding rate, a codeword length, a modulation scheme, and a puncturing and shortening ratio, and is the same as defined by Table 11, Table 15, and Table 17.

In an embodiment illustrated in FIG. 9, step 908 is step for comparing the number of second parity bits with the number of bits to be punctured using $N_{punc\ groups}$. However, step 908 may be replaced by step for comparing the number of second parity bits with the number of bits to be punctured using $N_{punc}$.

Also, the puncture procedure illustrated in FIG. 9 determines the form of a parity test matrix when performing encoding before puncturing, and premises encoding is performed using the determined parity test matrix. That is, during encoding, a first parity test matrix or a second parity test matrix is used. Therefore, in step 902, in the case where the first parity test matrix is used, since second parity bits are not generated, puncturing for the second parity bits is not considered.

Figure 10:
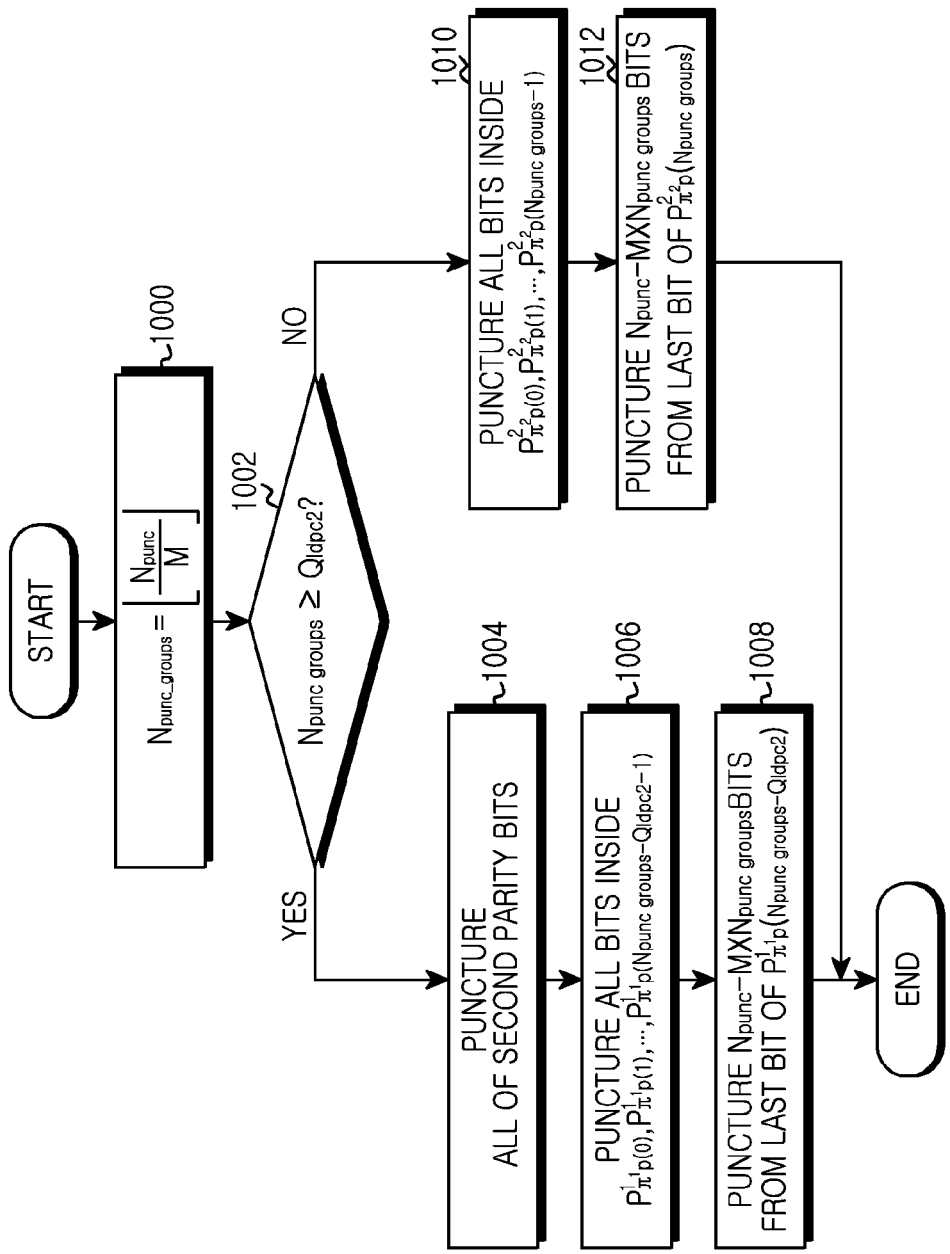
FIG. 10 is a view illustrating a puncturing procedure in a communication/broadcasting system according to another embodiment of the present invention.

However, according to another embodiment of the present invention, a second parity test matrix may be always used during encoding. In this case, in case of determining whether to transmit second parity bits in the above puncturing procedure, and then in case of not transmitting second parity bits, all second parity bits should be punctured. In this case, before step 904, step for puncturing all of the second parity bits may be added. Alternatively, in this case, according to another embodiment of the present invention, step 902, step 904, and step 906 may be omitted. In this case, the puncturing procedure is illustrated in FIG. 10. An embodiment illustrated in FIG. 10 excludes step 902 to step 906 from FIG. 9. That is, since step 1004 of FIG. 10 is the same as step 910, step 1006 is the same as step 912, step 1008 is the same as step 914, step 1010 is the same as step 916, and step 1012 is the same as step 918, detailed description thereof is omitted.

Figure 11:
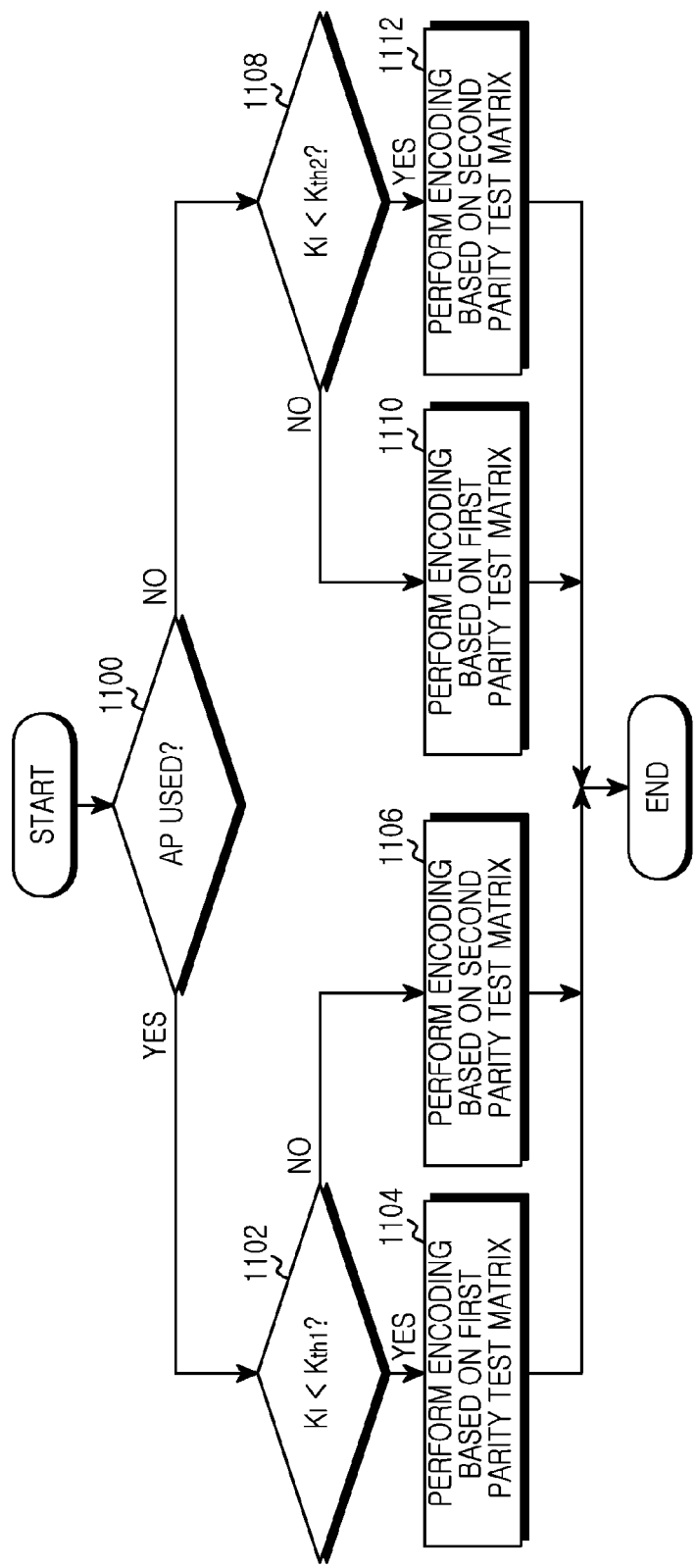
FIG. 11 is a view illustrating a procedure for determining a form of a parity test matrix in a communication/broadcasting system according to an embodiment of the present invention.

Hereinafter, the present invention describes a process for determining a parity test matrix to be used with reference to FIG. 11. FIG. 11 illustrates a procedure for determining a form of a parity test matrix in a communication/broadcasting system according to an embodiment of the present invention.

Referring to FIG. 11, in step 1100, whether an Additional Parity (AP) is used is determined. In case of transmitting an additional parity bit to an (n−1)-th frame besides an information word and not-punctured parity bits transmitted to an n-th frame, the additional parity bit means the AP. The AP may be used for a diversity effect and an encoding gain. Specifically, the AP may include the information bits and the not-punctured parity bits, and some of punctured parity bits. Whether to use the AP determines the size of a threshold used for determining the form of a parity test matrix. For example, the AP may include punctured bits among first parity bits with priority.

When the AP is used, step 1102 is performed, and whether the number $K_I$ of bits of an input information word is less than a first threshold $K_{th1}$ is determined. When $K_I$ is less than $K_{th1}$, it is determined that encoding is performed based on a first parity test matrix in step 1104. Here, encoding based on the first parity test matrix means encoding based on Table 3 defining the position of weight-1 of a 0-th column of each column group of the first parity test matrix of FIG. 6A or the position of weight-1 of a 0-th column of each column group of the parity test matrix of FIG. 1. When $K_I$ is equal to or greater than $K_{th1}$, it is determined that encoding is performed based on a second parity test matrix in step 1106. Here, encoding based on the second parity test matrix means encoding based on Table 8 defining the position of weight-1 of a 0-th column of each column group of the second parity test matrix of FIG. 6A.

In contrast, when the AP is not used, step 1108 is performed, and whether the number $K_I$ of bits of an input information word is less than a second threshold $K_{th2}$ is determined. Here, encoding based the first parity test matrix means encoding based on Table 3 defining the position of weight-1 of a 0-th column of each column group of the first parity test matrix of FIG. 6A or the position of weight-1 of a 0-th column of each column group of the parity test matrix of FIG. 1. When $K_I$ is less than $K_{th2}$, it is determined that encoding is performed based on a first parity test matrix in step 1110. When $K_I$ is equal to or greater than $K_{th2}$, it is determined that encoding is performed based on a second parity test matrix in step 1112. Here, encoding based on the second parity test matrix means encoding based on Table 8 defining the position of weight-1 of a 0-th column of each column group of the second parity test matrix of FIG. 6A.

Hereinafter, the present invention describes in detail an operation and a construction of a transmission end and a reception end performing shortening and puncturing as described above with reference to the drawing.

Figure 12A:
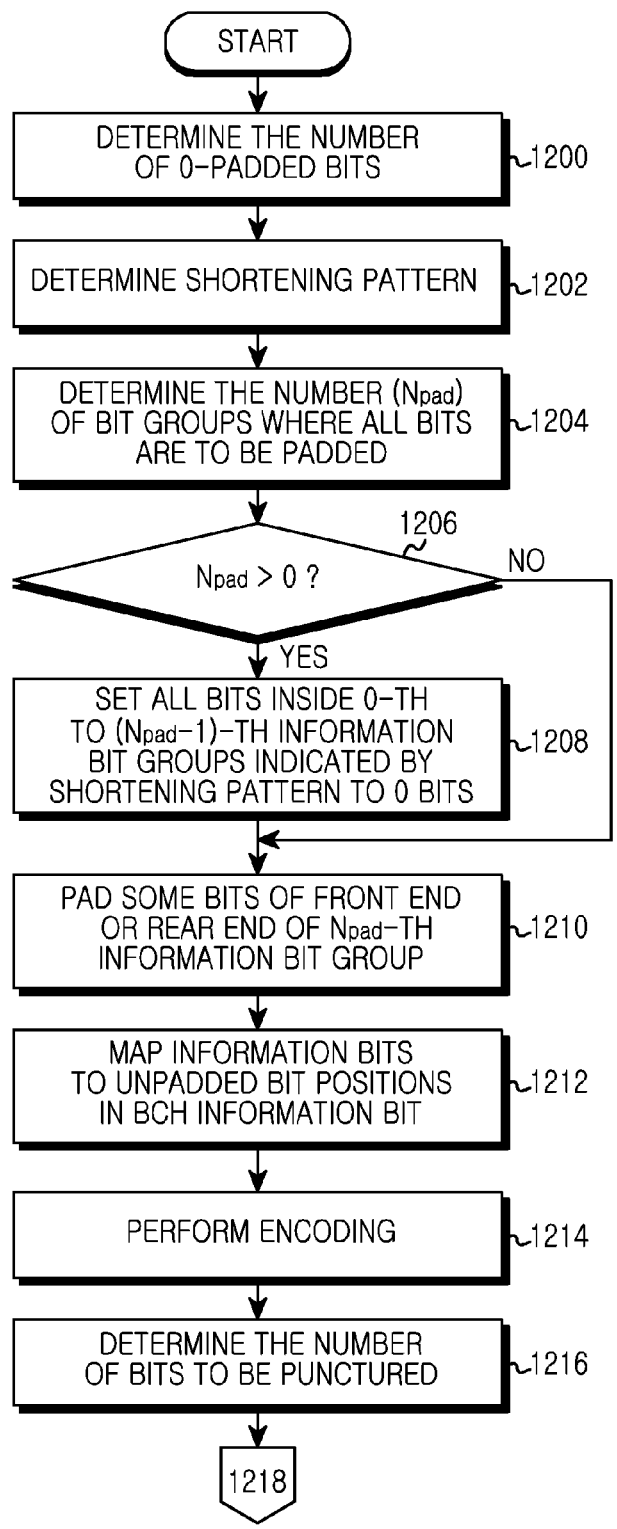
FIGS. 12A and 12B are views illustrating an operation procedure of a transmission end in a communication/broadcasting system according to an embodiment of the present invention.
Figure 12B:
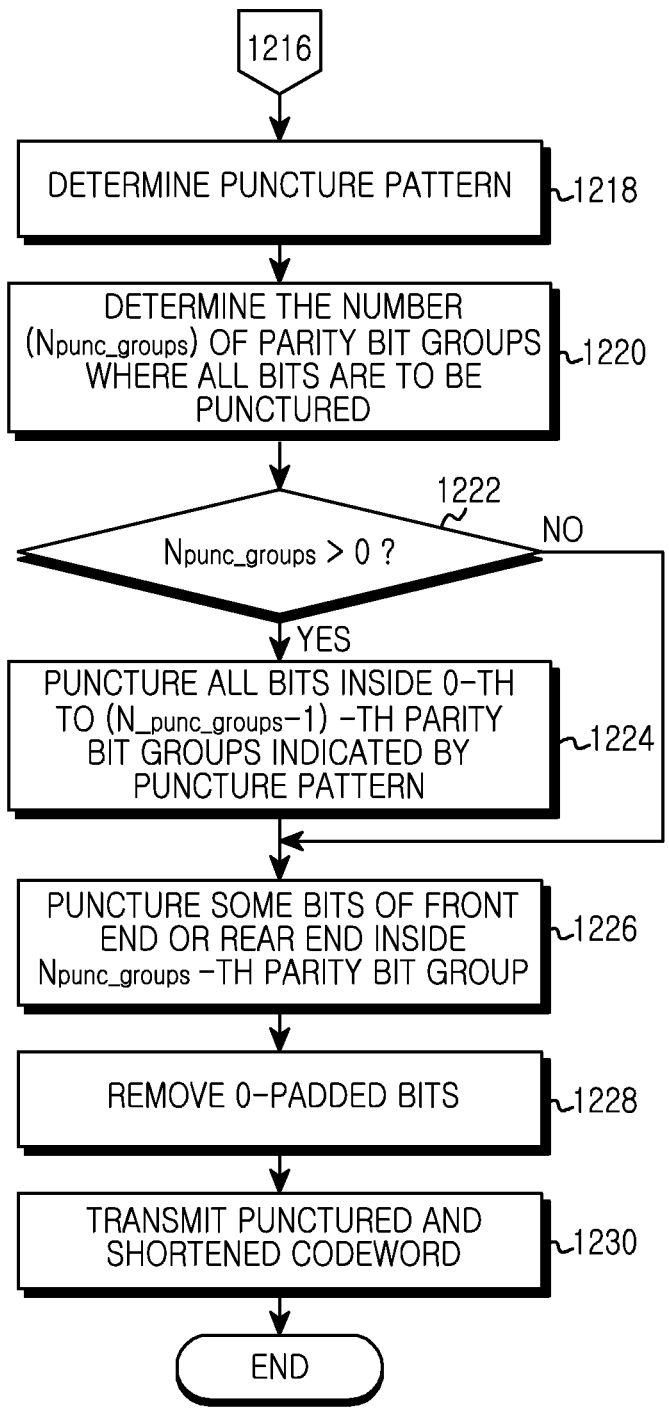

FIGS. 12A and 12B illustrate an operation procedure of a transmission end in a communication/broadcasting system according to an embodiment of the present invention.

Referring to FIGS. 12A and 12B, the transmission end determines the number of bits to be padded in step 1200. The bit to be padded is a bit to be shortened and occurs when the number of input bits for encoding, that is, the number of BCH information bits is greater than the number of provided information bits. That is, the transmission end determines the number of bits to be padded to 0 by subtracting the number of information bits from the number of BCH information bits which is the number of input bits for the encoding.

Subsequently, the transmission end proceeds to step 1202 to determine a shortening pattern. That is, the transmission end stores at least one shortening pattern defined in advance, and selects a shortening pattern corresponding to a current condition among the stored at least one shortening pattern. For example, the shortening pattern may be defined based on a codeword length, an encoding rate, a shortening and puncturing ratio, a modulation scheme, etc. For example, at least one shortening pattern is defined on a bit group basis that divides information bits on a predetermined number basis. For example, the at least one shortening pattern may include Table 9 or Table 13. According to another embodiment of the present invention, the transmission end may not store the shortening pattern in advance but may generate the shortening pattern based on a current condition. For example, the generated shortening pattern may include Table 9 or Table 13.

After determining the shortening pattern, the transmission end proceeds to step 1204 to determine the number $N_{pad}$ of bit groups where all bits are to be padded to 0. A bit group where all bits are to be padded to 0 means a bit group where all bits are to be shortened. That is, the transmission end divides the number of bits to be padded to 0 by the number of bits per bit group, and determines a maximum integer value smaller than the division result as $N_{pad}$. In the case where the number of information bits is less than the number of bits included in one bit group, all of the information bits may be included in one bit group. Therefore, in this case, $N_{pad}$ becomes a value smaller than the number of all bit groups by 1.

Subsequently, the transmission end proceeds to step 1206 to determine whether $N_{pad}$ is greater than 0. In other words, the transmission end determines whether at least one bit group where all bits are to be padded to 0 exists. When $N_{pad}$ is not greater than 0, the transmission end omits step 1208 below and proceeds to step 1210.

In contrast, when $N_{pad}$ is greater than 0, the transmission end proceeds to step 1208 to pad all bits within a 0-th bit group to an ($N_{pad}-1$)-th bit group indicated by a shortening pattern determined in step 1204 to 0. Subsequently, the transmission end proceeds to step 1110 to set some of bits within $N_{pad}$-th bit group to 0 bits. At this point, some of bits set to 0 bits in the $N_{pad}$-th bit group are selected according to a rule defined in advance. For example, some of bits set to 0 bits may be some bits in the front end or the rear end of the $N_{pad}$-th bit group. However, in the case where padding of all bits is completed by padding all the bits within the 0-th bit group to the ($N_{pad}-1$)-th bit group to 0, step 1210 may be omitted. Also, the transmission end proceeds to step 1212 to map information bits to not-padded bit positions in BCH information bits. That is, the transmission end pads bits of bit groups that depend on a sequence indicated by the shortening pattern and maps the information bits to the positions of the rest of the bits via step 1208 to step 1212.

After that, the transmission end proceeds to step 1214 to perform encoding on padded information bits, that is, BCH information bits. At this point, the transmission end may perform a plurality of encoding techniques in a connected manner. For example, the transmission end may sequentially perform BCH encoding and LDPC encoding. In this case, the transmission end may perform BCH encoding on the BCH information bits, and perform LDPC encoding on LDPC information bits, that is, a BCH codeword generated as a result of the BCH encoding. According to another embodiment of the present invention, the transmission end may perform only LDPC encoding on the BCH information bits, that is, information bits padded to 0. In the case where only the LDPC encoding is performed without the BCH encoding, the BCH information bits may be called LDPC information bits. In using the parity test matrix, the transmission end may use an address value of an accumulator as represented in Equation 5, Equation 7, Equation 23, and Equation 24.

According to another embodiment of the present invention, the transmission end may determine the form of a parity test matrix to use for encoding before performing the encoding in step 1214. That is, the transmission end according to an embodiment of the present invention may use two or more parity test matrixes. For example, the two or more parity test matrixes include the first parity test matrix and the second parity test matrix illustrated in FIG. 6B. At this point, the reception end may store the first parity test matrix and the second parity test matrix separately, or store only the second parity test matrix and extract the first parity test matrix from the second parity test matrix and use the same. For example, determination of the form of the parity test matrix to use may be judged by at least one of the length of an information word and an encoding rate. For example, determination of the form of the parity test matrix to use may be judged via the process of FIG. 10. In the case where a process of determining the form of the parity test matrix to use is not performed, the reception end may perform encoding using the second parity test matrix which is a larger form, and determine whether a second parity is removed based on an encoding rate afterward.

After performing the encoding, the transmission end proceeds to step 1216 to determine the number of bits to be punctured. For example, the transmission end may determine the number of bits to be punctured based on a value related to the number of shortened bits and an encoding rate, in other words, a puncturing and shortening ratio. For example, the value related to the number of shortened bits and an encoding rate may be defined by Equation (37). Also, the transmission end may determine the number of bits to be punctured with consideration of the structure of the parity test matrix or the number of input bits.

After determining the number of bits to be punctured, the transmission end may proceed to step 1218 to determine a puncture pattern. That is, the transmission end stores at least one puncture pattern defined in advance, and selects a puncture pattern corresponding to a current condition among the stored at least one puncture pattern. For example, the puncture pattern may be defined based on the form of a parity test matrix to use, a codeword length, an encoding rate, a shortening and puncturing ratio, a modulation scheme, etc. For example, at least one puncture pattern is defined on a parity bit group basis that divides parity bits on a predetermined number basis. For example, the at least one puncture pattern may include at least one of Table 10, Table 11, Table 12, Table 14, Table 15, Table 16, Table 17, and Table 18. According to another embodiment of the present invention, the transmission end may not store the puncture pattern in advance but may generate the puncture pattern based on a current condition. For example, the generated puncture pattern may include at least one of Table 10, Table 11, Table 12, Table 14, Table 15, Table 16, Table 17, and Table 18.

At this point, the transmission end should consider the form of a parity test matrix to use. For example, the form of the parity test matrix to use may be determined by at least one of the length of an information word and an encoding rate. For example, determination of the form of the parity test matrix to use may be judged via the process of FIG. 10. In the case where the parity test matrix to use is the first parity test matrix illustrated in FIG. 6B, the puncture pattern is determined based on Table 10 or Table 14. In contrast, in the case where the parity test matrix to use is the second parity test matrix illustrated in FIG. 6B, the puncture pattern is determined by Table 12, or Table 16, or Table 18, or determined by Table 10 and Table 11, or Table 14 and Table 15, or Table 14 and Table 17. According to Table 10 and Table 11, or Table 14 and Table 15, or Table 14 and Table 17, the transmission end determines the puncture pattern first according to Table 11, or Table 15, or Table 17, and then when a bit to be punctured exists, the transmission end determines the rest of the puncture pattern according to Table 10 or Table 14.

After determining the puncture pattern, the transmission end proceeds to step 1220 to determine the number $N_{punc\_groups}$ of parity bit groups where all parity bits are to be punctured. That is, the transmission end divides the number of parity bits to be punctured by the number of bits per parity bit group, and determines a maximum integer value smaller than a division result as $N_{punc\_groups}$. In the case where the number of bits not to be punctured is less than the number of bits included in one parity bit group, all of the bits not to be punctured may be included in one parity bit group. Therefore, in this case, $N_{punc\_groups}$ becomes a value less than the number of all parity bit groups by 1.

Subsequently, the transmission end proceeds to step 1222 to determine whether $N_{punc\_groups}$ is greater than 0. In other words, the transmission end determines whether at least one parity bit group where all parity bits are to be punctured exists. When $N_{punc\_groups}$ is not greater than 0, the transmission end omits step 1224 below and proceeds to step 1226.

In contrast, when $N_{punc\_groups}$ is greater than 0, the transmission end proceeds to step 1224 and punctures all parity bits within a 0-th parity bit group to a ($N_{punc\_groups}$−1)-th groups parity bit group indicated by the puncture pattern determined in step 1218. Step 1224 is described again according to the puncture pattern of FIG. 10 and a punctured parity bit determine process. In step 1224, the 0-th parity bit group to the ($N_{punc\_groups}$−1)-th parity bit group where all bits within the group are punctured are the same as all second parity bit groups and some $$\left(P^1_{\pi_p(0)}, P^1_{\pi_p(1)}, \cdots, P^1_{\pi_p(N_{punc\ groups}-Q_{ldpc2}-1)}\right)$$

of a first parity bit group in the case where $N_{punc\_groups}$ is equal to or greater than $Q_{ldpc2}$. Also, in the case where $N_{punc\_groups}$ is less than $Q_{ldpc2}$, the 0-th parity bit group to the ($N_{punc\_groups}$−1)-th parity bit group are the same as some $$\left(P^2_{\pi_p^2(0)}, P^2_{\pi_p^2(1)}, \cdots, P^2_{\pi_p^2(N_{punc\ groups}-Q_{ldpc2}-1)}\right)$$

of a second parity bit group.

Subsequently, the transmission end proceeds to step 1226 to puncture some bits within the $N_{punc\_groups}$-th parity bit group indicated by a puncture pattern. At this point, the some bits punctured in the $N_{punc\_groups}$-th parity bit group are selected according to a rule defined in advance. For example, the punctured some bits may be some bits of the front end or the rear end within the $N_{punc\_groups}$-th parity bit group. That is, the transmission end sequentially punctures bits within parity bit groups that depend on a sequence indicated by the puncture pattern via step 1224 and step 1226. However, in the case where puncturing of $N_{punc\_groups}$ bits is completed by puncturing all bits within the 0-th parity bit group to the ($N_{punc\_groups}$−1)-th parity bit group, step 1126 may be omitted. A specific process for determining a parity bit group in step 1224 and step 1126 may be the same as illustrated in FIG. 9 or FIG. 10.

Step 1226 is described again according to the puncture pattern of FIG. 10 and a punctured parity bit determine process. In step 1226, a $N_{punc\_groups}$-th parity bit group where some of bits within the group are punctured is the same as $$P^1_{\pi_p^1(N_{punc\ groups}-Q_{ldpc2})}$$

within a first parity bit group when $N_{punc\_groups}$ is equal to or greater than $Q_{ldpc2}$. Also, when $N_{punc\_groups}$ is less than $Q_{ldpc2}$, the $N_{punc\_groups}$-th parity bit group where some of bits are punctured is the same as $$P^2_{\pi_p^2(N_{punc\ groups})}.$$

Subsequently, the transmission end proceeds to step 1228 to remove padded bits before encoding is performed. In other words, the transmission end removes bits padded to 0 in step 1208 to step 1210. After that, the transmission end proceeds to step 1230 to transmit a punctured and shortened codeword.

Figure 13A:
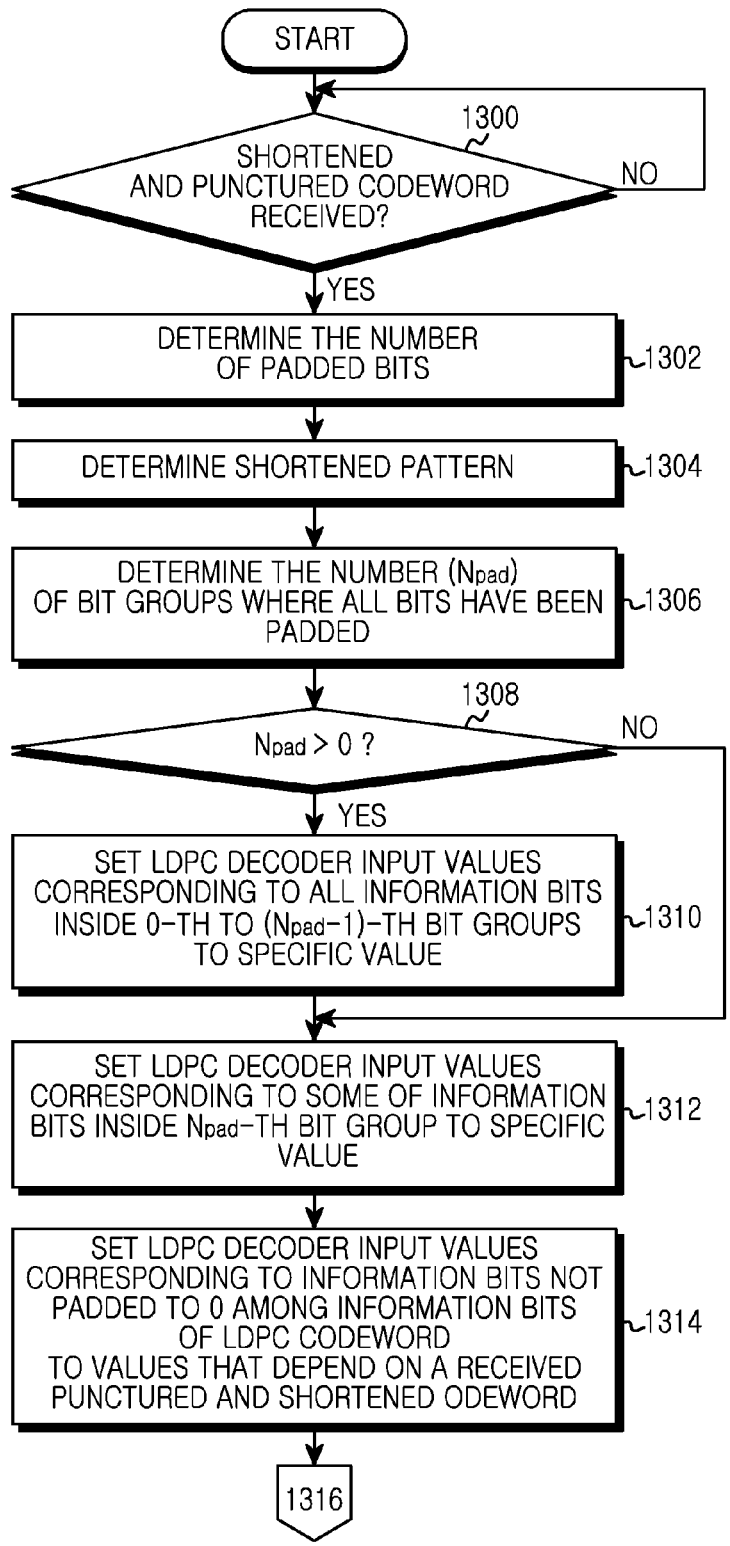
FIGS. 13A and 13B are views illustrating an operation procedure of a reception end in a communication/broadcasting system according to an embodiment of the present invention.
Figure 13B:
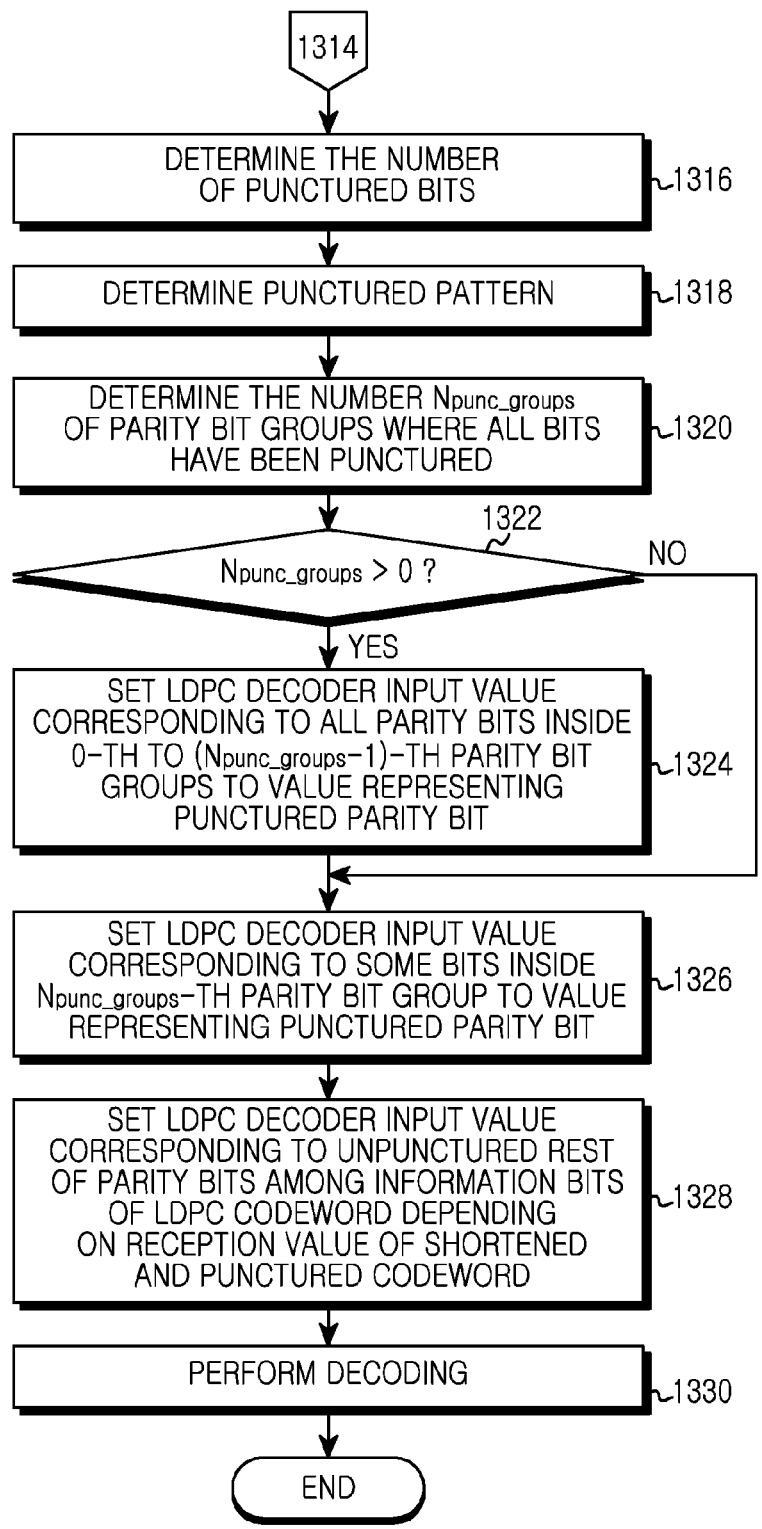

FIGS. 13A and 13B illustrate an operation procedure of a reception end in a communication/broadcasting system according to an embodiment of the present invention.

Referring to FIGS. 13A and 13B, the reception end determines whether a shortened and punctured codeword is received in step 1300.

When the shortened and punctured codeword is received, the reception end proceeds to step 1302 to determine the number of shortened bits. The shortening occurs when the number of input bits for encoding is greater than the number of information bits. That is, the reception end determines the number of bits padded to 0 by subtracting the number of information bits of a received punctured and shortened codeword from the number of information bits of an LDPC codeword.

Subsequently, the reception end proceeds to step 1304 to determine a shortening pattern to be applied. That is, the reception end stores at least one shortening pattern defined in advance, and selects a shortening pattern corresponding to a current condition among the stored at least one shortening pattern. For example, the shortening pattern may be defined based on a codeword length, an encoding rate, a shortening and puncturing ratio, a modulation scheme, etc. For example, at least one shortening pattern is defined on a bit group basis that divides information bits on a predetermined number basis. For example, the at least one shortening pattern may include Table 9 or Table 13. According to another embodiment of the present invention, the reception end may not store the shortening pattern but may generate the shortening pattern based on a current condition. For example, the generated shortening pattern may include at least one of Table 9 and Table 13. According to still another embodiment of the present invention, the reception end may use a shortening pattern indicated by a transmission end via separate signaling.

After determining the shortening pattern, the reception end proceeds to step 1306 to determine the number $N_{pad}$ of bit groups where all bits have been shortened in the transmission end. That is, the reception end divides the number of padded bits by the number of bits per bit group, and determines a maximum integer value less than the division result as $N_{pad}$. In the case where the number of information bits within the received shortened and punctured codeword is less than the number of bits included in one bit group, all of at least one information bit within the received shortened and punctured codeword may be included in one bit group. Therefore, in this case, $N_{pad}$ becomes a value less than the number of all bit groups by 1.

Subsequently, the reception end proceeds to step 1308 to determine whether $N_{pad}$ is greater than 0. In other words, the reception end determines whether at least one bit group where all bits have been padded to 0 exists. When $N_{pad}$ is not greater than 0, the reception end omits step 1310 below and proceeds to step 1312. Hereinafter, LDPC decoder input values corresponding to shortened LDPC information bits are set to a specific value representing shortened LDPC information bits. For example, the LDPC decoder input values are based on Log Likelihood Ratio (LLR), and the specific value may be plus infinite or minus infinite.

In contrast, when $N_{pad}$ is greater than 0, the reception end proceeds to step 1310 to set an LDPC decoder input value corresponding to all information bits within a 0-th bit group to $(N_{pad}-1)$-th bit group indicated by a shortening pattern determined in step 1304 to specific values representing an LDPC information bit shortened in the transmission end.

Subsequently, the reception end proceeds to step 1312 to set an LDPC decoder input value corresponding to some information bits of the front end or the rear end within an $N_{pad}$-th bit group indicated by the shortening pattern to specific values representing LDPC information bits shortened in the transmission end.

Also, the reception end proceeds to step 1314 to set LDPC decoder input values corresponding to information bits not padded to 0 to values that depend on a received punctured and shortened codeword. For example, in the case where the decoding input value is an LLR value, a value representing a 0 bit means an LLR value of a case where probability that an LLR will 0 is 1 and probability that an LLR will 1 is 0. That is, the reception end recovers information bits among an LDPC codeword generated via encoding in the transmission end via step 1310 to step 1314.

After that, the reception end proceeds to step 1316 to determine the number of punctured bits based on a value related to an encoding rate and the number of shortened bits, in other words, a puncturing and shortening ratio. For example, the value related to the encoding rate and the number of shortened bits, in other words, the puncturing and shortening ratio may be defined by Equation (37).

After determining the number of puncture bits, the reception end proceeds to step 1318 to determine a puncture pattern to be applied. That is, the reception end stores at least one puncture pattern defined in advance, and selects a puncture pattern corresponding to a current condition among the stored at least one puncture pattern. For example, the puncture pattern may be defined based on the form of a parity test matrix to use, a codeword length, an encoding rate, a shortening and puncturing ratio, a modulation scheme, etc. For example, at least one puncture pattern is defined on a parity bit group basis that divides parity bits on a predetermined number basis. For example, the at least one puncture pattern may include at least one of Table 10, Table 11, Table 12, Table 14, Table 15, Table 16, Table 17, and Table 18. At this point, the reception end should consider the form of a parity test matrix to use. For example, the form of a parity test matrix to use may be determined by at least one of an information word length and an encoding rate. For example, determination of the form of the parity test matrix to use may be judged by the process of FIG. 10. In the case where the parity test matrix to use is the first parity test matrix illustrated in FIG. 6B, the puncture pattern is determined by Table 10 or Table 14. In contrast, in the case where the parity test matrix to use is the second parity test matrix illustrated in FIG. 6B, the puncture pattern is determined by Table 12 or Table 16 or Table 18, or a combination of Table 11 and Table 10 or a combination of Table 14 and Table 15 or a combination of Table 14 and Table 17. According to the combination of Table 11 and Table 10 or the combination of Table 14 and Table 15 or the combination of Table 14 and Table 17, the reception end determines a puncture pattern first according to Table 11 or Table 15 or Table 17, and then in the case where a puncture bit remains, the reception end determines the rest of puncture patterns according to Table 10 or Table 14. According to another embodiment of the present invention, the reception end may not store the puncture pattern in advance but may generate the puncture pattern according to a current condition. For example, the generated puncture pattern may include at least one of a combination of Table 10, Table 11, Table 12, Table 14, Table 15, Table 16, Table 17, Table 18, Table 12, Table 16, Table 18, Table 10, and Table 11 (앞의 table 11 과 중복됨), and a combination of Table 14 and Table 15, and a combination of Table 14 and Table 17. According to another embodiment of the present invention, the reception end may use a puncture pattern indicated by the transmission end via separate signaling.

After determining the puncture pattern, the reception end proceeds to step 1320 to determine the number $N_{punc\_groups}$ of parity bit groups where all parity bits have been punctured. That is, the reception end divides the number of the punctured parity bits by the number of bits per parity bit group, and determines a maximum integer value less than the division result as $N_{punc\_groups}$ In the case where the number of the received parity bits is less than the number of bits included in one parity bit group, all of the received parity bits may be included in one parity bit group. Therefore, in this case, $N_{punc\_groups}$ becomes a value less than the number of all parity bit groups by 1.

Subsequently, the reception end proceeds to step 1322 to determine whether $N_{punc\_groups}$ is greater than 0. In other words, the reception end determines whether at least one parity bit group where all bits have been punctured exists. In the case where $N_{punc\_groups}$ is not greater than 0, the reception end omits step 1324 below and proceeds to step 1326.

In contrast, when $N_{punc\_groups}$ is greater than 0, the reception end proceeds to step 1324 to set LDPC decoder input values corresponding to all bits within a 0-th parity bit group to an $(N_{punc\_groups}-1)$-th parity bit group indicated by the puncture pattern determined in step 1320 to values representing punctured parity bits. For example, the value representing the punctured parity bit may be a value where a probability that a parity bit will be 0 and a probability that a parity bit will be 1 are the same.

Step 1324 is described again according to the puncture pattern of FIG. 10 and a punctured parity bit determine process. In step 1324, the 0-th parity bit group to the ($N_{punc\_groups}$−1)-th parity bit group where LDPC decoder input values corresponding to all bits within the group are set to values representing a punctured parity bit are the same as all of second parity bit groups and some $$\left( P^1_{\pi^1_p(0)}, P^1_{\pi^1_p(1)}, \cdots, P^1_{\pi^1_p(N_{punc\_groups}-Q_{ldpc2}-1)} \right)$$

of first parity bit groups in the case where $N_{punc\_groups}$ is equal to or greater than $Q_{ldpc2}$. Also, in the case where $N_{punc\_groups}$ is less than $Q_{ldpc2}$, the ($N_{punc\_groups}$−1)-th parity bit group is the same as some $$\left( P^2_{\pi^2_p(0)}, P^2_{\pi^2_p(1)}, \cdots, P^2_{\pi^2_p(N_{punc\_groups}-1)} \right)$$

of second parity bit groups.

Subsequently, the reception end proceeds to step 1326 to set an LDPC decoder input value corresponding to some bits of the front end or the rear end within an $N_{punc\_groups}$-th parity bit group indicated by a puncture pattern to values representing a punctured parity bit. For example, the value representing the punctured parity bit may be a value where a probability that a parity bit will be 0 and a probability that a parity bit will be 1 are the same.

Step 1326 is described again according to the puncture pattern of FIG. 10 and a punctured parity bit determine process. In step 1326, the $N_{punc\_groups}$-th parity bit group where LDPC decoder input values corresponding to some bits within the group are set to values representing a punctured parity bit is the same as a group $$P^1_{\pi^1_p(N_{punc\_groups}-Q_{ldpc2})}$$

within a first parity bit group in the case where $N_{punc\_groups}$ is equal to or greater than $Q_{ldpc2}$. Also, in the case where $N_{punc\_groups}$ is less than $Q_{ldpc2}$, the $N_{punc\_groups}$-th parity bit group is the same as $$P^2_{\pi^2_p(N_{punc\_groups})}.$$

Subsequently, the reception end proceeds to step 1328 to set LDPC decoder input values corresponding to the rest of not-punctured parity bits based on a reception value of a shortened and punctured codeword. That is, the reception end recovers parity bits among an LDPC codeword generated via encoding by the transmission end via step 1324 to step 1328.

After that, the reception end proceeds to step 1330 to perform decoding on the recovered codeword. At this point, the reception end may perform a plurality of decoding techniques in a connected manner. For example, the reception end may sequentially perform LDPC decoding and BCH decoding. In this case, the reception end may perform LDPC decoding on a recovered LDPC codeword, and perform BCH decoding on LDPC information bits generated as a result of the LDPC decoding. According to another embodiment of the present invention, the reception end may perform only the LDPC decoding on the recovered LDPC codeword.

Figure 14:
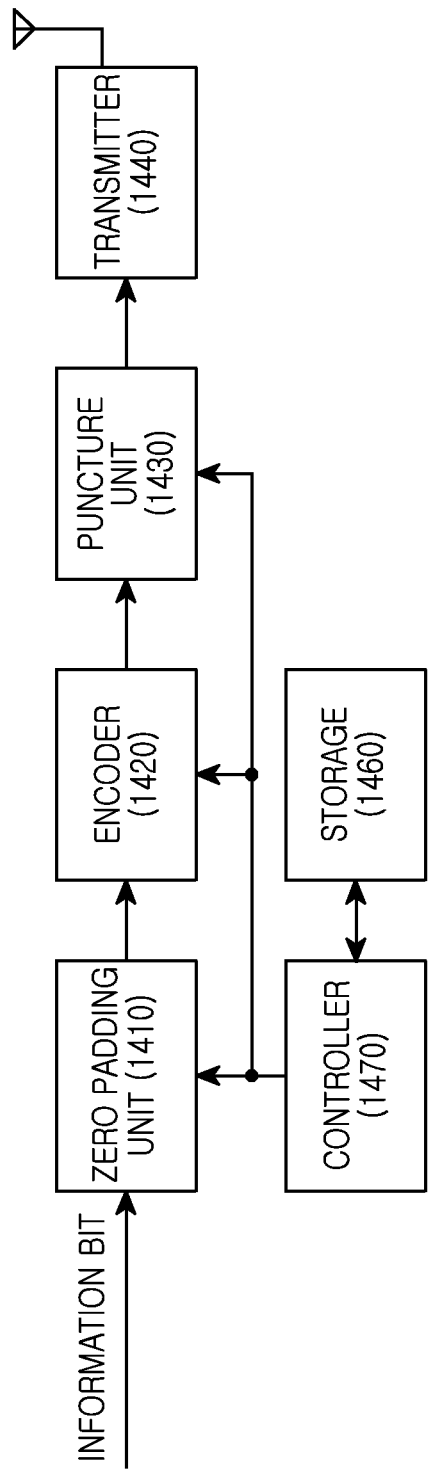
FIG. 14 is a block diagram illustrating a transmission end in a communication/broadcasting system according to an embodiment of the present invention.

FIG. 14 illustrates a construction of a transmission end in a communication/broadcasting system according to an embodiment of the present invention.

As illustrated in FIG. 14, the transmission end includes a zero padding unit 1410, an encoder 1420, a puncture unit 1430, a transmitter 1440, a storage 1460, and a controller 1470.

The zero padding unit 1410 generates BCH information bits input to the encoder 1420 by padding some of information bits to 0. The zero padding unit 1410 determines the number of bits to be padded to 0 using information provided from the controller 1470, and pads bits of positions that depend on shortening pattern information provided from the controller 1470 to 0. That is, the zero padding unit 1410 pads bits of bit groups that depend on a sequence indicated by the shortening pattern, and maps each bit of the information bits on the position of the rest of the bits. The zero padding unit 1410 may determine the number $N_{pad}$ of bit groups where all bits are to be padded to 0. According to another embodiment of the present invention, the number $N_{pad}$ of bit groups where all bits are to be padded to 0 may be determined by the controller 1470. After that, the zero padding unit 1410 pads all bits within a 0-th bit group to an ($N_{pad}$−1)-th bit group indicated by the shortening pattern to 0, and then pads some bits in the front end or the rear end within an $N_{pad}$-th bit group indicated by the shortening pattern to 0. Also, the zero padding unit 1410 maps information bits to not-padded bit positions in BCH information bits.

The encoder 1420 performs encoding on BCH information bits padded by the zero padding unit 1410. The encoder 1420 may include only one encoding block or may have a structure where a plurality of encoding blocks are connected. For example, though not shown, the encoder 1420 may include the BCH encoder and an LDPC encoder. In this case, the BCH encoder may perform BCH encoding on the padded BCH information bits, and the LDPC encoder may perform LDPC encoding on a BCH codeword generated as a result of the BCH encoding. According to another embodiment of the present invention, the encoder 1420 may perform only the LDPC encoding on the BCH information bits. In case of performing only the LDPC encoding without the BCH encoding, the BCH information bits may be called LDPC information bits. According to still another embodiment of the present invention, another encoder (not shown) besides the encoder 1420 may be added to the front end of the zero padding unit 1410. For example, the encoder 1420 may perform LDPC encoding, and another encoder (not shown) positioned in the front end of the zero padding unit 1410 may perform BCH encoding.

According to still another embodiment of the present invention, the encoder 1420 may determine the form of a parity test matrix to use for the encoding before performing encoding. That is, a transmission end according to an embodiment of the present invention may use two or more parity test matrixes. For example, the two or more parity test matrixes include the first parity test matrix and the second parity test matrix illustrated in FIG. 6B. At this point, the storage 1460 may store the first parity test matrix and the second parity test matrix separately, or store only the second parity test matrix, and extract the first parity test matrix from the second parity test matrix. For example, determination of the form of the parity test matrix to use may be judged by at least one of an information word length and an encoding rate. For example, determination of the form of the parity test matrix to use may be judged via the process of FIG. 10. In the case where the process for determining the form of the parity test matrix to use is not performed, the encoder 1420 may perform encoding using the second parity test matrix which is a larger form, and determine whether to remove a second parity based on an encoding rate afterward. Also, in using the parity test matrix, the encoder 1420 may use an address value of an accumulator as represented in Equation (5), Equation (7), Equation (23), and Equation (24).

The puncture unit 1430 converts a parity among an LDPC codeword output from the encoder 1420 to parity bits to be transmitted by puncturing some bits from a parity among the LDPC codeword generated by the encoder 1420. The puncture unit 1430 determines the number of bits to be punctured based on a value related to an encoding rate provided from the controller 1470 and the number of shortened bits, in other words, a puncturing and shortening ratio, and punctures bits of a position that depends on puncture pattern information provided from the controller 1470. Also, the puncture unit 1430 may discriminate first parity bits and second parity bits based on the form of a parity test matrix based in the encoder 1420 from the controller 1470. That is, puncture unit 1430 punctures bits within parity bit groups that depend on a sequence indicated by the puncture pattern. For example, the value related to the encoding rate and the number of shortened bits, in other words, the puncturing and shortening ratio may be defined by Equation (37). Also, the puncture unit 1430 determines the number $N_{punc\_groups}$ of parity bit groups where all parity bits are to be punctured, punctures all parity bits within a 0-th parity bit group to an $(N_{punc\_groups}-1)$-th parity bit group indicated by the puncture pattern, and then punctures some bits in the front end or the rear end within an $N_{punc\_groups}$-th parity bit group.

Description is made again according to the puncture pattern of FIG. 10 and a punctured parity bit determine process. In the case where $N_{punc\_groups}$ is equal to or greater than $Q_{ldpc2}$, the 0-th parity bit group to the $(N_{punc\_groups}-1)$-th parity bit group are the same as all second parity bit groups and some $$\left(P^1_{\pi_p(0)}, P^1_{\pi_p(1)}, \cdots, P^1_{\pi_p(N_{punc\ groups}-Q_{ldpc2}-1)}\right)$$

of the first parity bit group. Also, in the case where $N_{punc\_groups}$ is less than $Q_{ldpc2}$, the 0-th parity bit group to the $(N_{punc\_groups}-1)$-th parity bit group are the same as some $$\left(P^2_{\pi_p(0)}, P^2_{\pi_p(1)}, \cdots, P^2_{\pi_p(N_{punc\ groups}-1)}\right)$$

of the second parity bit group. Also, in the case where $N_{punc\_groups}$ is equal to or greater than $Q_{ldpc2}$ an $N_{punc\_groups}$-th parity bit group is the same as a group $$P^1_{\pi_p(N_{punc\ groups}-Q_{ldpc2})}.$$

within the first parity bit group. Also, in the case where $N_{punc\_groups}$ is less than $Q_{ldpc2}$, the $N_{punc\_groups}$-th parity bit group is the same as a group $$P^2_{\pi_p(N_{punc\ groups})}$$

within the second parity bit group.

Also, the puncture unit 1430 may convert information bits among an LDPC codeword output from the encoder 1420 to information bits within a punctured and shortened codeword to be transmitted by removing bits padded to 0 by the zero padding unit 1410. In this case, the puncture unit 1430 may be called a 'zero remove and puncture unit'.

In the case where a function for removing bits padded to 0 is excluded, the zero padding unit 1410 may be omitted. That is, instead of generating a BCH information bit string for the encoder 1420 by padding 0 to a bit in the zero padding unit 1410, columns corresponding to a bit to be padded to 0 may be removed from the parity test matrix used by the encoder 1420. The columns corresponding to the bit to be padded are removed, so that the same result may be obtained even when the process for padding bits is not performed. The transmitter 1440 modulates and Radio Frequency (RF)-processes the shortened and punctured codeword, and then transmits the same via an antenna.

The storage 1460 stores setting information, an instruction, etc. for an operation of the transmission end. Particularly, the storage 1460 stores at least one shortening pattern defined on a bit group basis and at least one puncture pattern defined on a parity bit group basis. For example, the shortening pattern and the puncture pattern may be defined based on a codeword length, an encoding rate, a shortening and puncturing ratio, a modulation scheme, etc. For example, the at least one shortening pattern may include Table 9 or Table 13. Also, the at least one puncture pattern may include at least one of Table 10, Table 11, Table 12, Table 14, Table 15, Table 16, Table 17, and Table 18.

The controller 1470 controls overall functions of the transmission end. Particularly, the controller 1470 provides the length of information bits, the length of information bits required by the encoder 1420, shortening pattern information, etc. Also, the controller 1470 provides a parity test matrix to the encoder 1420, and provides information regarding the form of the parity test matrix. Also, the controller 1470 provides puncture pattern information to the puncture unit 1430.

In determining the puncture pattern, the controller 1470 should consider the form of the parity test matrix to use. For example, the form of the parity test matrix to use may be judged by at least one of the length of an information word and an encoding rate. For example, determination of the form of the parity test matrix to use may be judged via the process of FIG. 10. In the case where the parity test matrix to use is the first parity test matrix illustrated in FIG. 6B, the puncture pattern is determined by Table 10 or Table 14. In contrast, in the case where the parity test matrix to use is the second parity test matrix illustrated in FIG. 6B, the puncture pattern may be determined by Table 12 or Table 16 or Table 18, or determined by a combination of Table 11 and Table 10 or a combination of Table 15 and Table 14 or a combination of Table 17 and Table 14. According to the combination of Table 11 and Table 10 or the combination of Table 15 and Table 14 or the combination of Table 17 and Table 14, the controller 1470 determines a puncture pattern first according to Table 11 or Table 15 or Table 17, and when a puncture bit remains, the controller 1470 determines the rest of puncture patterns according to Table 10 or Table 14.

Also, the controller 1470 provides information regarding the form of the parity test matrix to the puncture unit 1430.

Also, the controller 1470 provides information that may determine the position of bits to be padded to the zero padding unit 1410. In an embodiment of the present invention described with reference to FIG. 14, the zero padding unit 1410 determines the position of a bit to be padded to 0, and pads bits to 0. However, according to another embodiment of the present invention, the controller 1470 may determine the position of a bit to be padded, and the zero padding unit 1410 may pad bits to 0 according to indication of the controller 1470. Also, in an embodiment of the present invention described with reference to FIG. 14, the puncture unit 1430 determines the position of a puncture bit and performs puncturing. However, according to another embodiment of the present invention, the controller 1470 may determine the position of the puncture bit and the puncture unit 1430 may perform puncturing according to indication of the controller 1470.

Figure 15:
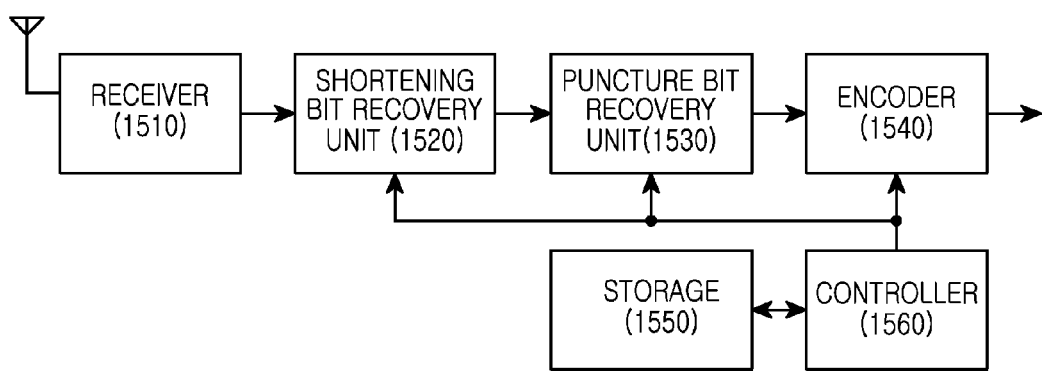
FIG. 15 is a block diagram illustrating a reception end in a communication/broadcasting system according to an embodiment of the present invention.

FIG. 15 is a block diagram illustrating a reception end in a communication/broadcasting system according to an embodiment of the present invention.

Referring to FIG. 15, the reception end includes a receiver 1510, a shortening bit recovery unit 1520, a puncture bit recovery unit 1530, a decoder 1540, a storage 1550, and a controller 1560.

The receiver 1510 receives a shortened and punctured codeword transmitted from the transmission end. That is, the receiver 1510 determines a reception value of the shortened and punctured codeword by RF-processing a reception signal, and performing decoding.

The shortening bit recovery unit 1520 recovers information bits within a received shortened and punctured codeword generated via encoding in the transmission end by setting LDPC decoder input values to a specific value representing a shortened LDPC information bit in the transmission end. Specifically, the shortening bit recovery unit 1520 determines the number of shortened bits, determines a shortened pattern provided from the controller 1560, and then determines the number $N_{pad}$ of bit groups where all bits have been padded to 0. Also, the shortening bit recovery unit 1520 sets LDPC decoder input values corresponding to all bits within a 0-th bit group to an ($N_{pad}$−1)-th bit group indicated by the shortening pattern to a specific value representing LDPC information bits, and sets LDPC decoder input values corresponding to some bits of the front end or the rear end within an $N_{pad}$-th bit group indicated by the shortening pattern to a specific value representing shortened LDPC information bits. In the case where the LDPC decoder value is based on an LLR, the specific value representing the shortened LDPC information bit may be plus infinite or minus infinite. Also, the shortening bit recovery unit 1520 sets LDPC decoder input values corresponding to information bits not padded to 0 in information bits of an LDPC codeword based on a received shortened and punctured codeword.

The puncture bit recovery unit 1530 recovers a parity generated via encoding in the transmission end by setting LDPC decoder input values corresponding to punctured bit positions to values representing a punctured parity bit. Specifically, the puncture bit recovery unit 1530 determines the number of puncture bits based on a value related to an encoding rate and the number of shortening bits, that is, a puncturing and shortening ratio. For example, the value related to the encoding rate and the number of shortening bits, in other words, the puncturing and shortening ratio may be defined by Equation (30). Also, the puncture bit recovery unit 1530 determines the number $N_{punc\_groups}$ of parity bit groups where all bits have been punctured, and sets LDPC decoder input values corresponding to all parity bits within a 0-th parity bit group to an ($N_{punc\_groups}$−1)-th parity bit group indicated by a puncture pattern provided from the controller 1560 in an LDPC codeword to values representing a punctured parity bit. Also, the puncture bit recovery unit 1530 sets LDPC decoder input values corresponding to some bits of the front end or the rear end within an $N_{punc\_groups}$-th parity bit group indicated by the puncture pattern in the LDPC codeword to values representing a punctured parity bit. The value representing the punctured parity bit may be a value where probability that a parity bit will be 0 and probability that a parity bit will be 1 are the same.

Description is made again according to the puncture pattern of FIG. 10 and a punctured parity bit determine process. In the case where $N_{punc\_groups}$ is equal to or greater than $Q_{ldpc2}$, the 0-th parity bit group to the ($N_{punc\_groups}$−1)-th parity bit group are the same as all of second parity bit groups and some $$\left(P^1_{\pi_p(0)}, P^1_{\pi_p(1)}, \cdots, P^1_{\pi_p(N_{punc\ groups}-Q_{ldpc2}-1)}\right)$$

of first parity bit groups. Also, in the case where $N_{punc\_groups}$ is less than $Q_{ldpc2}$, the 0-th parity bit group to the ($N_{punc\_groups}$−1)-th parity bit group are the same as some $$\left(P^2_{\pi_p(0)}, P^2_{\pi_p(1)}, \cdots, P^2_{\pi_p(N_{punc\ groups}-1)}\right)$$

of the second parity bit groups. Also, in the case where $N_{punc\_groups}$ is equal to or greater than $Q_{ldpc2}$, the $N_{punc\_groups}$-th parity bit group is the same as a group $$P^1_{\pi_p(N_{punc\ groups}-Q_{ldpc2})}$$

within the first parity bit group. Also, in the case where $N_{punc\_groups}$ is less than $Q_{ldpc2}$, the $N_{punc\_groups}$-th parity bit group is the same as a group $$P^2_{\pi_p(N_{punc\ groups})}$$

within the second parity bit group.

Subsequently, the puncture bit recovery unit 1530 sets an LDPC decoder input value corresponding to the rest of parity bits not punctured in the LDPC codeword according to a reception value of a shortened and punctured codeword.

The decoder 1540 performs decoding on an LDPC codeword recovered by the shortening bit recovery unit 1520 and the puncture bit recovery bit 1530. At this point, the decoder 1540 may have a structure where a plurality of decoding blocks are connected. For example, though not shown, the decoder 1540 may include an LDPC decoder and a BCH decoder. In this case, the LDPC decoder may perform LDPC decoding on the recovered LDPC codeword, and the BCH decoder may perform BCH decoding on an LDPC information word generated as a result of the LDPC decoding. According to another embodiment of the present invention, the decoder 1540 may perform only the LDPC decoding on the recovered LDPC codeword.

The storage 1550 stores setting information for an operation of the reception end, an instruction, etc. Particularly, the storage 1550 stores at least one shortening pattern defined on a bit group basis and at least one puncture pattern defined on a parity group basis. For example, the shortening pattern and the puncture pattern may be defined based on a codeword length, an encoding rate, a shortening and puncturing ratio, a modulation scheme, etc. For example, the at least one shortening pattern may include Table 9 or Table 13. Also, the at least one puncture pattern may include at least one of Table 10, Table 11, Table 12, Table 14, Table 15, Table 16, Table 17, and Table 18. Also, the storage 1550 stores two or more parity test matrixes. For example, the two or more parity test matrixes include the first parity test matrix and the second parity test matrix illustrated in FIG. 6B. At this point, the storage 1550 may store the first parity test matrix and the second parity test matrix separately, or store only the second parity test matrix, and extract the first parity test matrix from the second parity test matrix and use the same.

The controller 1560 controls overall functions of the transmission end. Particularly, the controller 1560 provides the length of information bits, the length of information bits required by the decoder 1540, shortening pattern information, etc. to the shortening bit recovery unit 1520. Also, the controller 1540 provides puncture pattern information to the puncture bit recovery unit 1530. Also, the controller 1540 provides a parity test matrix to the decoder 1540.

In determining the puncture pattern, the controller 1560 should consider the form of the parity test matrix to use. For example, the form of the parity test matrix to use may be determined by at least one of the length of an information word, and an encoding rate. For example, determination of the form of the parity test matrix to use may be judged via the process of FIG. 10. In the case where the parity test matrix to use is the first parity test matrix illustrated in FIG. 6B, the puncture pattern is determined by Table 10 or Table 14. In contrast, in the case where the parity test matrix to use is the second parity test matrix illustrated in FIG. 6B, the puncture pattern may be determined by Table 12 or Table 16 or Table 18, or determined by a combination of Table 11 and Table 10 or a combination of Table 15 and Table 14 or a combination of Table 17 and Table 14. According to the combination of Table 11 and Table 10 or the combination of Table 15 and Table 14 or the combination of Table 17 and Table 14, the controller 1560 determines a puncture pattern first according to Table 11 or Table 15 or Table 17, and then when a puncture bit remains, the controller 1560 determines the rest of the puncture pattern according to Table 10 or Table 14. According to another embodiment of the present invention, the controller 1560 may use a puncture pattern indicated by the transmission end via separate signaling.

Also, the controller 1560 provides information regarding the form of the parity test matrix to provide information regarding a puncture pattern used by the puncture bit recovery unit 1530 and the construction of parity bits. In an embodiment of the present invention described with reference to FIG. 15, the shortening bit recovery unit 1520 determines the position of a padded bit, and sets LDPC decoder input values corresponding to bits to a value representing a padded bit. However, according to another embodiment of the present invention, the controller 1560 may determine the position of the padded bit, and the shortening bit recovery unit 1520 may set LDPC decoder input values corresponding to relevant bits to a value representing a padded bit according to indication of the controller 1560. Also, in an embodiment of the present invention described with reference to FIG. 15, the puncture bit recovery unit 1530 determines the position of a punctured bit, and sets relevant bits to a value representing the punctured bit. However, according to another embodiment of the present invention, the controller 1560 may determine the position of the punctured bit, and the puncture bit recovery unit 1530 may set relevant bits to a value representing the punctured bit according to indication of the controller 1560.

Although the invention has been shown and described with reference to certain exemplary embodiments thereof, it will be understood by those skilled in the art that various changes in form and details may be made therein without departing from the spirit and scope of the invention as defined by the appended claims and their equivalents. Therefore, the scope of the present invention should not be limited to the above-described embodiments but should be determined by not only the appended claims but also the equivalents thereof.

What is claimed is:

1. A method for an operation of a transmitter, the method comprising:

determining a number of zero-padding bits;

determining a number $N_{pad}$ of bit groups in which all bits are padded with zeros;

padding the all bits within $0^{th}$ to $(N_{pad}-1)^{th}$ bit groups with zeros based on a shortening pattern; and encoding information bits including the zero-padded bits to generate a codeword, wherein the shortening pattern is defined as an order of bit groups defined as 9, 8, 15, 10, 0, 12, 5, 27, 6, 7, 19, 22, 1, 16, 26, 20, 21, 18, 11, 3, 17, 24, 2, 23, 25, 14, 28, 4, 13 and 29.

2. The method of claim 1, wherein the each of bit groups includes a pre-defined number of bits which is a divisor of an interval in which a pattern of a column is repeated in an information word part matrix of a parity check matrix.

3. The method of claim 1, further comprising:

padding one or more bits in a $N_{pad}^{th}$ bit group with zeros additionally.

4. The method of claim 1, wherein the encoding of the information bits comprises:

mapping bits to bit positions which are not padded in Bose Chaudhuri Hocquenghem (BCH) information bits;

BCH encoding the BCH information bits to generate Low Density Parity Check (LDPC) information bits; and LDPC encoding the LDPC information bits to generate the codeword.

5. The method of claim 1, further comprising:

removing the zero-padding bits from the information bits of the codeword.

6. A method for an operation of a transmitter, the method comprising:

encoding information bits to generate a codeword;

determining a number of bits to be punctured in parity bits of the codeword;

determining a number $N_{punc\_groups}$ of parity bit groups in which all bits are punctured; and puncturing all parity bits included in a set of parity bit groups, wherein the set of parity bit groups comprises all parity bit groups of a second parity part and a $0^{th}$ to an $(N_{punc\_groups}-Q_{ldpc2}-1)^{th}$ parity bit groups of a first parity part indicated by a first puncturing pattern, if the number $N_{punc\_groups}$ is equal to or greater than a pre-defined number $Q_{ldpc2}$, and wherein the first puncturing pattern is defined in a sequence of parity bit groups defined as 21, 17, 0, 24, 7, 10, 14, 12, 23, 1, 16, 3, 5, 26, 28, 19, 4, 15, 8, 2, 27, 20, 6, 9, 25, 13, 11, 18, 22 and 29.

7. The method of claim 6, wherein the predefined number $Q_{ldpc2}$ indicates a number of parity bit groups included in the second parity part.

8. The method of claim 6, wherein the set of parity bit groups comprises a $0^{th}$ to an $(N_{punc\_groups}-1)^{th}$ parity bit group of the second parity part indicated by a second puncturing pattern, if the number $N_{punc\_groups}$ is less than the predefined number $Q_{ldpc2}$, and wherein the second puncturing pattern is defined in a sequence of parity bit groups defined as 16, 41, 34, 11, 19, 6, 26, 44, 3, 47, 22, 10, 50, 39, 30, 14, 56, 28, 55, 21, 9, 40, 31, 51, 20, 17, 8, 25, 54, 18, 5, 33, 42, 12, 23, 49, 57, 1, 37, 52, 45, 36, 2, 32, 27, 48, 43, 29, 24, 0, 13, 38, 15, 58, 7, 58, 7, 53, 35, 4, 46 and 59.

9. The method of claim 6, wherein the each of parity bit groups includes a pre-defined number of bits which is a divisor of an interval in which a pattern of a column is repeated in a parity part matrix of the parity check matrix.

10. The method of claim 6, further comprising:
puncturing one or more bits in an $N_{punc\_group}{}^{th}$ parity bit group additionally.

11. The method of claim 6, further comprising:
transmitting the codeword.

12. The method of claim 6, wherein the encoding of the information bits comprises Low Density Parity Check (LDPC) encoding the information bits to generate the codeword.

13. A method for an operation of a receiver, the method comprising:
receiving a codeword;
determining a number of zero-padded bits;
determining a number $N_{pad}$ of bit groups in which all bits are padded with zeros;
setting a first set of decoder input values corresponding to all bits within $0^{th}$ to $(N_{pad}-1)^{th}$ bit groups indicated by a shortening pattern by values which represent shortened information bits; and
decoding values comprising the first set of the decoder input value and a second set of the decoder input value corresponding to information bits which are not padded with zeros, to generate information bits,
wherein the shortening pattern is defined as an order of bit groups defined as 9, 8, 15, 10, 0, 12, 5, 27, 6, 7, 19, 22, 1, 16, 26, 20, 21, 18, 11, 3, 17, 24, 2, 23, 25, 14, 28, 4, 13 and 29.

14. The method of claim 13, wherein the each of bit groups includes a pre-defined number of bits which is a divisor of an interval in which a pattern of a column is repeated in an information word part matrix of a parity check matrix.

15. The method of claim 13, further comprising:
setting decoder input values corresponding some bits in the part of an $N_{pad}{}^{th}$ bit group by values which represent shortened information bits.

16. The method of claim 13, wherein the decoding of the values comprises,
Low Density Parity Check (LDPC) decoding the values to generate LDPC information bits; and
Bose Chaudhuri Hocquenghem (BCH) decoding the LDPC information bits to generate BCH information bits.

17. A method for an operation of a receiver, the method comprising:
receiving a codeword;
determining a number of bits punctured in parity bits of the codeword;
determining a number $N_{punc\_groups}$ of parity bit groups in which all bits are punctured;
setting decoder input values for a first set of parity bit groups by a value representing punctured parity bits; and
setting decoder input values for a second set of parity bit groups corresponding to non-punctured parity bits based on the received codeword,
wherein the first set of parity bit groups comprise all parity bit groups included in a second parity part and a $0^{th}$ to an $(N_{punc\_groups}-Q_{ldpc2}-1)^{th}$ parity bit group of a first parity part indicated by a first puncturing pattern, if the number $N_{punc\_groups}$ of parity bit groups is equal to or greater than a predefined number $Q_{ldpc2}$, and
wherein the first puncturing pattern is defined in a sequence of parity bit groups defined as 21, 17, 0, 24, 7, 10, 14, 12, 23, 1, 16, 3, 5, 26, 28, 19, 4, 15, 8, 2, 27, 20, 6, 9, 25, 13, 11, 18, 22 and 29.

18. The method of claim 17, wherein the predefined number $Q_{ldpc2}$ indicates a number of parity bit groups included in the second parity part.

19. The method of claim 17, wherein the first set of parity bit groups comprise a $0^{th}$ to an $(N_{punc\_groups}-1)^{th}$ parity bit group of the second parity part indicated by a second puncturing pattern, if the number $N_{punc\_groups}$ is less than the predefined number $Q_{ldpc2}$, and
wherein the second puncturing pattern is defined in a sequence of parity bit groups defined as 16, 41, 34, 11, 19, 6, 26, 44, 3, 47, 22, 10, 50, 39, 30, 14, 56, 28, 55, 21, 9, 40, 31, 51, 20, 17, 8, 25, 54, 18, 5, 33, 42, 12, 23, 49, 57, 1, 37, 52, 45, 36, 2, 32, 27, 48, 43, 29, 24, 0, 13, 38, 15, 58, 7, 58, 7, 53, 35, 4, 46 and 59.

20. The method of claim 17, wherein the each of parity bit groups includes a pre-defined number of bits which is a divisor of an interval in which a pattern of a column is repeated in a parity part matrix of a parity check matrix.

21. The method of claim 17, further comprising:
setting decoder input values corresponding to one of more bits in the $N_{punc\_groups}{}^{th}$ parity bit group by a value representing punctured parity bits.

22. An apparatus for a transmitter, the apparatus comprising:
a padding unit configured to determine a number of zero-padding bits, to determine a number $N_{pad}$ of bit groups in which all bits are padded with zeros, and, to pad the all bits within $0^{th}$ to $(N_{pad}-1)^{th}$ bit groups with zeros based on a shortening pattern; and
an encoding unit configured to encode information bits including the zero-padded bits to generate a codeword,
wherein the shortening pattern is defined as an order of bit groups defined as 9, 8, 15, 10, 0, 12, 5, 27, 6, 7, 19, 22, 1, 16, 26, 20, 21, 18, 11, 3, 17, 24, 2, 23, 25, 14, 28, 4, 13 and 29.

23. The apparatus of claim 22, wherein the each of bit groups includes a pre-defined number of bits which is a divisor of an interval in which a pattern of a column is repeated in an information word part matrix of a parity check matrix.

24. The apparatus of claim 22, wherein the padding unit further configured to pad one or more bits in a $N_{pad}{}^{th}$ bit group with zeros additionally.

25. The apparatus of claim 22, wherein the encoding unit further configured to map bits to bit positions which are not padded in Bose Chaudhuri Hocquenghem (BCH) information bits, to BCH encode the BCH information bits to generate Low Density Parity Check (LDPC) information bits, and, to LDPC encode the LDPC information bits to generate the codeword.

26. The apparatus of claim 22, further comprising:
a puncturing unit configured to remove the zero-padding bits from the information bits of the codeword.

27. An apparatus for an operation of a transmitter, the apparatus comprising:
an encoding unit configured to encode information bits to generate a codeword; and
a puncturing unit configured to determine a number of bits to be punctured in parity bits of the codeword, to determine a number $N_{punc\_groups}$ of parity bit groups in which all bits are punctured, and to puncture all parity bits included in a set of parity bit groups,
wherein the set of parity bit groups comprises all parity bit groups of a second parity part and a $0^{th}$ to an $(N_{punc\_groups}-Q_{ldpc2}-1)^{th}$ parity bit groups of a first parity part indicated by a first puncturing pattern, if the number $N_{punc\_groups}$ is equal to or greater than a predefined number $Q_{ldpc2}$, and
wherein the first puncturing pattern is defined in a sequence of parity bit groups defined as 21, 17, 0, 24, 7, 10, 14, 12, 23, 1, 16, 3, 5, 26, 28, 19, 4, 15, 8, 2, 27, 20, 6, 9, 25, 13, 11, 18, 22 and 29.

28. The apparatus of claim 27, wherein the predefined number $Q_{ldpc2}$ indicates a number of parity bit groups included in the second parity part.

29. The apparatus of claim 27, wherein the set of parity bit groups comprises a $0^{th}$ to an $(N_{punc\_groups}-1)^{th}$ parity bit group of the second parity part indicated by a second puncturing pattern, if the number $N_{punc\_groups}$ is less than the predefined number $Q_{ldpc2}$, and
wherein the second puncturing pattern is defined in a sequence of parity bit groups defined as 16, 41, 34, 11, 19, 6, 26, 44, 3, 47, 22, 10, 50, 39, 30, 14, 56, 28, 55, 21, 9, 40, 31, 51, 20, 17, 8, 25, 54, 18, 5, 33, 42, 12, 23, 49, 57, 1, 37, 52, 45, 36, 2, 32, 27, 48, 43, 29, 24, 0, 13, 38, 15, 58, 7, 58, 7, 53, 35, 4, 46 and 59.

30. The apparatus of claim 27, wherein the each of parity bit groups includes a pre-defined number of bits which is a divisor of an interval in which a pattern of a column is repeated in a parity part matrix of the parity check matrix.

31. The apparatus of claim 27, wherein the puncturing unit further configured to puncture one or more bits in an $N_{punc\_groups}{}^{th}$ parity bit group additionally.

32. The apparatus of claim 27, further comprising:
a transmitter configured to transmit the codeword.

33. The apparatus of claim 27, wherein the encoding unit further configured to Low Density Parity Check (LDPC) encode the information bits to generate the codeword.

34. An apparatus for an operation of a receiver, the apparatus comprising:
a receiver configured to receive a codeword;
a restoring unit configured to determine a number of zero-padded bits, to determine a number $N_{pad}$ of bit groups in which all bits are padded with zeros, and, to set a first set of decoder input values corresponding to all bits within $0^{th}$ to $(N_{pad}-1)^{th}$ bit groups indicated by a shortening pattern by values which represent shortened information bits; and
a decoding unit configured to decode values comprising the first set of the decoder input value and a second set of the decoder input value corresponding to information bits which are not padded with zeros, to generate information bits,
wherein the shortening pattern is defined as an order of bit groups defined as 9, 8, 15, 10, 0, 12, 5, 27, 6, 7, 19, 22, 1, 16, 26, 20, 21, 18, 11, 3, 17, 24, 2, 23, 25, 14, 28, 4, 13 and 29.

35. The apparatus of claim 34, wherein the each of bit groups includes a pre-defined number of bits which is a divisor of an interval in which a pattern of a column is repeated in an information word part matrix of a parity check matrix.

36. The apparatus of claim 34, wherein the restoring unit further configured to set decoder input values corresponding some bits in the part of an $N_{pad}{}^{th}$ bit group by values which represent shortened information bits.

37. The apparatus of claim 34, wherein the decoding unit further configured to Low Density Parity Check (LDPC) decode the values to generate LDPC information bits, and, to Bose Chaudhuri Hocquenghem (BCH) decode the LDPC information bits to generate BCH information bits.

38. An apparatus for an operation of a receiver, the apparatus comprising:
a receiver configured to receive a codeword; and
a restoring unit configured to determine a number of bits punctured in LDPC parity bits of the codeword, to determine a number $N_{punc\_groups}$ of parity bit groups in which all bits are punctured, to set decoder input values for a first set of parity bit groups by a value representing punctured parity bits, and, to set decoder input values for a first set of parity bit groups corresponding to non-punctured parity bits based on the received codeword,
wherein the first set of parity bit groups comprise all parity bit groups included in a second parity part and a $0^{th}$ to an $(N_{punc\_groups}-Q_{ldpc2}-1)^{th}$ parity bit group of a first parity part indicated by a first puncturing pattern, if the number $N_{punc\_groups}$ of parity bit groups is equal to or greater than a predefined number $Q_{ldpc2}$, and
wherein the first puncturing pattern is defined in a sequence of parity bit groups defined as 21, 17, 0, 24, 7, 10, 14, 12, 23, 1, 16, 3, 5, 26, 28, 19, 4, 15, 8, 2, 27, 20, 6, 9, 25, 13, 11, 18, 22 and 29.

39. The apparatus of claim 38, wherein the predefined number $Q_{ldpc2}$ indicates a number of parity bit groups included in the second parity part.

40. The apparatus of claim 38, wherein the first set of parity bit groups comprise a $0^{th}$ to an $(N_{punc\_groups}-1)^{th}$ parity bit group of the second parity part indicated by a second puncturing pattern, if the number $N_{punc\_groups}$ is less than the predefined number $Q_{ldpc2}$, and
wherein the second puncturing pattern is defined in a sequence of parity bit groups defined as 16, 41, 34, 11, 19, 6, 26, 44, 3, 47, 22, 10, 50, 39, 30, 14, 56, 28, 55, 21, 9, 40, 31, 51, 20, 17, 8, 25, 54, 18, 5, 33, 42, 12, 23, 49, 57, 1, 37, 52, 45, 36, 2, 32, 27, 48, 43, 29, 24, 0, 13, 38, 15, 58, 7, 58, 7, 53, 35, 4, 46 and 59.

41. The apparatus of claim 38, wherein the each of parity bit groups includes a pre-defined number of bits which is a divisor of an interval in which a pattern of a column is repeated in a parity part matrix of a parity check matrix.

42. The apparatus of claim 38, wherein the restoring unit further configured to set decoder input values corresponding to one of more bits in the $N_{punc\_groups}{}^{th}$ parity bit group by a value representing punctured parity bits.

* * * * *